United States Patent
Ueda et al.

(10) Patent No.: US 11,309,168 B2
(45) Date of Patent: Apr. 19, 2022

(54) VACUUM PROCESSING APPARATUS AND MAINTENANCE APPARATUS

(71) Applicant: TOKYO ELECTRON LIMITED, Tokyo (JP)

(72) Inventors: Takehiro Ueda, Miyagi (JP); Jun Hirose, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 247 days.

(21) Appl. No.: 15/897,228

(22) Filed: Feb. 15, 2018

(65) Prior Publication Data
US 2018/0233328 A1    Aug. 16, 2018

(30) Foreign Application Priority Data
Feb. 16, 2017    (JP) .............................. JP2017-026524

(51) Int. Cl.
*H01J 37/32*    (2006.01)

(52) U.S. Cl.
CPC .... *H01J 37/3288* (2013.01); *H01J 37/32807* (2013.01); *H01J 37/32889* (2013.01); *H01J 37/32642* (2013.01); *H01J 2237/334* (2013.01)

(58) Field of Classification Search
CPC .......... H01J 37/32642; H01J 37/32743; H01J 37/32807; H01J 37/32862; H01J 37/32871; H01J 37/3288; H01J 37/32889; H01J 37/32899; H01J 37/32431; H01J 37/32458; H01J 37/32513; H01J 37/32733; H01J 37/32788; H01J 37/32–3299; H01J 2237/00–339; H01L 21/67742; H01L 21/67766; H01L 21/67155; H01L 21/67161; H01L 21/67167; H01L 21/67173; H01L 21/67178;

(Continued)

(56) References Cited

U.S. PATENT DOCUMENTS 4,838,990 A * 6/1989 Jucha ..................... C23C 16/517
                                                         204/192.35
5,048,164 A * 9/1991 Harima ............. H01L 21/67115
                                                          29/25.01

(Continued)

FOREIGN PATENT DOCUMENTS

JP        8-330387 A    12/1996
JP    2006-196691 A     7/2006

OTHER PUBLICATIONS

Oxford English Dictionary definition: handle (Year: 2013).*

*Primary Examiner* — Benjamin Kendall
*Assistant Examiner* — Kurt Sweely
(74) *Attorney, Agent, or Firm* — Weihrouch IP

(57) ABSTRACT

A maintenance apparatus includes a case and a maintenance mechanism. The case includes an opening having a size corresponding to a second gate of a vacuum processing apparatus including a processing chamber having a first gate through which a substrate is loaded and unloaded and the second gate different from the first gate. The case is attachable to the second gate while maintaining airtightness. The maintenance mechanism is provided in the case and is configured to perform at least one of an operation of detaching a consumed part in the processing chamber through the opening, an operation of attaching a replacement part in the processing chamber and an operation of cleaning the processing chamber.

21 Claims, 40 Drawing Sheets

(58) Field of Classification Search
CPC ........... H01L 21/67184; H01L 21/6719; H01L 21/67196; H01L 21/67201; H01L 21/67373; H01L 21/67376; H01L 21/67379; H01L 21/67383; H01L 21/677; H01L 21/67703; H01L 21/6773; H01L 21/67739; H01L 21/67745; H01L 21/67748; H01L 21/67754; H01L 21/67763; H01L 21/67769; H01L 21/67772; H01L 21/67775; C23C 14/564; C23C 14/566
See application file for complete search history.

(56) References Cited

U.S. PATENT DOCUMENTS

| | | | | |
|---|---|---|---|---|
| 5,855,679 | A * | 1/1999 | Ogawa | C23C 14/564 118/719 |
| 6,098,637 | A * | 8/2000 | Parke | C23C 16/4405 118/50.1 |
| 6,792,958 | B2 * | 9/2004 | Kamikawa | H01L 21/67017 134/148 |
| 6,984,097 | B1 * | 1/2006 | Saeki | H01L 21/50 257/E21.499 |
| 7,654,010 | B2 * | 2/2010 | Moriya | H01L 21/67017 118/65 |
| 7,699,021 | B2 * | 4/2010 | Volfovski | H01L 21/67173 118/500 |
| 2004/0083970 | A1 * | 5/2004 | Imafuku | H01J 37/32477 118/719 |
| 2005/0089388 | A1 * | 4/2005 | Park | H01L 21/6773 414/222.01 |
| 2009/0241992 | A1 * | 10/2009 | Yamazawa | B08B 1/00 134/8 |
| 2015/0262854 | A1 * | 9/2015 | You | H01L 21/67155 438/692 |
| 2015/0340209 | A1 * | 11/2015 | Koltonski | H01J 37/32642 156/345.31 |
| 2017/0117172 | A1 * | 4/2017 | Genetti | H01L 21/6719 |

\* cited by examiner

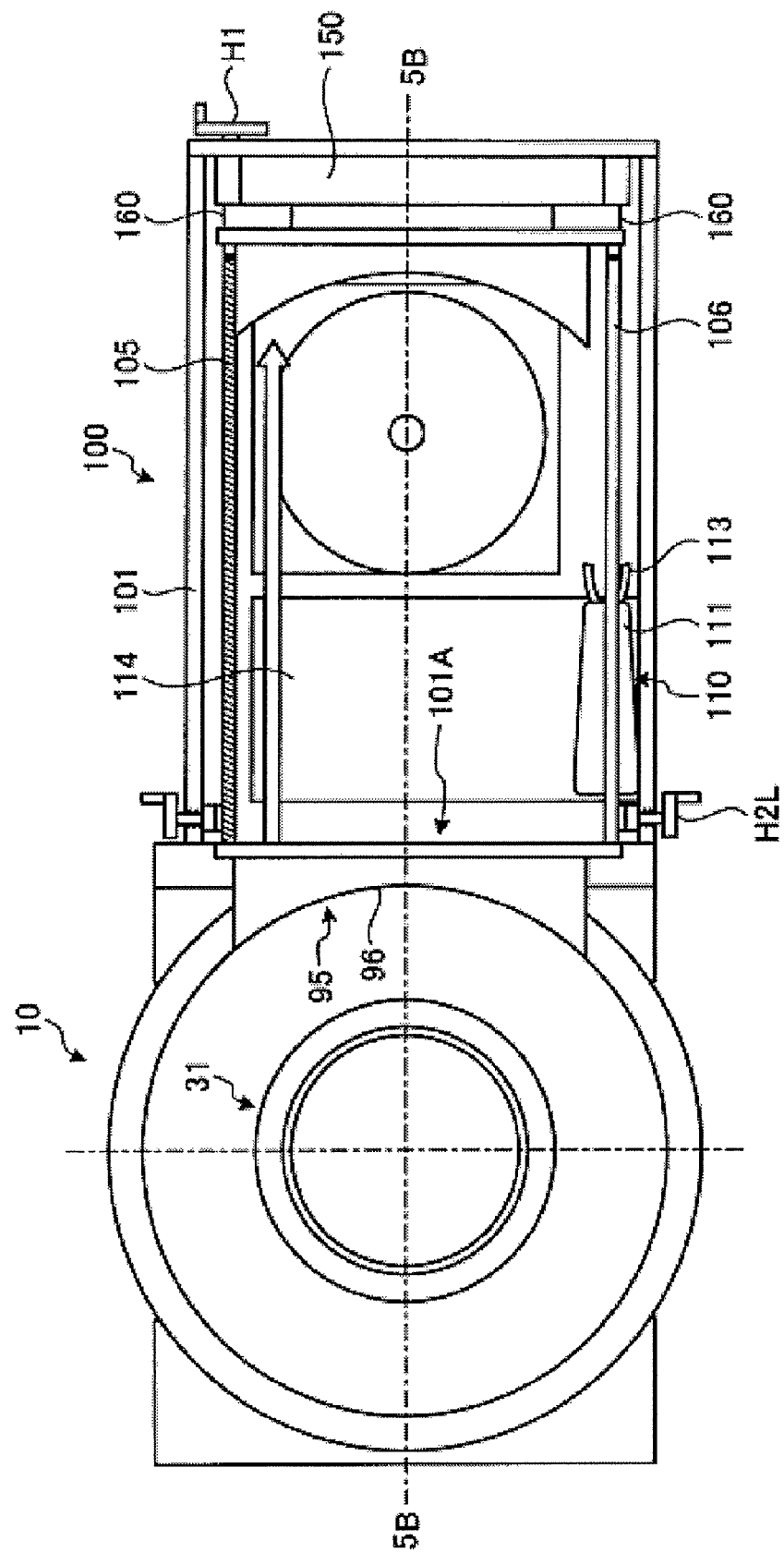

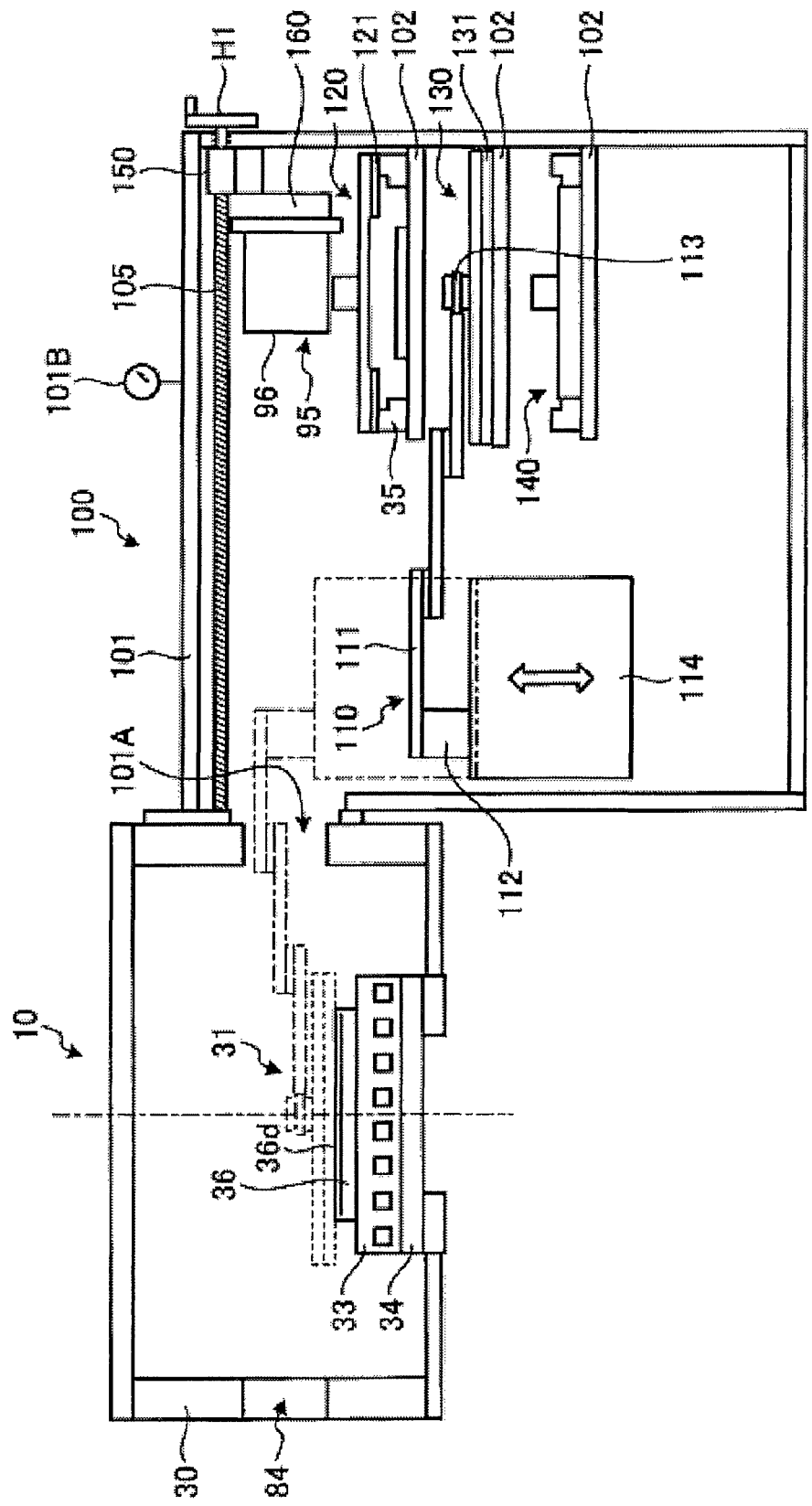

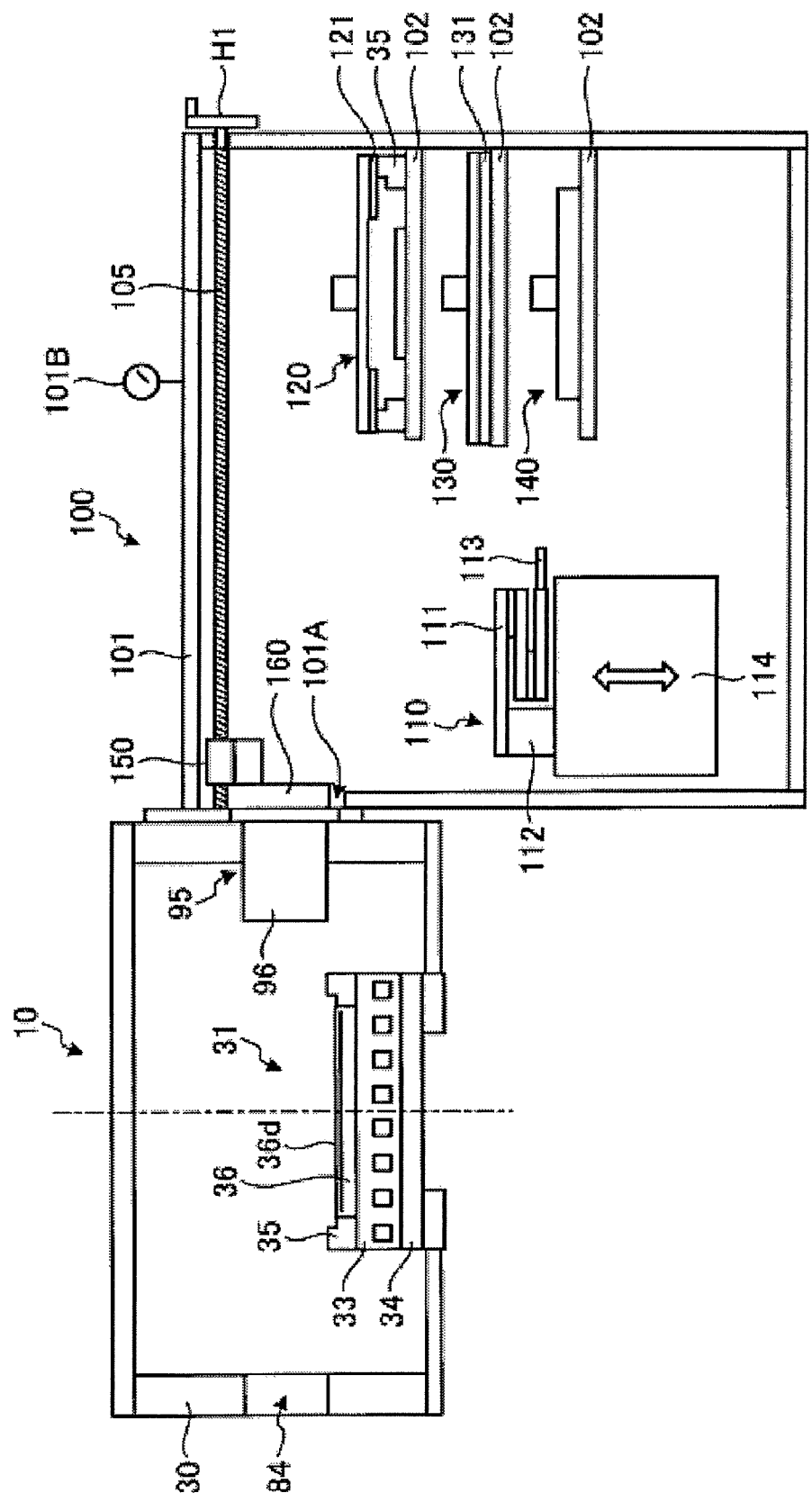

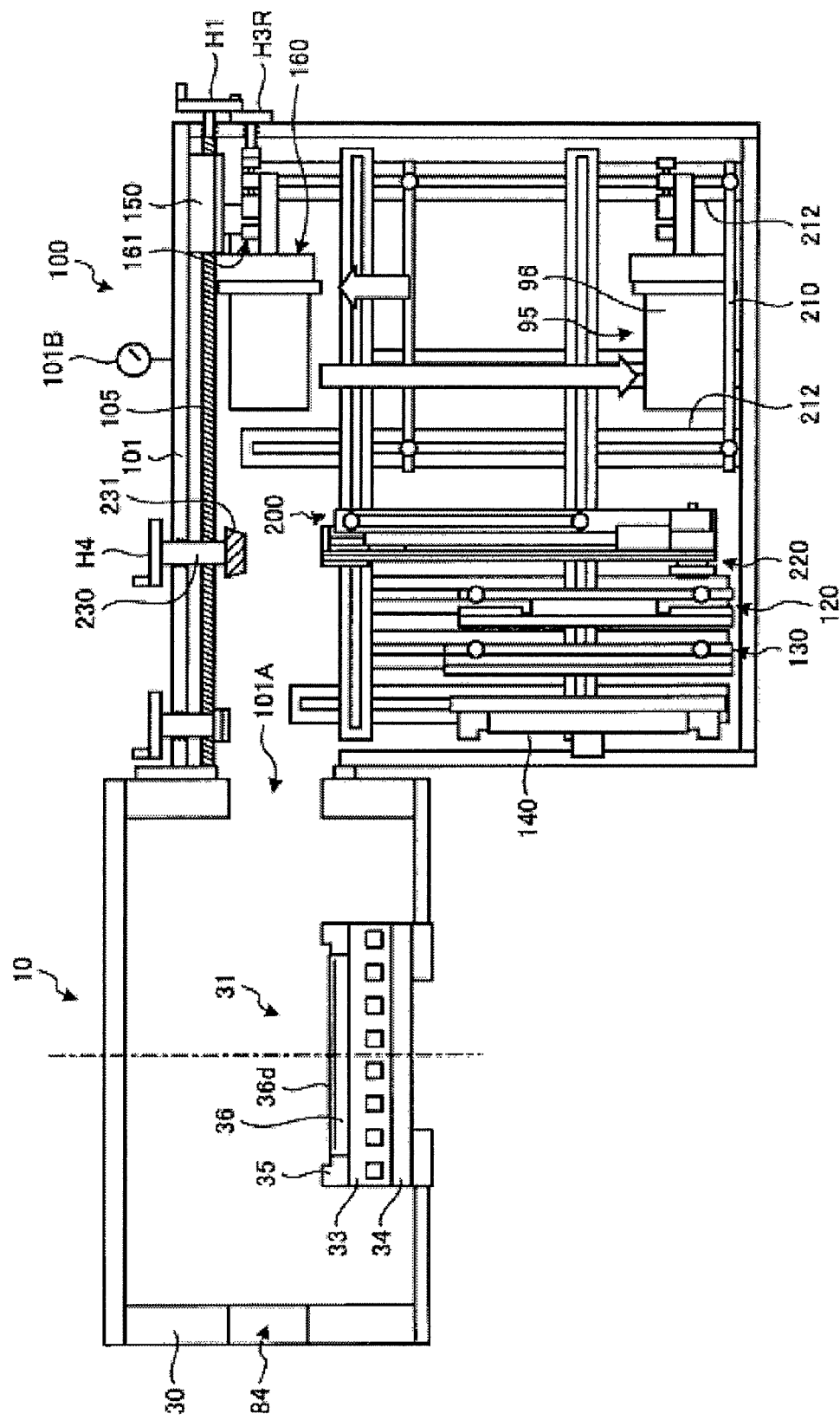

VACUUM PROCESSING APPARATUS AND MAINTENANCE APPARATUS

CROSS-REFERENCE TO RELATED APPLICATIONS

This application claims priority to Japanese Patent Application No. 2017-026524 filed on Feb. 16, 2017, the entire contents of which are incorporated herein by reference.

FIELD OF THE INVENTION

The present disclosure relates to a vacuum processing apparatus and a maintenance apparatus.

BACKGROUND OF THE INVENTION

Conventionally, there is known a vacuum processing apparatus for performing various processes on a substrate such as a semiconductor wafer (hereinafter, referred to as "wafer") or the like in a processing chamber in a vacuum state. For example, a plasma etching apparatus for etching a wafer in a processing chamber in a vacuum state by using plasma is known as the vacuum processing apparatus.

In the vacuum processing apparatus, it is required to replace a consumable part in the processing chamber which has been consumed by processing the substrate. For example, in the plasma etching apparatus, a focus ring provided at an outer periphery of the wafer is consumed by etching. In the plasma etching apparatus, an etching rate or the like is affected by the consumption of the focus ring. Therefore, in the plasma etching apparatus, the focus ring that has been consumed by a certain degree needs to be replaced.

When the consumed part is replaced, the processing chamber is exposed to the atmosphere. However, in the vacuum processing apparatus, once the processing chamber is exposed to the atmosphere, a considerably long time is required for temperature control and moisture control until the substrate processing is restarted. As a result, the productivity is decreased.

Therefore, there has been suggested a technique for replacing a consumed part without exposing the processing chamber to the atmosphere by replacing the consumed part through a transfer system for transferring a substrate to a vacuum processing apparatus while maintaining a vacuum state (see, e.g., Japanese Patent Application Publication No. 2006-196691).

However, in the case of replacing the consumed part through the transfer system for transferring a substrate, the transfer system may be contaminated. For example, the focus ring is subjected to a considerable number of etching processes until it is replaced with a new focus ring, compared to a single wafer. Therefore, a large number of deposits are adhered to the focus ring during the etching processes. In the case of replacing the focus ring through the transfer system such as a transfer arm for transferring a wafer or the like, particles may be generated in the transfer system. When the particles are generated in the transfer system, it is required to stop the operation of the transfer system and perform a maintenance operation for cleaning.

SUMMARY OF THE INVENTION

In accordance with an aspect, there is provided a vacuum processing apparatus including: a consumable part which is consumed by processing a substrate; and a processing chamber in which the consumable part is provided, the processing chamber having a first gate through which the substrate is loaded and unloaded and a second gate to and from which a maintenance apparatus for replacing a consumed part is attachable and detachable.

In accordance with another aspect, there is provided a maintenance apparatus including: a case with an opening having a size corresponding to a second gate of a vacuum processing apparatus including a processing chamber having a first gate through which a substrate is loaded and unloaded and the second gate different from the first gate, the case being attachable to the second gate while maintaining airtightness; and a maintenance mechanism provided in the case and configured to perform at least one of an operation of detaching a consumed part in the processing chamber through the opening, an operation of attaching a replacement part in the processing chamber and an operation of cleaning the processing chamber.

In accordance with the substrate processing apparatus, the consumed part can be replaced while suppressing contamination of the transfer system for transferring a substrate.

BRIEF DESCRIPTION OF THE DRAWINGS

The objects and features of the present disclosure will become apparent from the following description of embodiments, given in conjunction with the accompanying drawings, in which:

FIG. 5A is a top view schematically showing the maintenance apparatus according to the first embodiment;

FIG. 7B is a cross sectional view schematically showing the maintenance apparatus according to the first embodiment;

FIG. 10B is a cross sectional view schematically showing the maintenance apparatus according to the first embodiment;

FIG. 13B is a cross sectional view schematically showing the maintenance apparatus according to the second embodiment;

DETAILED DESCRIPTION OF THE EMBODIMENTS

Figure 1:
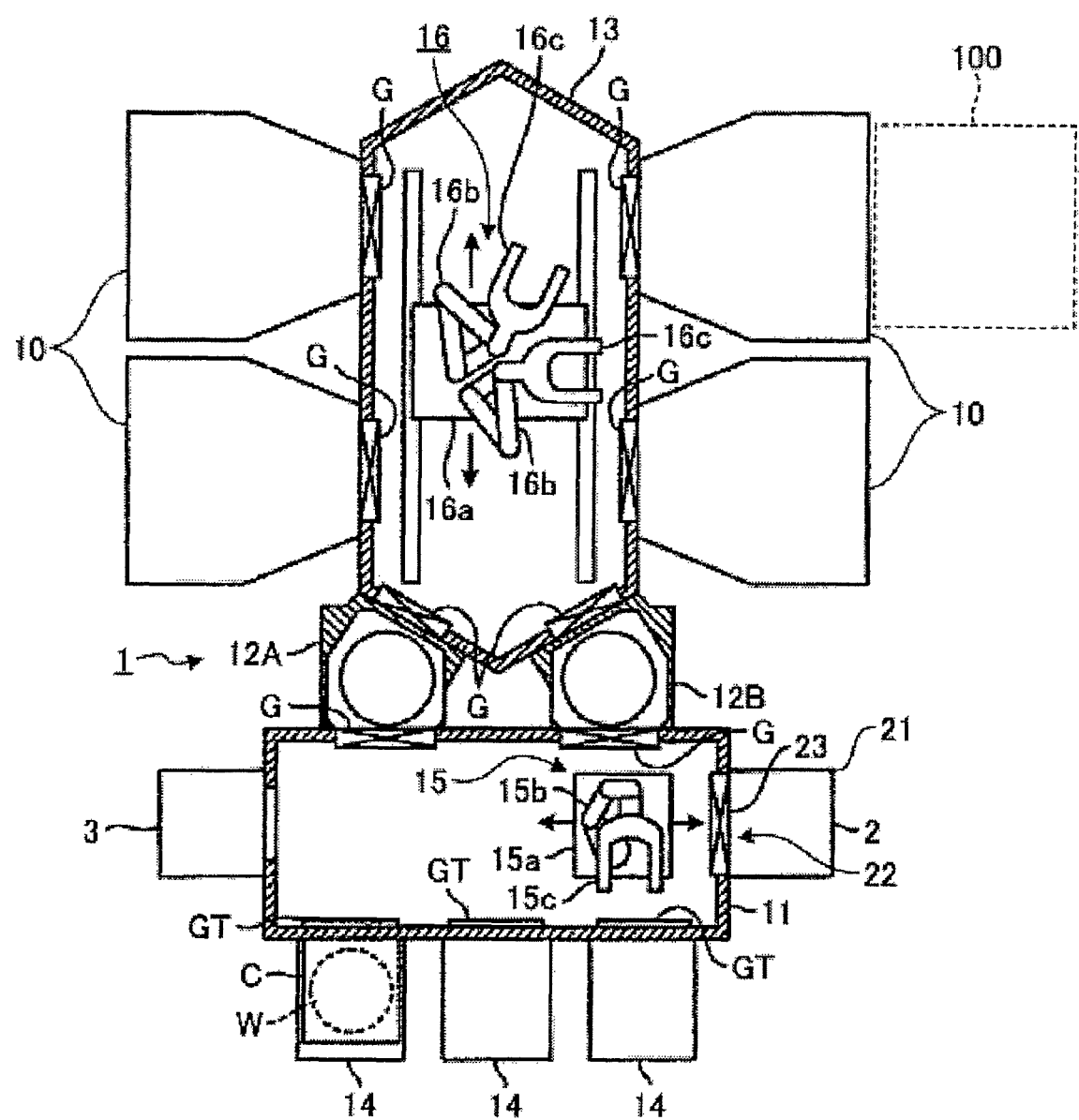
FIG. 1 schematically shows a configuration of a substrate processing system according to an embodiment.

Hereinafter, embodiments of a vacuum processing apparatus and a maintenance apparatus of the present disclosure will be described in detail with reference to the accompanying drawings. Like reference numerals will be given to like or corresponding parts throughout the drawings. The embodiments are not intended to limit the present disclosure. The embodiments can be appropriately combined without contradicting the processing contents.

First Embodiment (Configuration of Substrate Processing System)

First, a schematic configuration of a substrate processing system according to an embodiment will be described. The substrate processing system performs a predetermined process on a substrate such as a wafer or the like. In the present embodiment, a case in which a plasma etching process is performed on a substrate will be described as an example. FIG. 1 shows the schematic configuration of the substrate processing system according to the embodiment. The substrate processing system 1 includes an atmospheric transfer chamber 11 for loading a wafer W that is a substrate for manufacturing a semiconductor device into the substrate processing system 1, two load-lock chambers 12A and 12B, a vacuum transfer chamber 13, and four vacuum processing apparatuses. Each of the vacuum processing apparatuses performs a predetermined process on the substrate. In the present embodiment, a case in which the vacuum processing apparatus is configured as a plasma etching apparatus 10 for performing a plasma etching process on a wafer W as a substrate will be described as an example.

The atmospheric transfer chamber 11 is connected to the vacuum transfer chamber 13 via the load-lock chambers 12A and 12B. The plasma etching apparatus 10 is connected to the vacuum transfer chamber 13 while being partitioned from the load-lock chambers 12A and 12B.

The inside of the atmospheric transfer chamber 11 is in an atmospheric atmosphere and carrier mounting stages 14 for mounting thereon carriers C are attached to the atmospheric transfer chamber 11. Each of the carriers C accommodates therein a plurality of wafers W. Gate doors GT, which are opened/closed in association with lids of the carriers C connected to the carriers C, are provided at a front wall of the atmospheric transfer chamber 11. A stocker 2 serving as a storage part is provided at one side surface of the atmospheric transfer chamber 11. An alignment chamber 3 serving as a position alignment mechanism is provided at the other side surface of the atmospheric transfer chamber 11. The stocker 2 includes a housing 21 for accommodating and temporarily storing the wafer W or the like. An opening 22 for a first transfer mechanism 15 and a shutter 23 for opening/closing the opening 22 are provided at the housing 21. In the alignment chamber 3, a horizontal rotation stage is provided and various alignment controls such as control of a rotation position of the wafer W and the like can be performed.

The first transfer mechanism 15 is provided in the atmospheric transfer chamber 11. The first transfer mechanism 15 transfers the wafer W between the carriers C, the load-lock chambers 12A and 12B, the alignment chamber 3 and the stocker 2. The first transfer mechanism 15 includes a base portion 15a, a multi-joint arm 15b and a holding portion 15c. The arm 15b has a base end connected to the base portion 15a and a leading end connected to the holding portion 15c. The base portion 15a is movable horizontally and vertically. The holding portion 15c has a U shape when seen from the top. The holding portion 15c holds the wafer W.

A stage on which the wafer W is mounted and supporting pins capable of moving vertically are provided in each of the load-lock chambers 12A and 12B. The wafer W can be transferred between the first transfer mechanism 15 and a second transfer mechanism 16 to be described later by the supporting pins in the load-lock chambers 12A and 12B. Further, a vacuum pump and a leakage valve (both not shown) are provided in each of the load-lock chambers 12A and 12B. Thus, an atmosphere in each of the load-lock chambers 12A and 12B can be switched between an atmospheric atmosphere and a vacuum atmosphere. In other words, it is possible to switch an atmosphere in each of the load-lock chambers 12A and 12B for transferring the wafer W between the atmospheric transfer chamber 11 maintained in an atmospheric atmosphere and the vacuum transfer chamber 13 maintained in a vacuum atmosphere.

The vacuum transfer chamber 13 is maintained in a vacuum atmosphere. The second transfer mechanism 16 is provided in the vacuum transfer chamber 13. The second transfer mechanism 16 is substantially the same as the first transfer mechanism 15 except that two arms and two holding portions are provided at one base. The base, the arms and the holding portions of the second transfer mechanism 16 are indicated by reference numerals 16a, 16b and 16c, respectively.

Notation "G" in FIG. 1 denotes an openable/closable gate valve (partition valve) for partitioning between the chambers and partitioning between the plasma etching apparatuses 10 and the vacuum transfer chamber 13. The gate valve G is closed normally and opened when the wafer W is transferred between the chambers and between the respective modules and the vacuum transfer chamber 13.

(Configuration of the Plasma Etching Apparatus)

Figure 2:
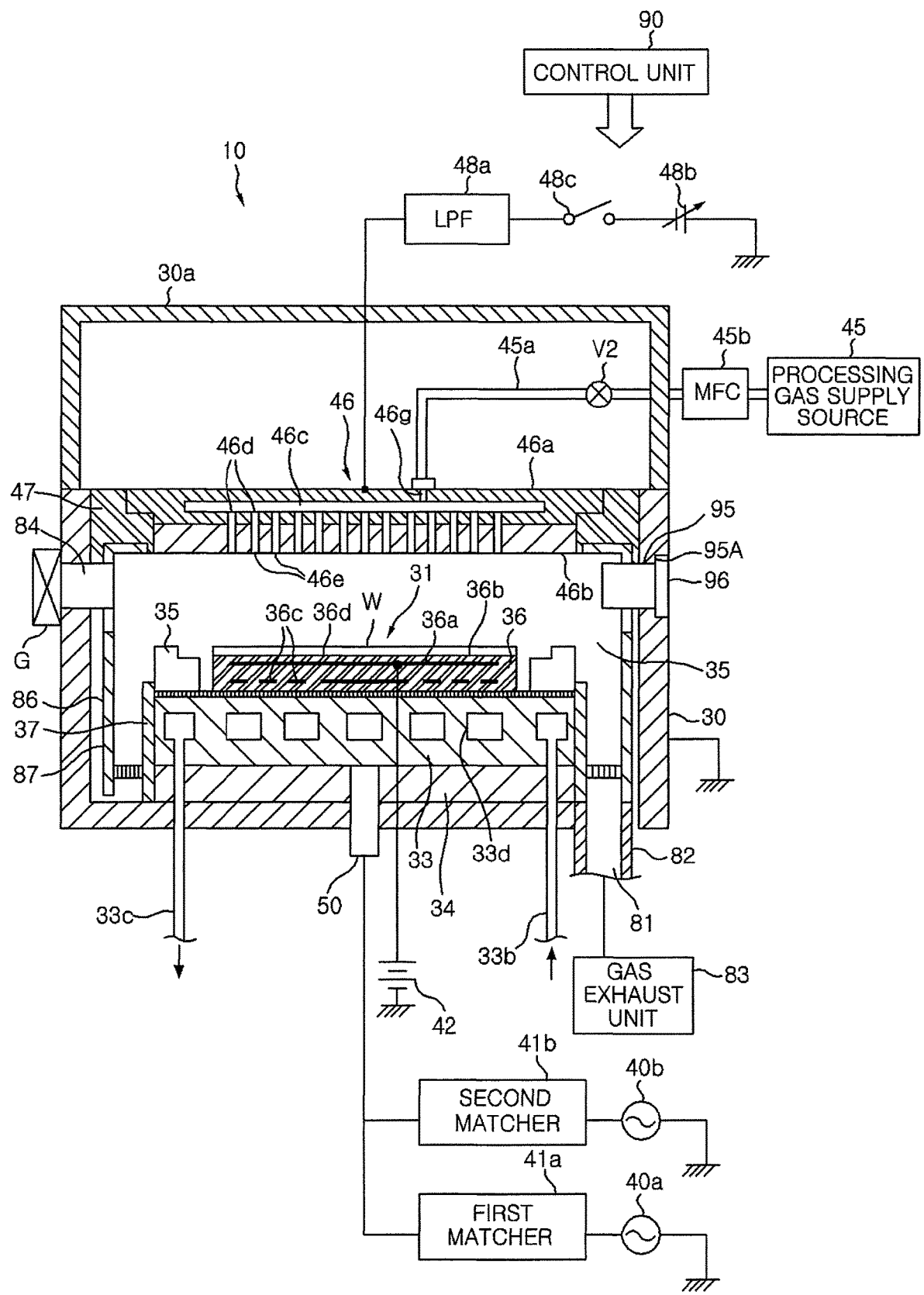
FIG. 2 schematically shows a plasma etching apparatus according to an embodiment.

Next, a configuration of the plasma etching apparatus according to an embodiment will be described. FIG. 2 schematically shows the plasma etching apparatus according to the embodiment. The plasma etching apparatus 10 includes an airtight processing chamber 30 that is electrically grounded. The processing chamber 30 is formed in a cylindrical shape and made of, e.g., aluminum having an anodically oxidized surface or the like. The processing chamber 30 defines a processing space where a plasma is generated. A mounting table 31 for horizontally supporting a wafer W is provided in the processing chamber 30.

The mounting table 31 has a substantially cylindrical shape with an upper and a lower surface directed vertically. The upper surface of the mounting table 31 serves as a mounting surface 36d. The mounting surface 36d of the mounting table 31 is greater than the wafer W. The mounting table 31 includes a base 33 and an electrostatic chuck 36.

The base 33 is made of metal, e.g., aluminum or the like. The base 33 serves as a lower electrode. The base 33 is supported by a supporting member 34 made of an insulator. The supporting member 34 is installed at a bottom portion of the processing chamber 30.

The electrostatic chuck 36 has a flat disc-shaped upper surface. The upper surface serves as the mounting surface 36d on which the wafer W is mounted. The electrostatic chuck 36 is provided at a center of the mounting table 31 when seen from the top. The electrostatic chuck 36 includes an electrode 36a and an insulator 36b. The electrode 36a is embedded in the insulator 36b. A DC power supply 42 is connected to the electrode 36a. The wafer W is attracted and held on the electrostatic chuck 36 by a Coulomb force generated by applying a DC voltage from the DC power supply 42 to the electrode 36a. A heater 36c is provided in the insulator 36b of the electrostatic chuck 36. The heater 36c controls a temperature of the wafer W by a power supplied through a power supply unit to be described later.

A focus ring 35 made of, e.g., single crystalline silicon, is provided on an upper outer periphery of the mounting table 31. A cylindrical inner wall member 37 made of, e.g., quartz or the like, is provided to surround an edge of the mounting table 31 and an edge of the supporting member 34.

A power feed rod 50 is connected to the base 33. The power feed rod 50 is connected to a first RF power supply 40a via a first matcher 41a and connected to a second RF power supply 40b via a second matcher 41b. The first RF power supply 40a generates power for plasma generation. A high frequency power having a predetermined frequency is supplied from the first RF power supply 40a to the base 33 of the mounting table 31. The second RF power supply 40b generates power for ion attraction (bias). A high frequency power having a predetermined frequency lower than that from the first RF power supply 40a is supplied from the second RF power supply 40b to the base 33 of the mounting table 31.

A coolant path 33d is formed in the base 33. The coolant path 33d has one end connected to a coolant inlet line 33b and the other end connected to a coolant outlet line 33c. In the plasma etching apparatus 10, a temperature of the mounting table 31 can be controlled by circulating a coolant, e.g., cooling water or the like, through the coolant path 33d. In the plasma etching apparatus 10, it is also possible to form coolant paths at portions of the base which correspond to a region on which the wafer W is mounted and a region on which the focus ring 35 is mounted and separately control temperatures of the wafer W and the focus ring 35. Further, the plasma etching apparatus 10 may be configured such that a cold heat transfer gas is supplied to a backside of the wafer W and to a bottom surface of the focus ring 35 to separately control the temperatures thereof. For example, a gas supply line for supplying a cold heat transfer gas (backside gas) such as He gas or the like to a backside of the wafer W may be provided to penetrate through the mounting table 31 and the like. The gas supply line is connected to a gas supply source. With this configuration, the wafer W attracted and held on the electrostatic chuck 36 on the top surface of the mounting table 31 can be controlled to a predetermined temperature.

A shower head 46 serving as an upper electrode is provided above the mounting table 31 to face the mounting table 31 in parallel therewith. The shower head 46 and the mounting table 31 function as a pair of electrodes (upper electrode and lower electrode).

The shower head 46 is provided at a ceiling wall portion of the processing chamber 30. The shower head 46 includes a main body 46a and an upper ceiling plate 46b serving as an electrode plate. The shower head 46 is supported at an upper portion of the processing chamber 30 through an insulating member 47. The main body 46a is made of a conductive material, e.g., aluminum having an anodically oxidized surface. The upper ceiling plate 46b is detachably held at a bottom portion of the main body 46a.

A gas diffusion space 46c is formed in the main body 46a. A plurality of gas through holes 46d is formed in the bottom portion of the main body 46a to be positioned below the gas diffusion space 46c. Gas injection holes 46e are formed through the upper ceiling plate 46b in a thickness direction thereof. The gas injection holes 46e communicate with the gas through holes 46d. With this configuration, the processing gas supplied to the gas diffusion space 46c is distributed in a shower form into the processing chamber 30 through the gas through holes 46d and the gas injection holes 46e.

A gas inlet port 46g for introducing the processing gas into the gas diffusion space 46c is formed in the main body 46a. One end of gas supply line 45a is connected to the gas inlet port 46g and the other end of the gas supply line 45a is connected to a processing gas supply source 45 for supplying a processing gas. A mass flow controller (MFC) 45b and an opening/closing valve V2 are disposed in the gas supply line 45a in that order from an upstream side. The processing gas for plasma etching is supplied from the processing gas supply source 45 to the gas diffusion space 46c through the gas supply line 45a and distributed in a shower form into the processing chamber 30 through the gas through holes 46d and the gas injection holes 46e.

A variable DC power supply 48b is electrically connected to the shower head 46 serving as the upper electrode via a low pass filter (LPF) 48a. A power supply of the variable DC power supply 48b is on-off controlled by an on/off switch 48c. Current/voltage of the variable DC power supply 48b and on/off of the on/off switch 48c are controlled by a control unit 90 to be described later. As will be described later, when a plasma is generated in the processing space by applying the high frequency power from the first and the second RF power supply 40a and 40b to the mounting table 31, the on/off switch 48c is turned on by the control unit 90 and a predetermined DC voltage is applied to the shower head 46 serving as the upper electrode, if necessary.

A cylindrical ground conductor 30a extends upward from a sidewall of the processing chamber 30 to a position higher than a height of the shower head 46. The cylindrical ground conductor 30a has a ceiling wall at the top thereof.

A gas exhaust port 81 is formed at a bottom portion of the processing chamber 30. A gas exhaust unit 83 is connected to the gas exhaust port 81 through a gas exhaust line 82. The gas exhaust unit 83 has a vacuum pump. By operating the vacuum pump, a pressure in the processing chamber 30 can be decreased to a predetermined vacuum level.

A first gate 84 through which the wafer W is loaded/unloaded is provided at an inner sidewall of the processing chamber 30. A gate valve G for opening/closing the first gate 84 is provided at the first gate 84. As shown in FIG. 1, the first gate 84 is connected to the vacuum transfer chamber 13 through the gate valve G while maintaining airtightness. The wafer W can be loaded into and unloaded from the vacuum transfer chamber 13 in a state where a vacuum atmosphere is maintained.

A deposition shield 86 is provided along an inner wall of the processing chamber 30. The deposition shield 86 has a function of preventing etching by-products (deposits) from being attached to the inner wall of the processing chamber 30. The deposition shield 86 is detachably provided.

The overall operation of the plasma etching apparatus configured as described above is controlled by the control unit 90. The control unit 90 is, e.g., a computer, and controls the respective components of the plasma etching apparatus 10.

In the plasma etching apparatus 10, it is required to replace a consumed part in the processing chamber 30 which has been consumed by the etching process using plasma. For example, in the plasma etching apparatus 10, the focus ring 35 provided at an outer periphery of the wafer W is consumed by the etching process. In the plasma etching apparatus 10, when the consumed part such as the focus ring 35 or the like is replaced, the processing chamber 30 is exposed to the atmosphere. In that case, a considerably long time is required for temperature control and moisture control until the etching process for the wafer W is restarted. As a result, the productivity is decreased.

Therefore, it may be considered to replace the consumed part without exposing the processing chamber 30 to the atmosphere by replacing the consumed part through a transfer system for transferring a wafer W to the plasma etching apparatus 10. For example, in the substrate processing system 1 shown in FIG. 1, the focus ring 35 may be replaced through the transfer system for transferring the wafer W to the plasma etching apparatus 10, such as the first transfer mechanism 15 in the atmospheric transfer chamber 11, the load-lock chambers 12A and 12B, the second transfer mechanism 16 in the vacuum transfer chamber 13 and the like.

However, in the case of replacing the focus ring 35 through the transfer system for transferring the wafer W, the transfer system may be contaminated. For example, the focus ring 35 is subjected to a considerable number of etching processes until it is replaced with a new focus ring, compared to a single wafer W. Therefore, a large number of deposits are adhered to the focus ring 35 during the etching processes. In the case of replacing the focus ring 35, deposits adhered to the second transfer mechanism 16 of the vacuum transfer chamber 13 become a cause of particles. When the particles are generated in the transfer system, it is required to stop the operation of the transfer system and perform a maintenance operation for cleaning. For example, in the substrate processing system 1 shown in FIG. 1, the operation of the entire system is stopped when the operation of the transfer system is stopped to perform the maintenance operation.

For example, as shown in FIG. 1, in the substrate processing system 1 in which a plurality of plasma etching apparatuses 10 is connected to the vacuum transfer chamber 13, when all the plasma etching apparatuses 10 are driven, the transfer system consecutively transfers wafers W to the plasma etching apparatuses 10. However, in the substrate processing system 1, if one of the plasma etching apparatuses 10 uses the transfer system to replace the focus ring 35, the other plasma etching apparatuses 10 are stopped.

Therefore, in the plasma etching apparatus 10 according to the embodiment, a gate for replacing a consumed part is provided in addition to the first gate 84. For example, as shown in FIG. 2, in the plasma etching apparatus 10, a second gate 95 is provided at an opposite side of the first gate 84 with respect to the mounting table 31 on which the wafer W is mounted. The second gate 95 is an opening greater than a consumed part to be replaced. The second gate 95 is blocked by an adaptor 96 while maintaining airtightness. For example, the second gate 95 has an outer opening greater than an inner opening and an end surface 95A is formed between the outer opening and the inner opening. An O-ring and screw holes are provided at the end surface 95A to be in contact with the adaptor 96 and the adaptor 96 is fixed by screws. The maintenance apparatus 100 to be described later can be attached to and detached from the second gate 95. For example, as shown in FIG. 1, in the plasma etching apparatus 10, the first gate 84 is connected to the transfer system for the wafer W. Therefore, it is difficult to ensure a space near the first gate 84 of the plasma etching apparatus 10, whereas it is easy to ensure a space near the opposite side of the first gate 84. Accordingly, in the plasma etching apparatus 10, the space for the maintenance apparatus 100 can be easily ensured by providing the second gate 95 at the opposite side of the first gate 84. When a consumed part needs to be replaced, an operator loosens the screws fixing the adaptor 95 from the plasma etching apparatus 10 having the consumed part to be replaced. Then, the operator attaches the maintenance apparatus 100 to the plasma etching apparatus 10 having the consumed part to be replaced, as indicated by a broken line in FIG. 1.

(Configuration of the Maintenance Apparatus)

Figure 3A:
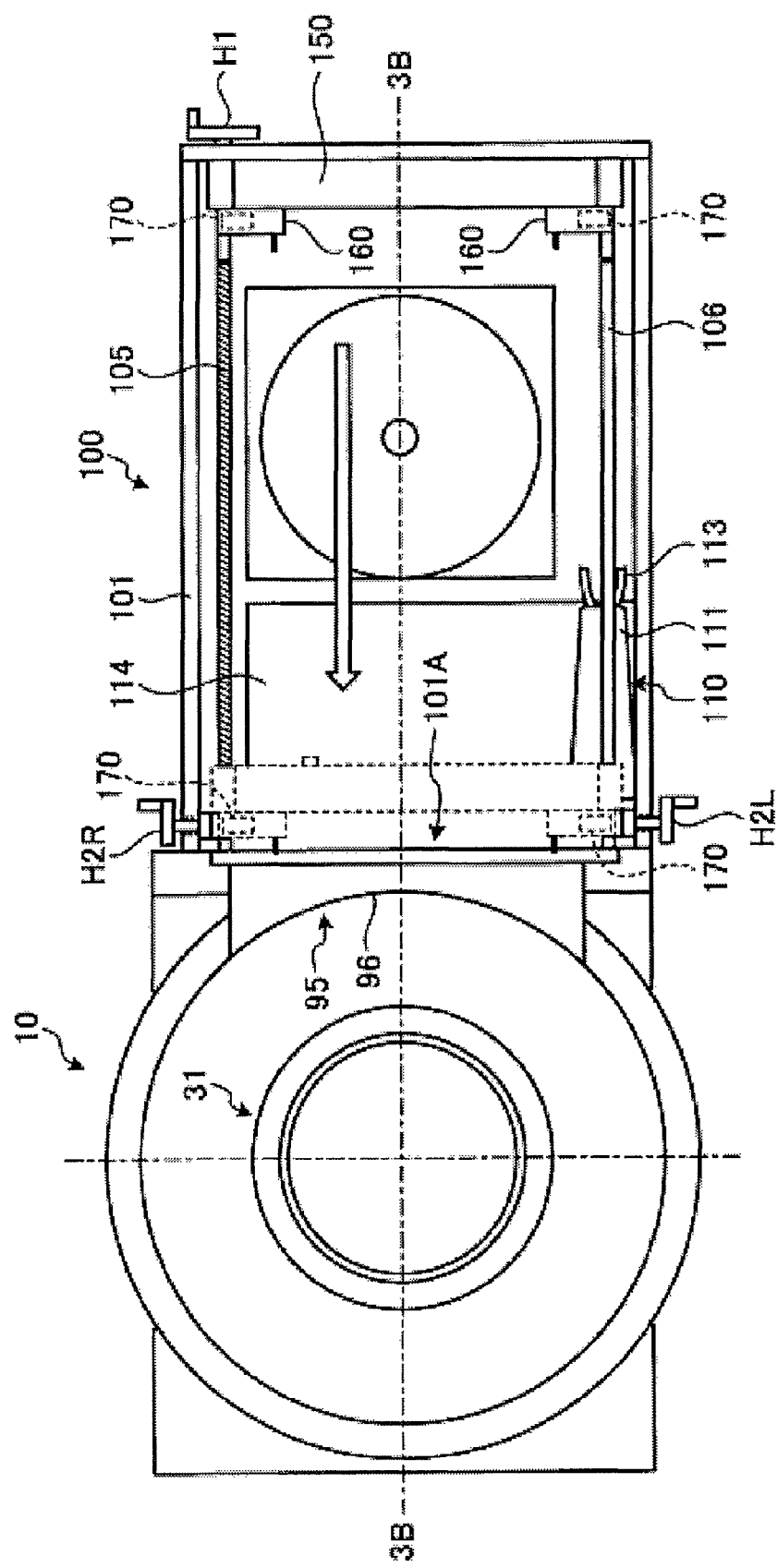
FIG. 3A is a top view schematically showing a maintenance apparatus according to a first embodiment.
Figure 3B:
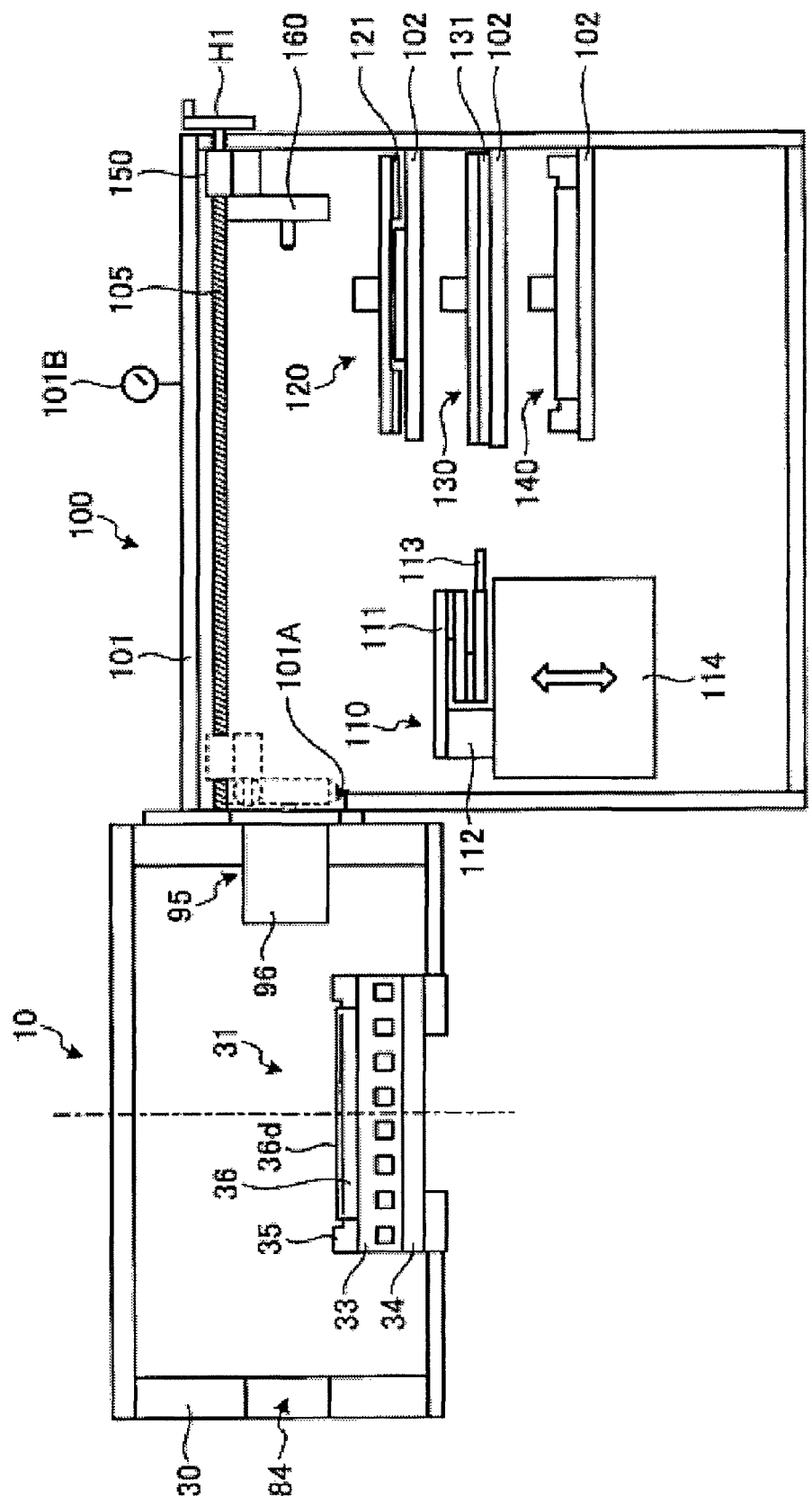
FIG. 3B is a cross sectional view schematically showing the maintenance apparatus according to the first embodiment.

Next, a configuration of the maintenance apparatus 100 according to the first embodiment will be described. FIG. 3A is a top view schematically showing the maintenance apparatus according to the first embodiment. FIG. 3B is a cross sectional view schematically showing the maintenance apparatus according to the first embodiment. FIG. 3B is a cross sectional view seen from a bottom side of FIG. 3A which is taken along a dashed line 3B-3B in FIG. 3A. FIGS. 3A and 3B show a state in which the maintenance apparatus 100 is attached to the plasma etching apparatus 10. In the following drawings, the plasma etching apparatus 10 is simply illustrated. Hereinafter, the configuration of the maintenance apparatus 100 will be appropriately described along the sequence of replacing the focus ring 35 as a consumed part.

The maintenance apparatus 100 includes a case 101 with an opening 101A having a size corresponding to that of the second gate 95 of the plasma etching apparatus 10. An O-ring or the like is provided at a portion around the opening 101A of the case 101 which is brought into contact with the plasma etching apparatus 10. The maintenance apparatus 100 is disposed such that the opening 101A corresponds to the second gate 95 and the opening 101A is fixed to the second gate 95 by screws or the like while maintaining airtightness.

A vacuum gauge 101B capable of measuring a degree of vacuum is provided in the case 101. When a consumed part is replaced, an atmosphere in the case 101 of the maintenance apparatus 100 becomes substantially the same as the vacuum atmosphere in the processing chamber 30. For example, the maintenance apparatus 100 is connected to the gas exhaust unit 83 of the plasma etching apparatus 10 through a gas exhaust line (not shown) and a pressure in the case 101 is decreased to a predetermined vacuum level by the gas exhaust unit 83. Alternatively, the maintenance apparatus 100 may include a gas exhaust unit for exhausting the case 101.

In the maintenance apparatus 100, the case 101 has therein a maintenance mechanism for performing at least one of an operation of detaching the consumed part in the processing chamber 30, an operation of attaching a replacement part in the processing chamber 30 and an operation of cleaning the processing chamber 30. In the maintenance apparatus 100 of the present embodiment, a robot arm 110, a detaching unit 120 for detaching the focus ring 35, a cleaning unit 130 for cleaning the processing chamber 30 and an attaching unit 140 for attaching a new focus ring in the processing chamber 30 are provided as the maintenance mechanism.

In the case 101, supporting tables 102 are arranged at three height levels at a predetermined interval. The detaching unit 120, the cleaning unit 130 and the attaching unit 140 are placed on the three supporting tables 102, respectively. The case 101 is partially openable/closeable, and the detaching unit 120, the cleaning unit 130 and the attaching unit 140 are separately attachable and detachable. In other words, the detaching unit 120, the cleaning unit 130 and the attaching unit 140 can be separately replaced.

The robot arm 110 includes an arm unit 111 having three arms connected by joints, a supporting portion 112 for supporting the arm unit 111 and a hand 113 provided at a leading end of the arm unit 111. The robot arm 110 can be extended by linearly stretching the three arms of the arm unit 111 or contracted by folding them. The robot arm 110 can hold an object by using the hand 113. The robot arm 110 is fixed to an elevation table 114 and vertically moved by vertical movement of the elevation table 114. The overall operations of the robot arm 110 and the elevation table 114 are controlled by a control unit (not shown). The control unit includes a user interface for displaying reception of various manipulation instructions or operational states. An operator inputs an operation instruction through the user interface. The operation instruction may separately specify the vertical movement of the supporting tables 102 or the movement of the robot arm 110. Or, the manipulation instruction may specify a series of movements. For example, the operation instruction may specify, as an instruction of detaching the focus ring 35, the vertical movement of the supporting table 102 and a series of movements of the robot arm 110 at the time of detaching the focus ring 35.

The maintenance apparatus 100 includes a detaching unit for detaching the adaptor 96 of the plasma etching apparatus 10. For example, in the maintenance apparatus 100, a ball screw 105 and a shaft 106 are provided in parallel at an upper portion of the case 101. The ball screw 105 can be rotated by a handle H1 provided at the outside of the case 101 while maintaining airtightness through, e.g., an O-ring or the like. A linear stage 150 is attached to the ball screw 105 and the shaft 106. An adaptor detaching unit 160 is attached to the linear stage 150. A groove is formed at a portion of the linear stage 150, to which the ball screw 105 is attached, to correspond to the ball screw 105. The linear stage 150 and the adaptor detaching unit 160 are moved along the ball screw 105 and the shaft 106 by the rotation of the ball screw 105.

In the case of detaching the adaptor 96, an operator rotates the handle H1 so that the linear stage 150 and the adaptor detaching unit 160 can be moved toward the adaptor 96 as indicated by dashed lines in FIGS. 3A and 3B.

Handles H2L and H2R for fixing the adaptor detaching unit 160 to the adaptor 96 are provided at side surfaces of the case 101 near the opening 101A. The handles H2L and H2R can transfer a rotational driving force of the handles H2L and H2R to the adaptor detaching unit 160 when the adaptor detaching unit 160 and the adaptor 96 are brought into contact with each other.

Since the processing chamber 30 is in a vacuum state during the etching process, the adaptor 96 is fixed to the processing chamber 30 and may not be easily detached even when setting the case 101 of the maintenance apparatus 100 to a vacuum state. Therefore, detachment mechanisms 170 for detaching the adaptor 96 are respectively provided near both end portions of the adaptor detaching unit 160 of the present embodiment.

Figure 4A:
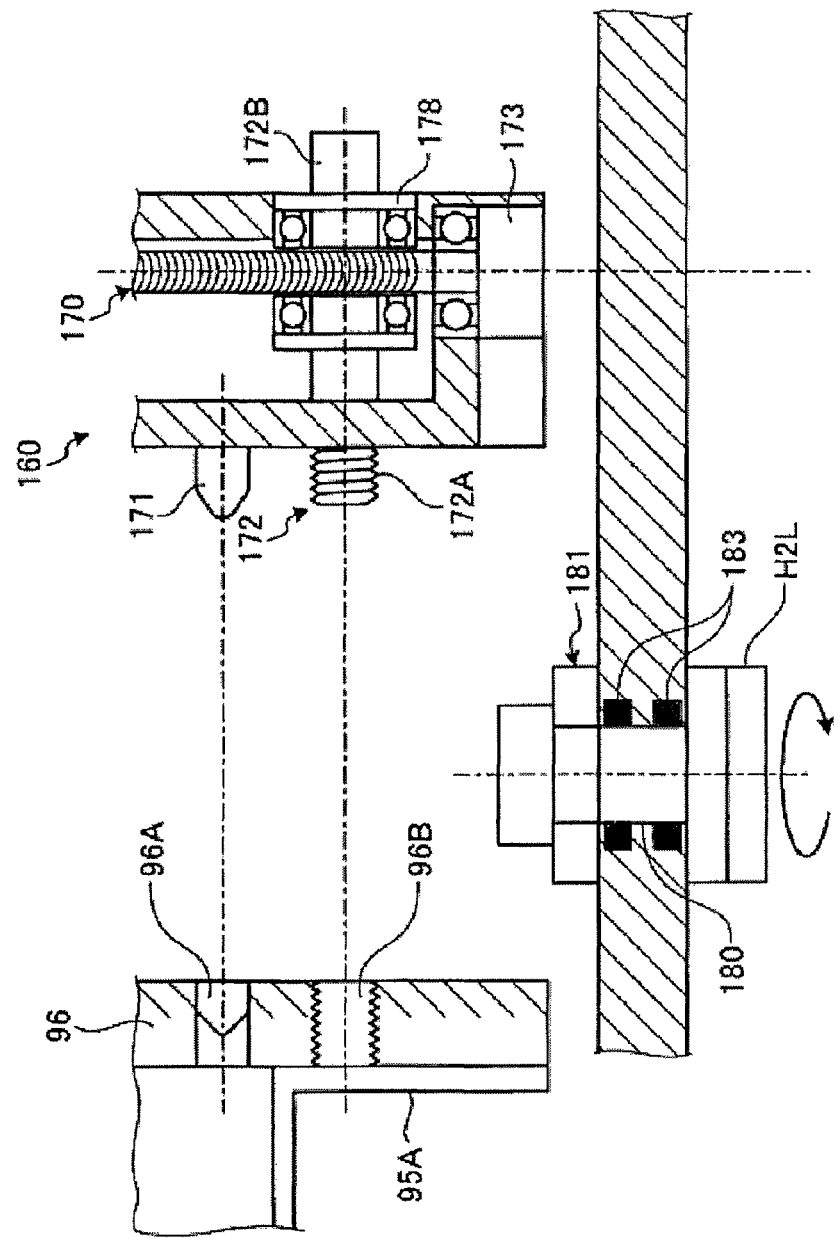
FIG. 4A explains an operation of detaching an adaptor.

FIG. 4A explains the detachment of the adaptor. Since the detachment mechanism 170 provided at the handle H2L side has the same configuration as that of the detachment mechanism 170 provided at the handle H2R side, the detachment mechanism 170 provided at the handle H2L side will be described with reference to FIG. 4A. A positioning hole 96A for stably fixing the adaptor detaching unit 160 is formed in an end portion of the adaptor 96. A through-hole 96B is formed in a portion of the adaptor 96 which faces the end surface 95A of the second gate 95. The through-hole 96B has threads and is internal-threaded (female-threaded). A positioning pin 171 is provided at a portion of the adaptor detaching unit 160 which corresponds to the positioning hole 96A. A detaching pin 172 constituting the detachment mechanism 170 is provided at a portion of the adaptor detaching unit 160 which corresponds to the through-hole 96B.

The handle H2L is coaxially connected to a protruding engagement portion 181 through a rotation shaft 180. The rotation shaft 180 can be rotated while maintaining airtightness by an O-ring 183 or the like. The protruding engagement portion 181 is rotated by rotating the handle H2L.

The detachment mechanism 170 has a recessed engagement portion 173 to be engaged with the protruding engagement portion 181 when the adaptor detaching unit 160 is brought into contact with the adaptor 96 at the same height position as the protruding engagement portion 181.

Figure 4B:
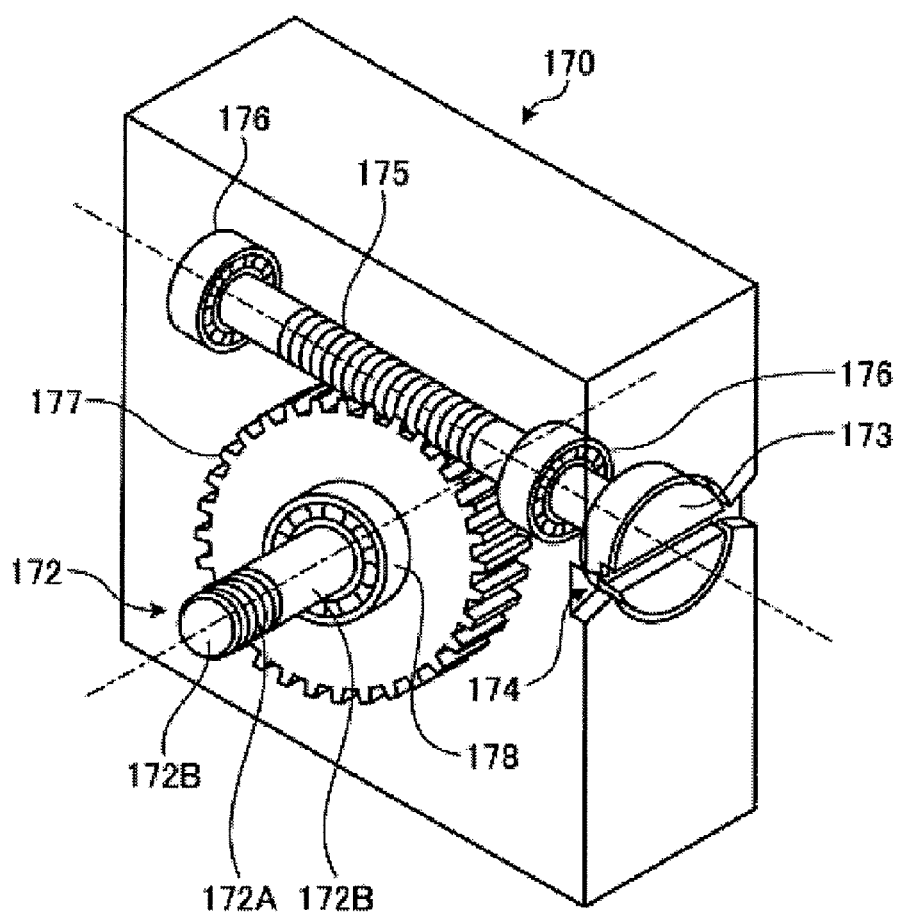
FIG. 4B is a perspective view of a detachment mechanism.

FIG. 4B is a perspective view of the detachment mechanism. In the detachment mechanism 170, a groove 174 is formed in a side surface thereof facing the handle H2L and vertical width of the groove 174 is increased as it goes away from the recessed engagement portion 173. The detachment mechanism 170 can guide the protruding engagement portion 181 to the recessed engagement portion 173 through the groove 174. In the detachment mechanism 170, when the protruding engagement portion 181 and the recessed engaging portion 173 are coaxially engaged, the protruding engagement portion 181 and the recessed engagement portion 173 can rotate together and the rotational driving force of the handle H2L can be transferred to the detachment mechanism 170.

A worm gear 175 is coaxially connected to the recessed engagement portion 173. The worm gear 175 is rotatably held by a bearing 176 and rotated by rotation of the recessed engagement portion 173. A wheel 177 is rotated by rotation of the worm gear 175. The detaching pin 172 has an external-threaded (male-threaded) leading end portion 172A and an extensible/contractible shaft 172B. The wheel 177 and the telescopic shaft 172B have a ball spline structure. The telescopic shaft 172B is rotatably held by a bearing 178.

In the case of detaching the adaptor 96, an operator rotates the handle H1 so that the linear stage 150 and the adaptor detaching unit 160 can be moved toward the adaptor as indicated by the dashed lines in FIGS. 3A and 3B. When the adaptor detaching unit 160 is brought into contact with the adaptor 96, the positioning pin 171 is insertion-fitted to the positioning hole 96A and the detaching pin 172 is insertion-fitted to the through-hole 96B. Then, the operator rotates the handles H2L and H2R so that the external threads (male threads) of the leading end portion 172A of the detaching pin 172 are further insertion-fitted to the internal threads (female threads) of the through-hole 96B and brought into contact with the end surface 95A while passing through the through-hole 96B. Therefore, the end surface 95A is pressed. Accordingly, even when the adaptor 96 is fixed to the processing chamber 30, it is possible to detach the adaptor 96.

Figure 5B:
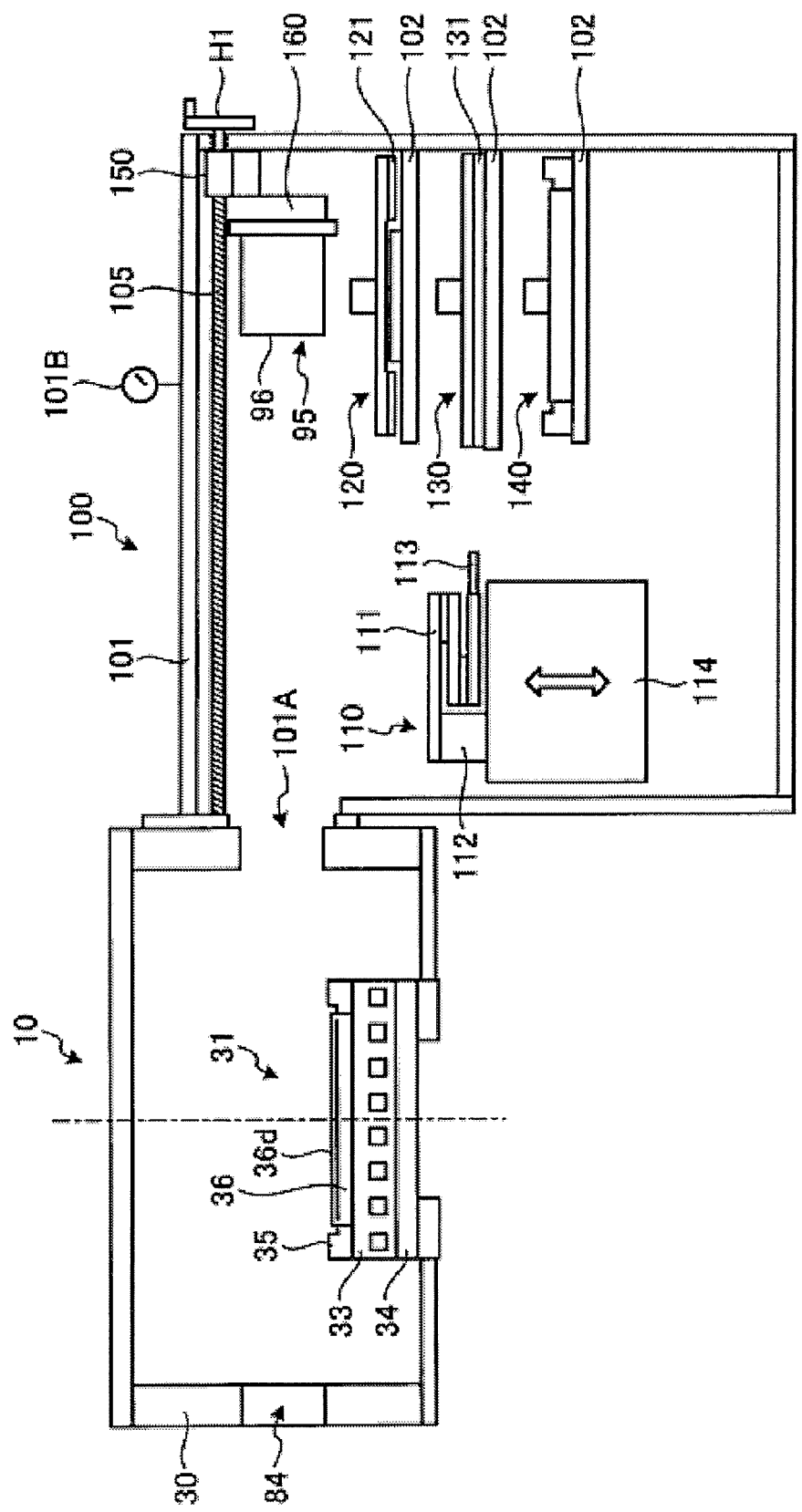
FIG. 5B is a cross sectional view schematically showing the maintenance apparatus according to the first embodiment.

When the adaptor 96 is detached, the operator rotates the handle H1 in a reverse direction to that used in the detaching operation so that the linear stage 150 and the adaptor detaching unit 160 can be moved to the original positions. FIGS. 5A and 5B show a state in which the adaptor 96 is detached. FIG. 5A is a top view schematically showing the maintenance apparatus according to the first embodiment. FIG. 5B is a cross sectional view schematically showing the maintenance apparatus according to the first embodiment. FIG. 5B is a cross sectional view seen from a bottom side of FIG. 5A which is taken along a dashed line 5B-5B in FIG. 5A. The detached adaptor 96 is moved to a right side while being held by the adaptor detaching unit 160.

Figure 6A:
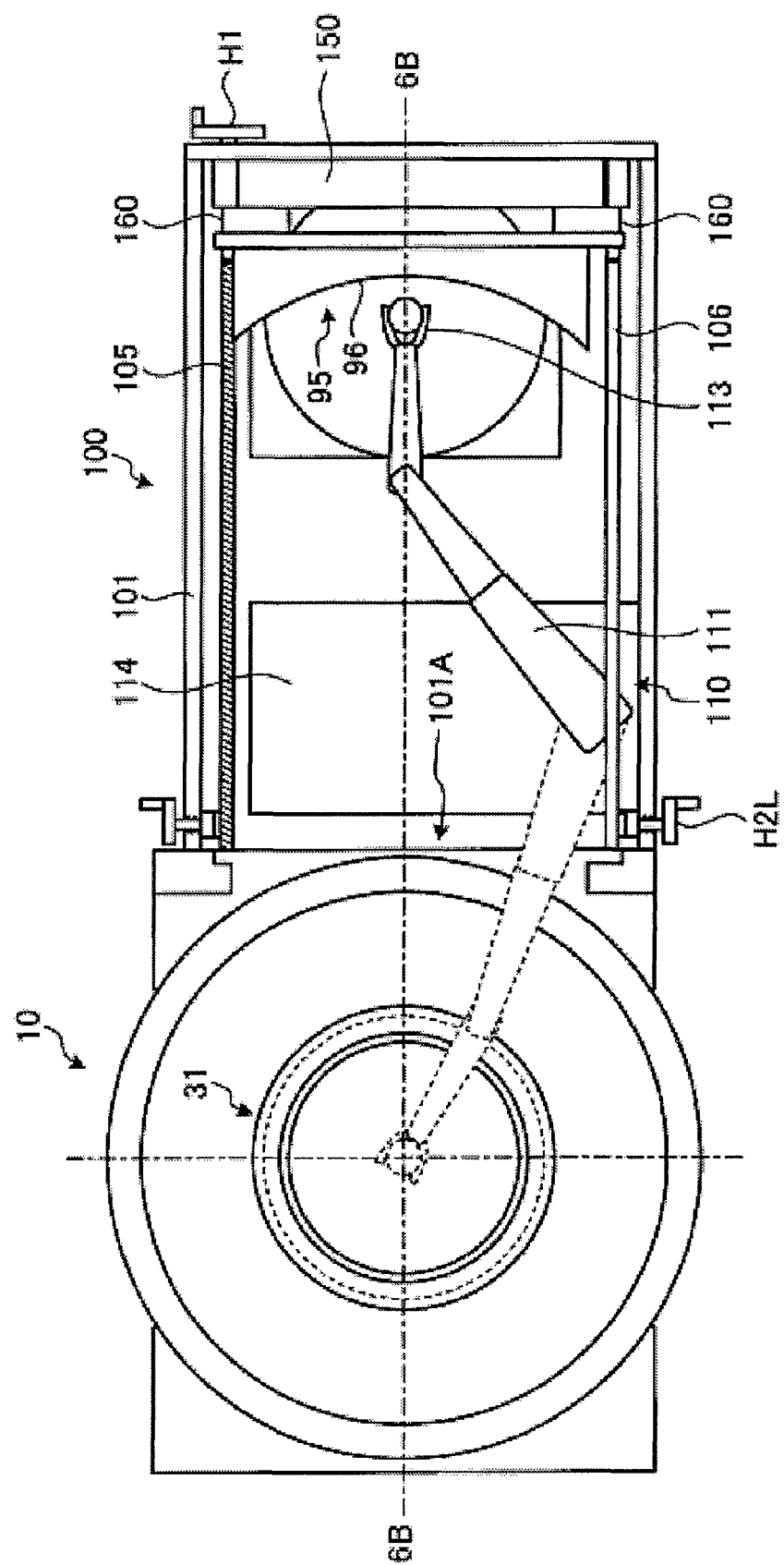
FIG. 6A is a top view schematically showing the maintenance apparatus according to the first embodiment.
Figure 6B:
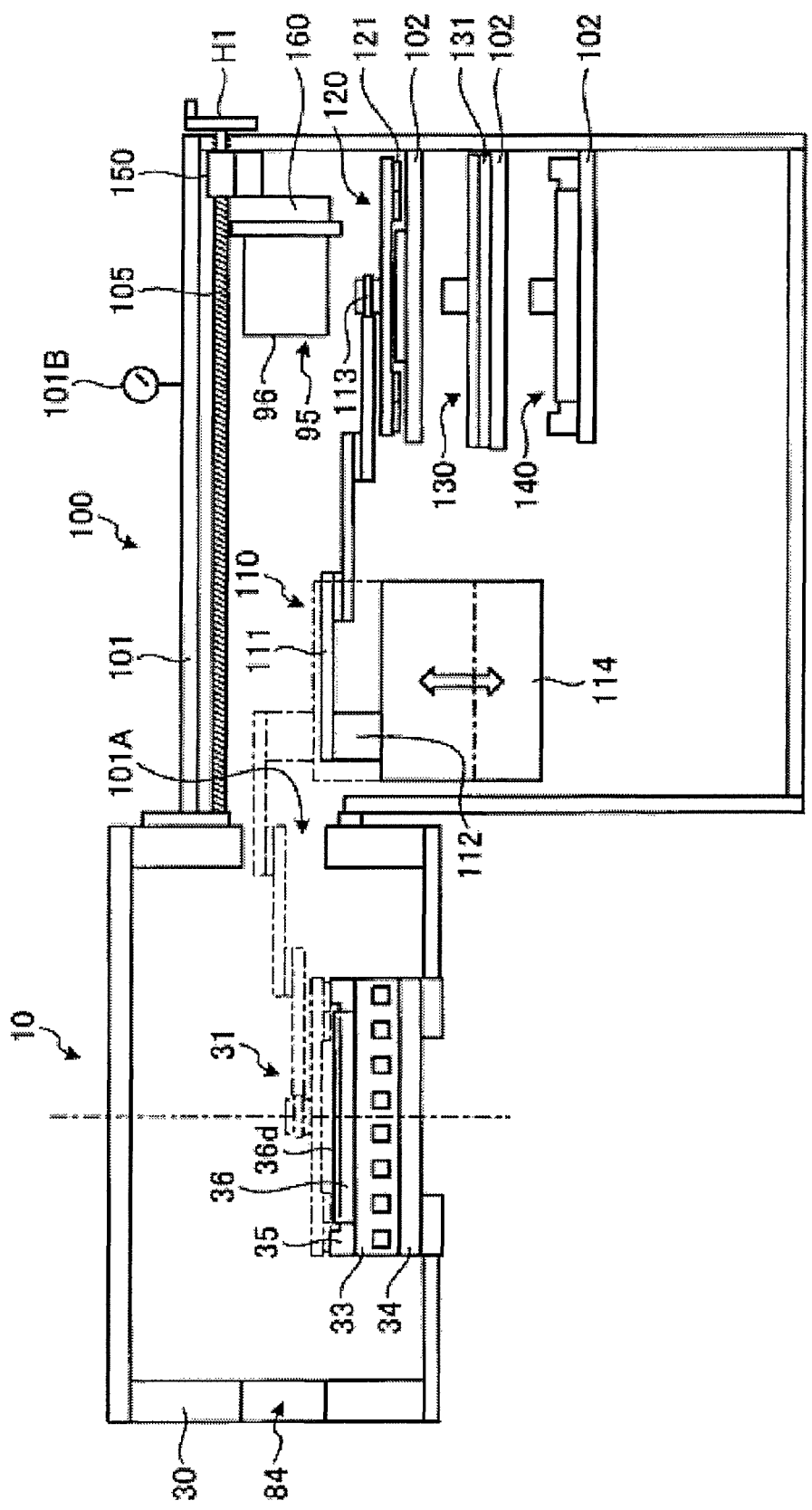
FIG. 6B is a cross sectional view schematically showing the maintenance apparatus according to the first embodiment.

Next, an operation of detaching the focus ring 35 will be described. FIGS. 6A and 6B show the operation of detaching the focus ring 35. FIG. 6A is a top view schematically showing the maintenance apparatus according to the first embodiment. FIG. 6B is a cross sectional view schematically showing the maintenance apparatus according to the first embodiment. FIG. 6B is a cross sectional view seen from a bottom side of FIG. 6A which is taken along a dashed line 6B-6B in FIG. 6A.

The detaching unit 120 is formed in a disc shape having a size that is substantially the same as that of the focus ring 35. An adhesive layer 121 is formed at an outer peripheral region of a bottom surface of the detaching unit 120 which corresponds to the focus ring 35.

In the case of detaching the focus ring 35 of the plasma etching apparatus 10, the elevation table 114 moves to a height position corresponding to the supporting table 102 on which the detaching unit 120 is mounted. The robot arm 110 extends the arm unit 111 toward the detaching unit 120 so that the hand 113 can hold the detaching unit 120. Then, the robot arm 110 contracts the arm unit 111 while holding the detaching unit 120.

Next, the elevation table 114 moves to a height position corresponding to the opening 101A as indicated by dashed lines in FIGS. 6A and 6B. The robot arm 110 extends the arm unit 111 toward the opening 101A, and moves the detaching unit 120 to a position above the mounting table 31 through the opening 101A. Then, the robot arm 110 lowers the arm unit 111 so that the detaching unit 120 comes in contact with the mounting table 31. Accordingly, the focus ring 35 mounted on the mounting table 31 is adhered to the detaching unit 120 by the adhesive layer 121.

The robot arm 110 detaches the focus ring 35 from the mounting table 31 by lifting the arm unit 111. Then, the robot arm 110 and the elevation table 114 operate in a reverse sequence to that in the case of moving the detaching unit 120 from the supporting table 102 to the position above the mounting table 31. As a consequence, the detaching unit 120 to which the focus ring 35 is adhered is stored in the original supporting table 102.

Figure 7A:
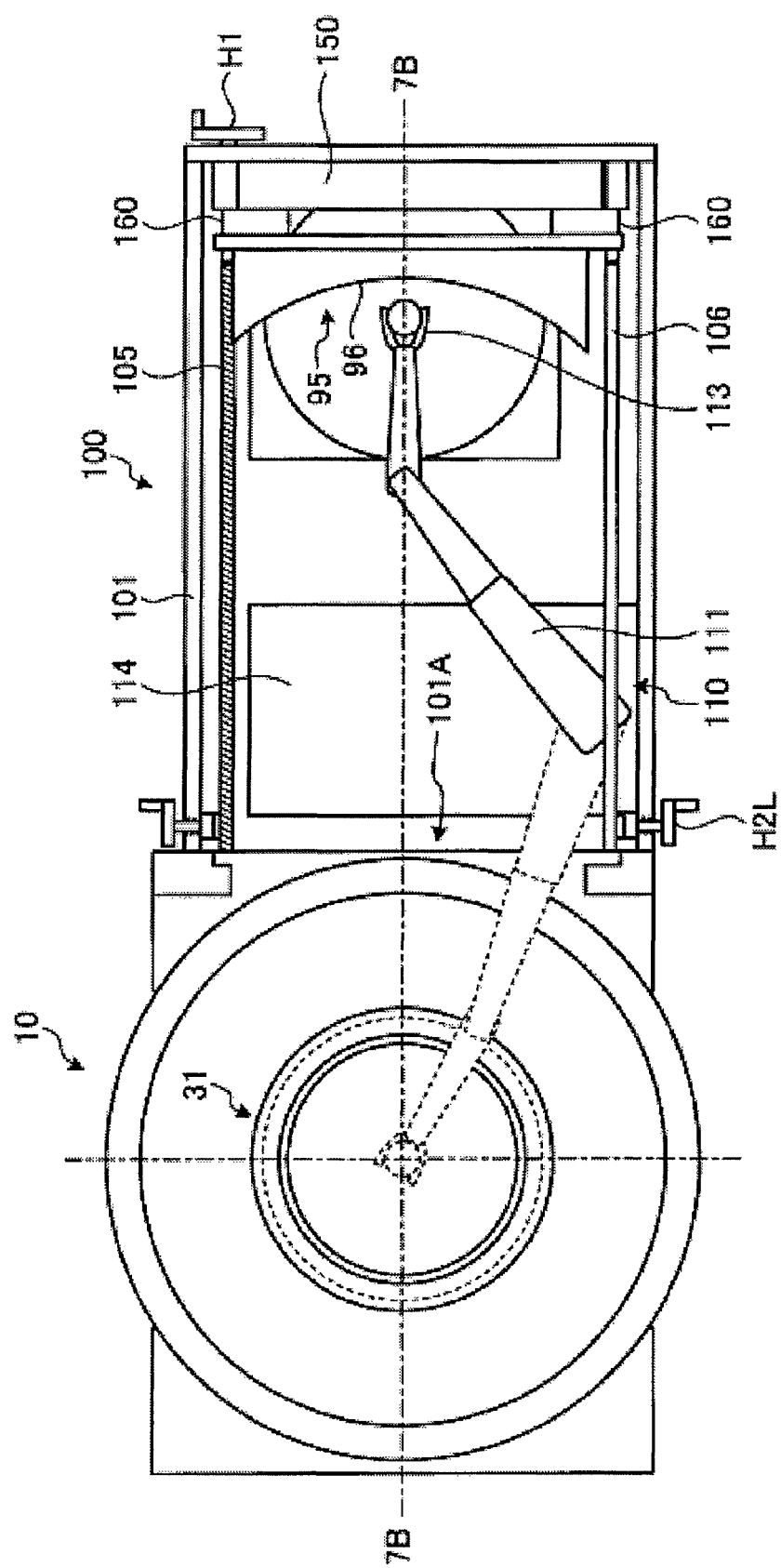
FIG. 7A is a top view schematically showing the maintenance apparatus according to the first embodiment.

Next, an operation of cleaning the mounting surface 36d of the mounting table 31 will be described. FIGS. 7A and 7B illustrate the operation of cleaning the mounting surface 36d of the mounting table 31. FIG. 7A is a top view schematically showing the maintenance apparatus according to the first embodiment. FIG. 7B is a cross sectional view schematically showing the maintenance apparatus according to the first embodiment. FIG. 7B is a cross sectional view seen from a bottom side of FIG. 7A which is taken along a dashed line 7B-7B in FIG. 7A.

The cleaning unit 130 is formed in a disc shape having a size that is substantially the same as that of the mounting surface 36d of the mounting table 31. An adhesive layer 131 is formed on the entire bottom surface of the cleaning unit 130.

In the case of cleaning the mounting surface 36d of the mounting table 31, the elevation table 114 is moved to a height position corresponding to the supporting table 102 on which the cleaning unit 130 is mounted. The robot arm 110 extends the arm unit 111 toward the cleaning unit 130 and holds the cleaning unit 130 through the hand 113. Then, the robot arm 110 contracts the arm unit 111 while holding the cleaning unit 130.

Next, the elevation table 114 is moved to a height position corresponding to the opening 101A as indicated by the dashed lines of FIGS. 7A and 7B. The robot arm 110 extends the arm unit 111 toward the opening 101A, and moves the cleaning unit 130 to a position above the mounting table 31 through the opening 101A and then lowers the arm unit 111 so that the cleaning unit 130 comes in contact with the mounting table 31. Accordingly, undesired substances, such as deposits, dust and the like, on the mounting table 31 are adhered to the adhesive layer 131 of the cleaning unit 130. As a result, the mounting table 31 is cleaned.

The robot arm 110 separates the cleaning unit 130 from the mounting table 31 by lifting the arm unit 111. Then, the robot arm 110 and the elevation table 114 operate in a reverse sequence to that in the case of moving the cleaning unit 130 from the supporting table 102 to the position above the mounting table 31. As a consequence, the cleaning unit 130 to which the undesired substances are adhered is stored in the original supporting table 102.

Figure 8A:
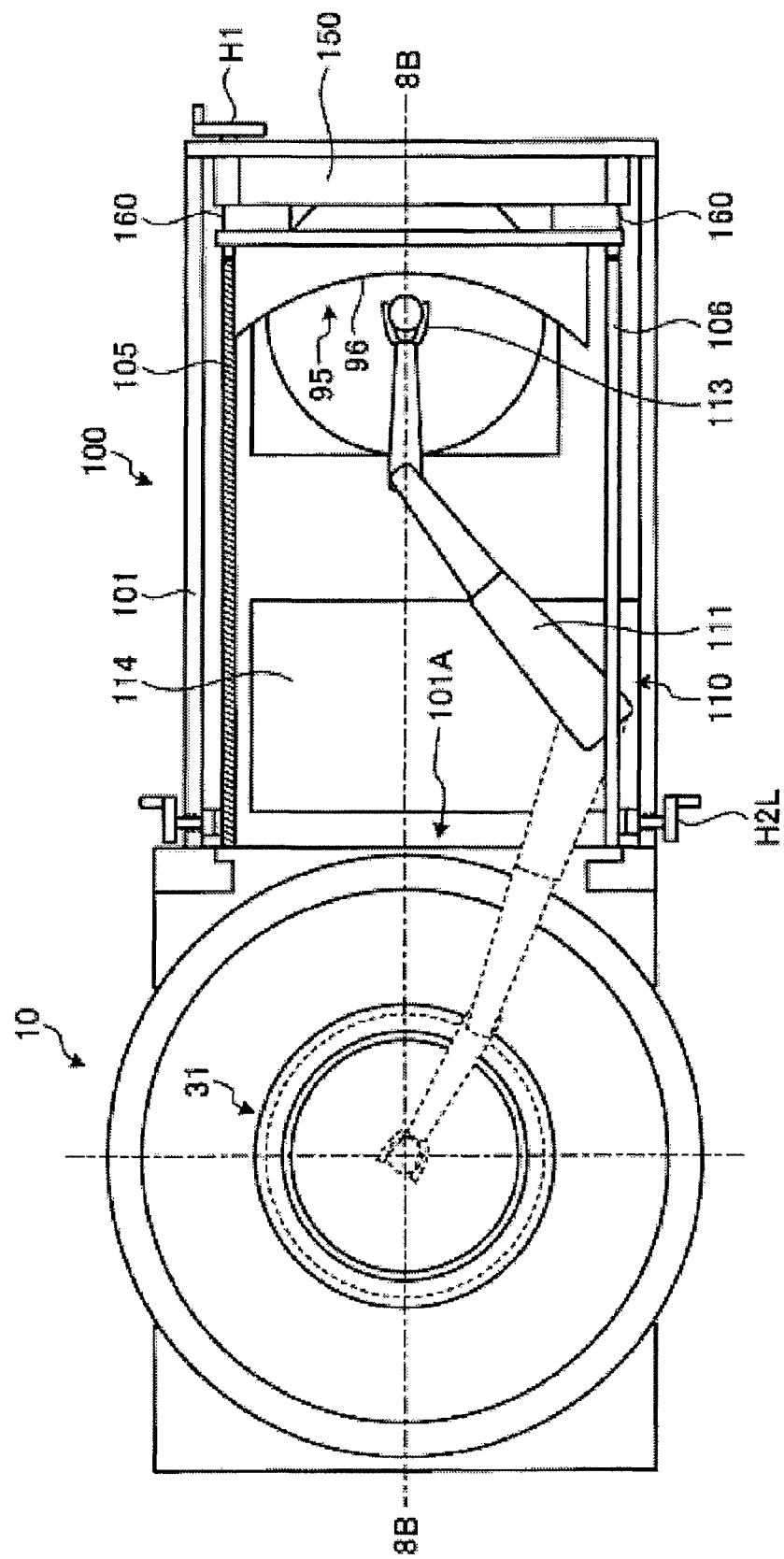
FIG. 8A is a top view schematically showing the maintenance apparatus according to the first embodiment.
Figure 8B:
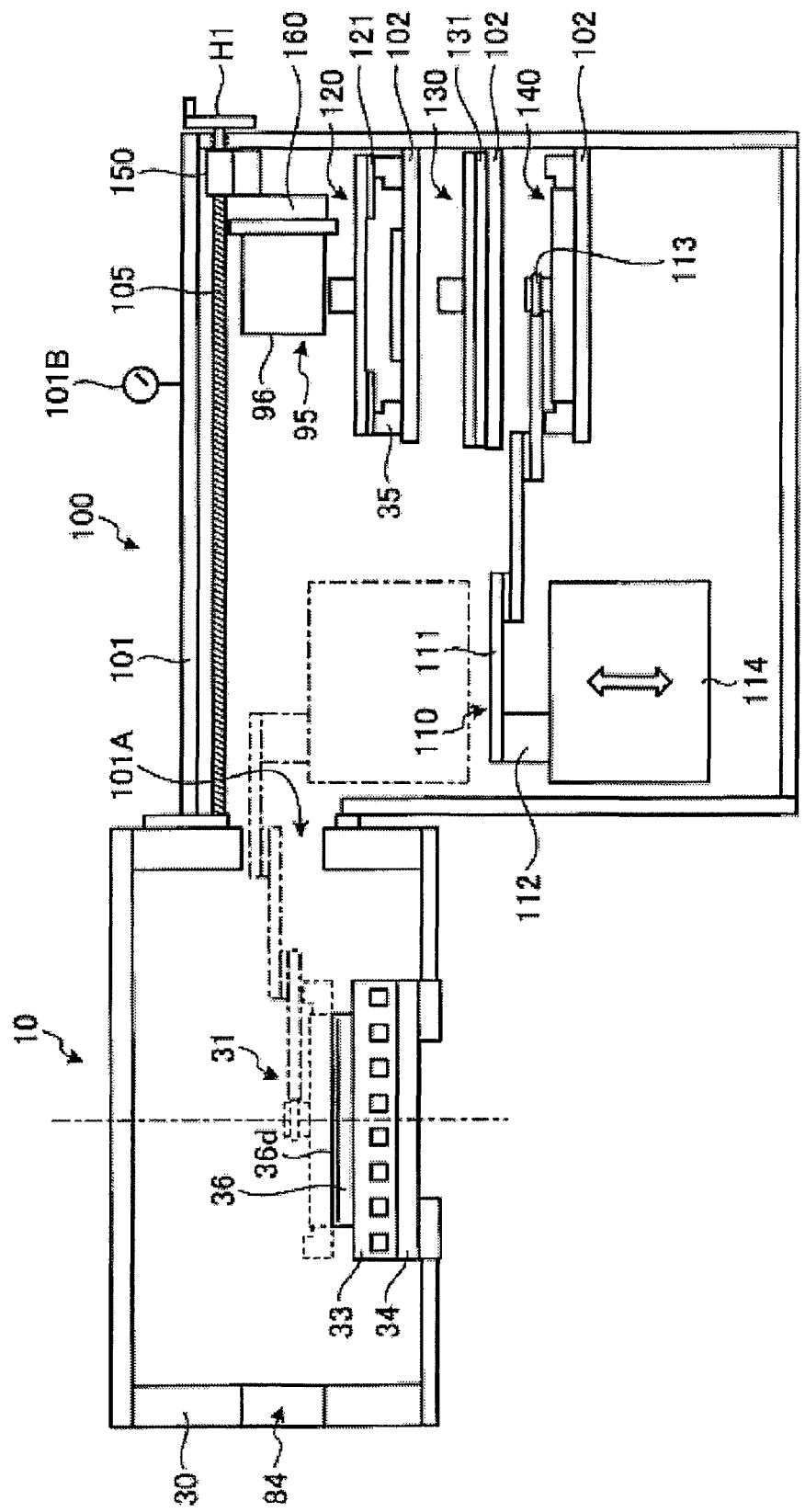
FIG. 8B is a cross sectional view schematically showing the maintenance apparatus according to the first embodiment.

Next, an operation of attaching a new focus ring 35 to the mounting table 31 will be described. FIGS. 8A and 8B illustrate the operation of attaching a new focus ring 35 to the mounting table 31. FIG. 8A is a top view schematically showing the maintenance apparatus according to the first embodiment. FIG. 8B is a cross sectional view schematically showing the maintenance apparatus according to the first embodiment. FIG. 8B is a cross sectional view seen from a bottom side of FIG. 8A which is taken along a dashed line 8B-8B in FIG. 8A.

The attaching unit 140 has substantially the same size as that of the mounding surface 36d of the mounting table 31 and the focus ring 35 can be attached thereto and detached therefrom. A new focus ring 35 is set to the attaching unit 140. The attaching unit 140 will be described in detail later.

In the case of attaching a new focus ring 35 to the mounting table 31, the elevation table 114 is moved to a height position corresponding to the supporting table 102 on which the attaching unit 140 is mounted. The robot arm 110 extends the arm unit 111 toward the attaching unit 140 and holds the attaching unit 140 through the hand 113. Then, the robot arm 110 contracts the arm unit 111 while holding the attaching unit 140.

Next, the elevation table 114 is moved to a height position corresponding to the opening 101A as indicated by the dashed lines in FIGS. 8A and 8B. The robot arm 110 extends the arm unit 111 toward the opening 101A, moves the attaching unit 140 to a position above the mounting table 31 through the opening 101A, and then lowers the arm unit 111 so that the attaching unit 140 comes in contact with the mounting table 31.

The attaching unit 140 can release the new focus ring 35 when contacting with the mounting table 31.

Figure 9:
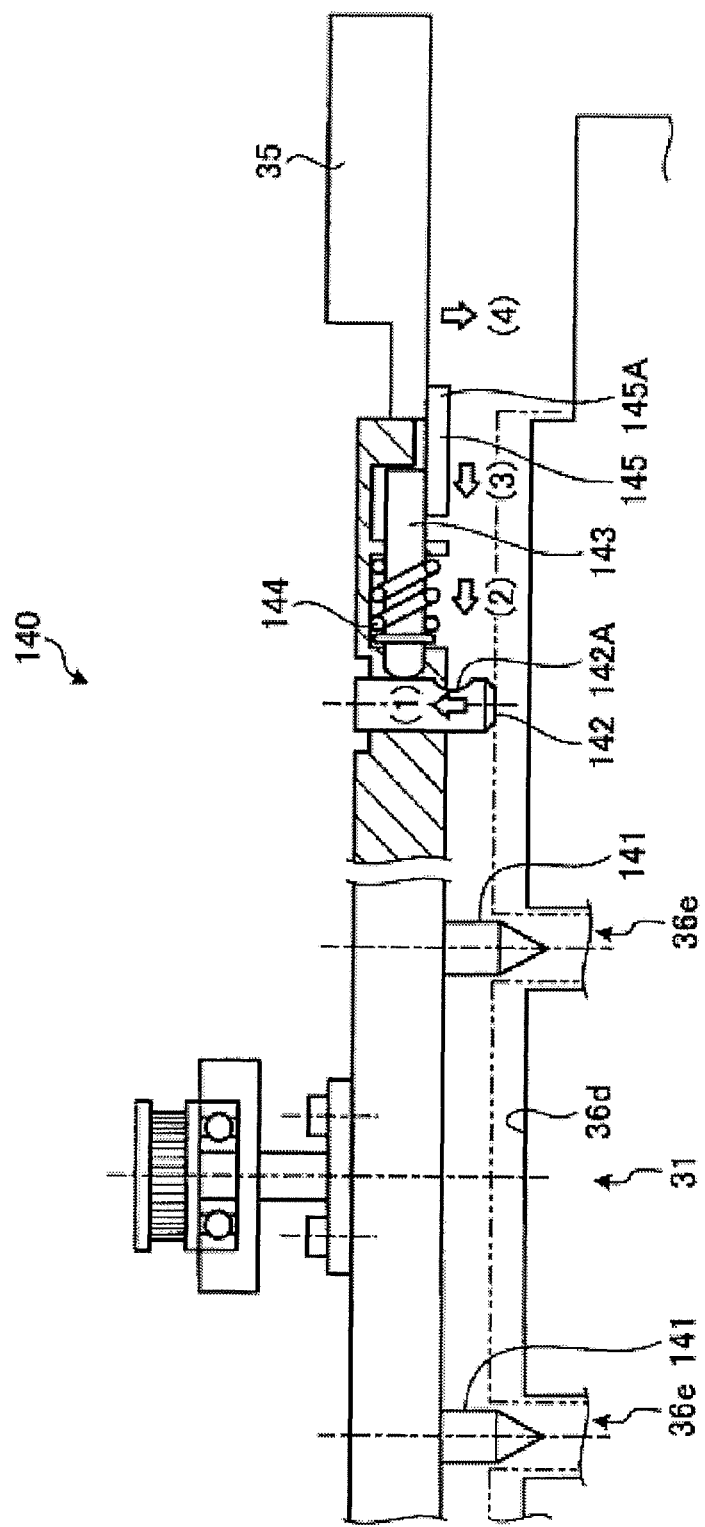
FIG. 9 is a top view schematically showing an attaching unit according to the first embodiment.

FIG. 9 is a top view schematically showing the attaching unit according to the first embodiment. Positioning pins 141 are provided at a bottom surface of the attaching unit 140. When the attaching unit 140 is mounted on the mounting table 31, the positioning pins 141 are insertion-fitted to positioning holes 36e formed in the mounting surface 36d of the mounting table 31. The positioning holes 36e may be provided at the mounting table for a single purpose. Or, it is also possible to use existing holes, e.g., holes through which lifter pins for vertically moving the wafer W mounted on the mounting table 31 are inserted.

The attaching unit 140 includes a contact pin 142 and a pin 143 for releasing the focus ring 35. The pin 143 is in contact with a side surface of the contact pin 142 and biased toward the contact pin 142 by a spring 144. The contact pin 142 has a leading end projecting from the bottom surface of the attaching unit 140. When the attaching unit 140 is mounted on the mounting table 31, the leading end of the contact pin 142 is brought into contact with the mounting table 31 and pressed and put in the attaching unit 140 (see (1) in FIG. 9). A groove 142A is formed at a position on the side surface of the contact pin 142 which corresponds to with the leading end of the pin 143 when the contact pin 142 is put in the attaching unit 140. When the contact pin 142 is put in the attaching unit 140, the leading end of the pin 143 is biased and fitted into the groove 142A of the pin contact 142 by the spring 144 (see (2) in FIG. 9).

One end portion of an engaging member 145 is fixed to the pin 143. The other end portion of the engaging member 145 protrudes from the end of the attaching unit 140 by a distance smaller than the depth of the groove 142A. A new focus ring 35 is engaged with a protruding portion 145A of the engaging member 145 protruding from the end of the attaching unit 140. The engaging member 145 is moved as the leading end of the pin 143 is moved into the groove 142A and, thus, the protruding portion 145A does not project from the end of the attaching unit 140 (see (3) in FIG. 9). Accordingly, the engagement between the protruding portion 145A and the new focus ring 35 is released, and the new focus ring 35 is mounted on the mounting table 31 (see (4) in FIG. 9).

After the focus ring 35 is mounted on the mounting table 31, the robot arm 110 detaches the attaching unit 140 from the mounting table 31 by lifting the arm unit 111. Then, the robot arm 110 and the elevation table 114 operate in a reverse sequence to that used in the case of moving the attaching unit 140 from the supporting table 102 to the position above the mounting table 31. As a consequence, the attaching unit 140 is stored in the original supporting table 102.

Figure 10A:
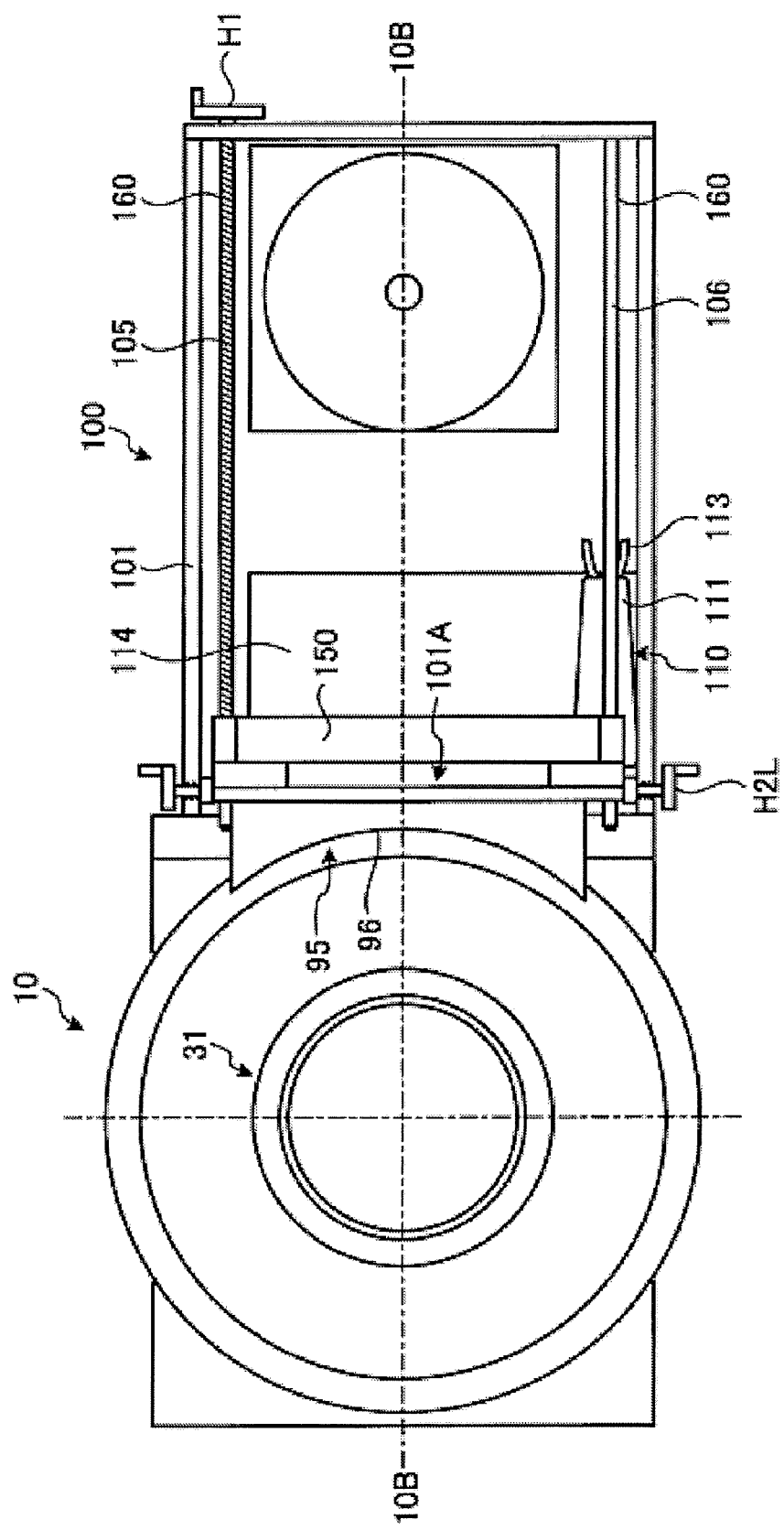
FIG. 10A is a top view schematically showing the maintenance apparatus according to the first embodiment.

After the focus ring 35 is replaced in the above-described manner, the operator attaches the adaptor 96 to the second gate 95 in a reverse sequence to that used in the case of detaching the adaptor 96. Then, the operator returns the pressure in the case 101 of the maintenance apparatus 100 to an atmospheric pressure. FIGS. 10A and 10B show a state in which the replacement of the focus ring 35 is completed. FIG. 10A is a top view schematically showing the maintenance apparatus according to the first embodiment. FIG. 10B is a cross sectional view schematically showing the maintenance apparatus according to the first embodiment. FIG. 10B is a cross sectional view seen from a bottom side of FIG. 10A which is taken along a dashed line 10B-10B in FIG. 10A.

In the plasma etching apparatus 10 of the present embodiment, the focus ring 35 which is consumed by the processing of the wafer W is provided in the processing chamber 30. Further, in the plasma etching apparatus 10, the first gate 84 used for loading/unloading the wafer W and the second gate 95 to/from which the maintenance apparatus 100 can be attached/detached are provided in the processing chamber 30. Accordingly, the plasma etching apparatus 10 can replace the focus ring 35 without using the transfer system for transferring a wafer W. As a result, the plasma etching apparatus 10 can replace the focus ring 35 while suppressing contamination of the transfer system for transferring a wafer W.

In the plasma etching apparatus 10 of the present embodiment, the second gate 95 is provided at the opposite side of the first gate 84 with respect to the mounting table in the processing chamber 30. Accordingly, the plasma etching apparatus 10 can ensure a space for the maintenance apparatus 100.

The maintenance apparatus 100 of the present embodiment includes the case 101 with the opening 101A having a size corresponding to that of the second gate 95 of the plasma etching apparatus 10. The maintenance apparatus 100 can be attached to the second gate 95 while maintaining airtightness. The maintenance apparatus 100 further includes the maintenance mechanism provided in the case 101. The maintenance mechanism performs at least one of the operation of detaching the focus ring 35 in the processing chamber 30 through the opening 101A, the operation of attaching the focus ring 35 in the processing chamber 30 and the operation of cleaning the processing chamber 30. Accordingly, the maintenance apparatus 100 can replace the focus ring 35 without using the transfer system for transferring a wafer W. As a result, the maintenance apparatus 100 can replace the focus ring 35 while suppressing contamination of the transfer system for transferring a wafer W.

The maintenance apparatus 100 of the present embodiment further includes the robot arm 110, the detaching unit 120 that can be attached to and detached from the robot arm 110, the attaching unit 140 and the cleaning unit 130. Accordingly, the maintenance apparatus 100 can perform the operation of detaching the focus ring 35 in the processing chamber 30, the operation of attaching the focus ring 35 in the processing chamber 30 and the operation of cleaning the processing chamber 30.

The detaching unit 120 of the present embodiment has the adhesive layer 121 on its surface to be in contact with the focus ring 35. Accordingly, the detaching unit 120 can simply detach the focus ring 35 only through the contact with the focus ring 35.

In the maintenance apparatus 100 of the present embodiment, the detaching unit 120, the attaching unit 140 and the cleaning unit 130 can be separately provided in and detached from the case 101. Accordingly, the maintenance apparatus 100 can simply replace the detaching unit 120, the attaching unit 140 and the cleaning unit 130. Further, a unit required for a maintenance operation to be performed can be provided to the maintenance apparatus 100.

Second Embodiment

Hereinafter, a second embodiment will be described. Since the substrate processing system 1 and the plasma etching apparatus 10 according to the second embodiment have the same configurations as those of the substrate processing system 1 and the plasma etching apparatus 10 according to the first embodiment shown in FIGS. 1 and 2, redundant description thereof will be omitted.

Figure 11A:
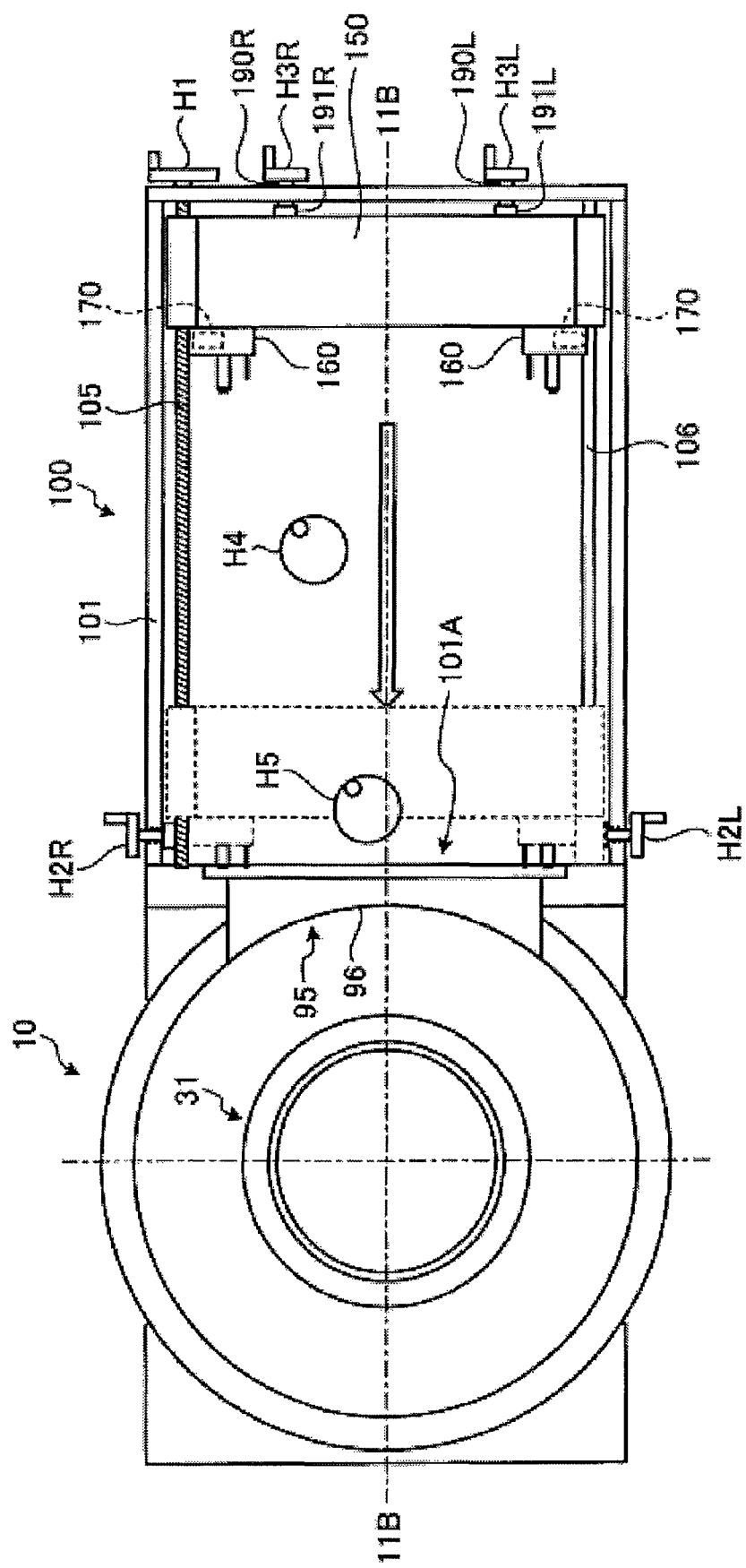
FIG. 11A is a top view schematically showing a maintenance apparatus according to a second embodiment.
Figure 11B:
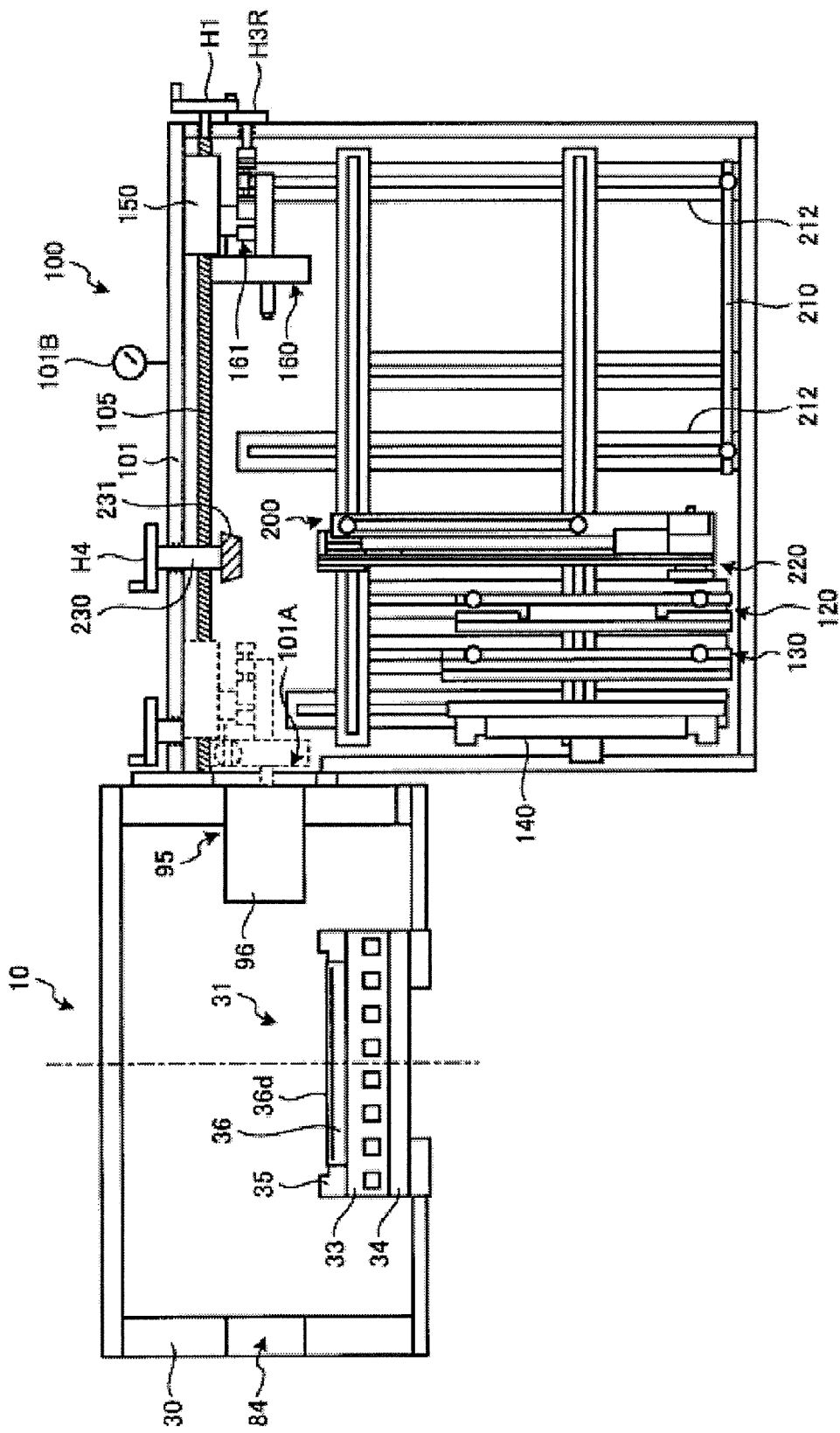
FIG. 11B is a cross sectional view schematically showing the maintenance apparatus according to the second embodiment.

The configuration of the maintenance apparatus 100 according to the second embodiment will be described. FIG. 11A is a top view schematically showing the maintenance apparatus according to the second embodiment. FIG. 11B is a cross sectional view schematically showing the maintenance apparatus according to the second embodiment. FIG. 11B is a cross sectional view seen from a bottom side of FIG. 11A which is taken along a dashed line 11B-11B in FIG. 11A. FIGS. 11A and 11B show a state in which the maintenance apparatus 100 is attached to the plasma etching apparatus 10. Like or corresponding parts will be indicated by like reference numerals used in the maintenance apparatus 100 according to the first embodiment. Hereinafter, the configuration of the maintenance apparatus 100 will be appropriately described with reference to the sequence of replacing the focus ring 35 as a consumed part.

The maintenance apparatus 100 includes a case 101 with an opening 101A having a size corresponding to that of the second gate 95 of the plasma etching apparatus 10. An O-ring or the like is provided at a portion around the opening 101A of the case 101 which is brought into contact with the plasma etching apparatus 10. The maintenance apparatus 100 is attached to the second gate 95 by screw fixing or the like while maintaining airtightness.

A vacuum gauge 1018 capable of measuring a degree of vacuum is provided to the case 101. When a consumed part is replaced, an atmosphere in the case 101 of the maintenance apparatus 100 becomes substantially the same as the vacuum atmosphere in the processing chamber 30.

In the maintenance apparatus 100, the case 101 has therein a maintenance mechanism for performing at least one of an operation of detaching the consumed part in the processing chamber 30, an operation of attaching a replacement part in the processing chamber 30 and an operation of cleaning the processing chamber 30. In the maintenance apparatus 100 of the present embodiment, a manually operated arm 200, a detaching unit 120, an attaching unit 140 and a cleaning unit 130 constitute the maintenance mechanism.

For example, the manually operated arm 200, the detaching unit 120, the cleaning unit 130 and the attaching unit 140 are vertically disposed and horizontally arranged side by side near and below the opening 101A in the case 101. The case 101 is partially openable/closeable, and the manually operated arm 200, the detaching unit 120, the cleaning unit 130 and the attaching unit 140 can be separately provided in the case 101 and removed from the case 101. In other words, the manually operated arm 200, the detaching unit 120, the cleaning unit 130 and the attaching unit 140 can be separately replaced.

In the maintenance apparatus 100, a ball screw 105 and a shaft 106 are disposed in parallel at an upper portion in the case 101. The ball screw 105 can be rotated by a handle H1 provided at the outside of the case 101 while maintaining airtightness through, e.g., an O-ring or the like. A linear stage 150 is attached to the ball screw 105 and the shaft 106. An adaptor detaching unit 160 is detachably attached to the linear stage 150. In an initial state of the maintenance operation, the adaptor detaching unit 160 is attached to the linear stage 150.

Figure 12A:
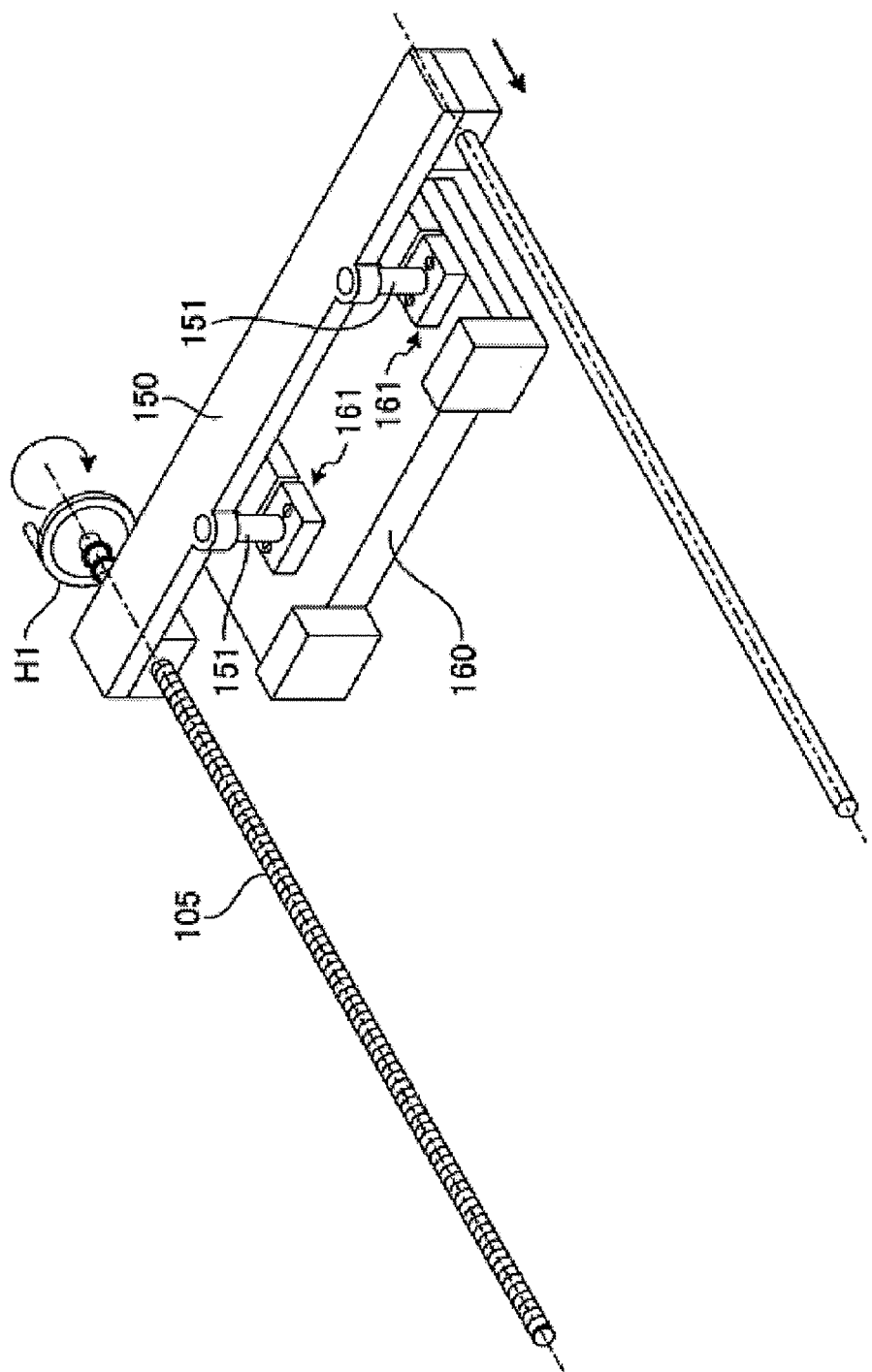
FIG. 12A explains a configuration for attaching/detaching an adaptor detaching unit and a linear stage.

FIG. 12A explains a configuration for attaching/detaching the adaptor detaching unit to/from the linear stage. The linear stage 150 is provided with two rods 151 which are spaced apart from each other at a predetermined interval. Connection units 161 to be connected to the two rods 152 are provided at portions of the adaptor detaching unit 160 which correspond to the two rods 151.

Figure 12B:
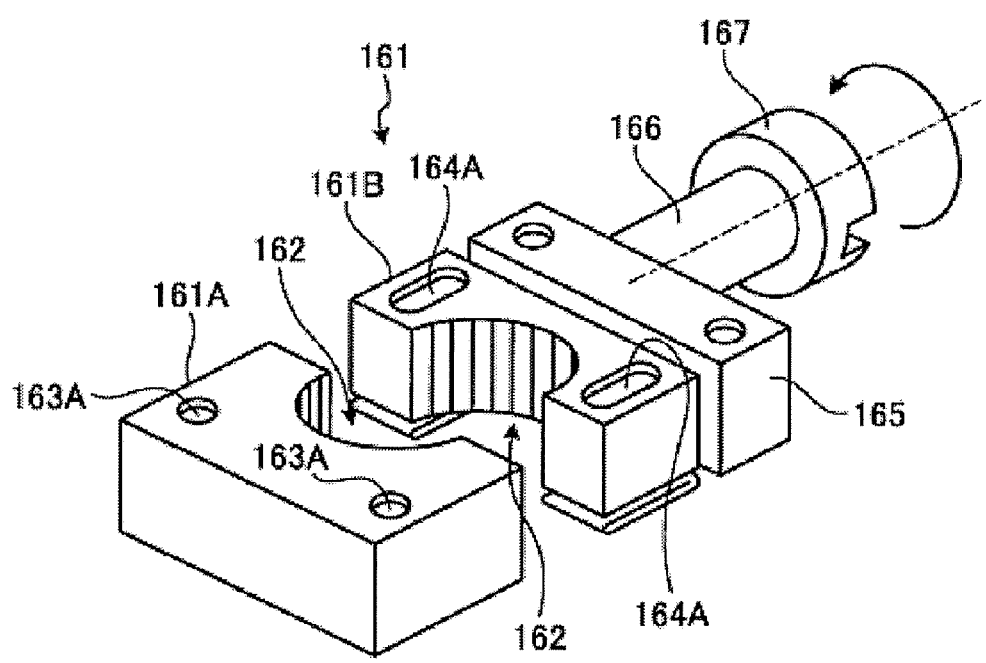
FIG. 12B is a perspective view schematically showing a connection unit.
Figure 12C:
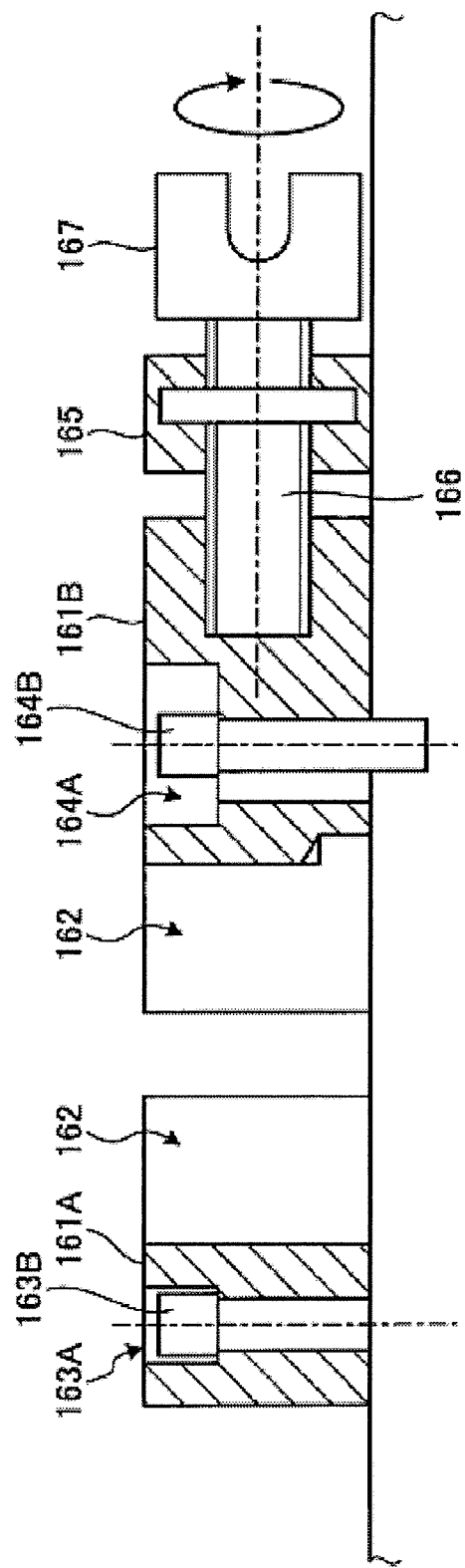
FIG. 12C is a cross sectional view schematically showing the connection unit.

FIG. 12B is a perspective view schematically showing the connection unit 161. FIG. 12C is a cross sectional view schematically showing the connection unit 161. In the connection unit 161, two connection members 161A and 161B, each of which has a recessed portion 162, are arranged with the recessed portions 162 facing each other. The recessed portions 162 of the connection members 161A and 161B are slightly smaller than a radius of the rod 151. The connection member 161A has screw holes 163A and is fixed to the adaptor detaching unit 160 by screws 163B. The connection member 161B has screw holes 164A and is fixed to the adaptor detaching unit 160 by screws 164B. The screw holes 164A are elongated along the arrangement direction of the connection members 161A and 161B. The connection member 161B is fixed to be movable back and forth along the arrangement direction of the connection members 161A and 161B. The connection unit 161 includes a ball screw 166 rotatably supported by a supporting portion 165. The ball screw 166 has one end engaged with a recessed engaging portion 167 and the other end in contact with the connection member 161B.

In the connection unit 161, the gap between the connection member 161A and the connection member 161B can be changed by rotating the recessed engaging portion 167 to bias the connection member 161B through the ball screw 166. The connection unit 161 is connected to the rod 151 by providing the rod 151 in the recessed portions 162 of the connection members 161A and 161B and clamping the rod 151 with the connection members 161A and 161B by narrowing the gap between the connection members 161A and 161B by rotating the recessed engaging portion 167. It is preferable to set a diameter of the rod 151 to be slightly greater at a lower portion than at a portion in contact with the connection members 161A and 161B in order to prevent the connection unit 161 from being removed from the rod 151.

Referring back to FIGS. 11A and 11B, a hole is formed in a portion of the linear stage 150 to correspond to the ball screw 105. The linear stage 150 and the adaptor detaching unit 160 are moved along the ball screw 105 and the shaft 106 by the rotation of the ball screw 105. The adaptor detaching unit 160 is provided with the detachment mechanism 170.

When detaching the adaptor 96, the operator rotates the handle H1 so that the linear stage 150 and the adaptor detaching unit 160 is moved to the adaptor 96 as indicated by broken lines in FIGS. 11A and 11B. Then, the operator rotates the handles H2L and H2R so that the adaptor 96 can be detached from the processing chamber 30 by the detachment mechanism 170.

Figure 13A:
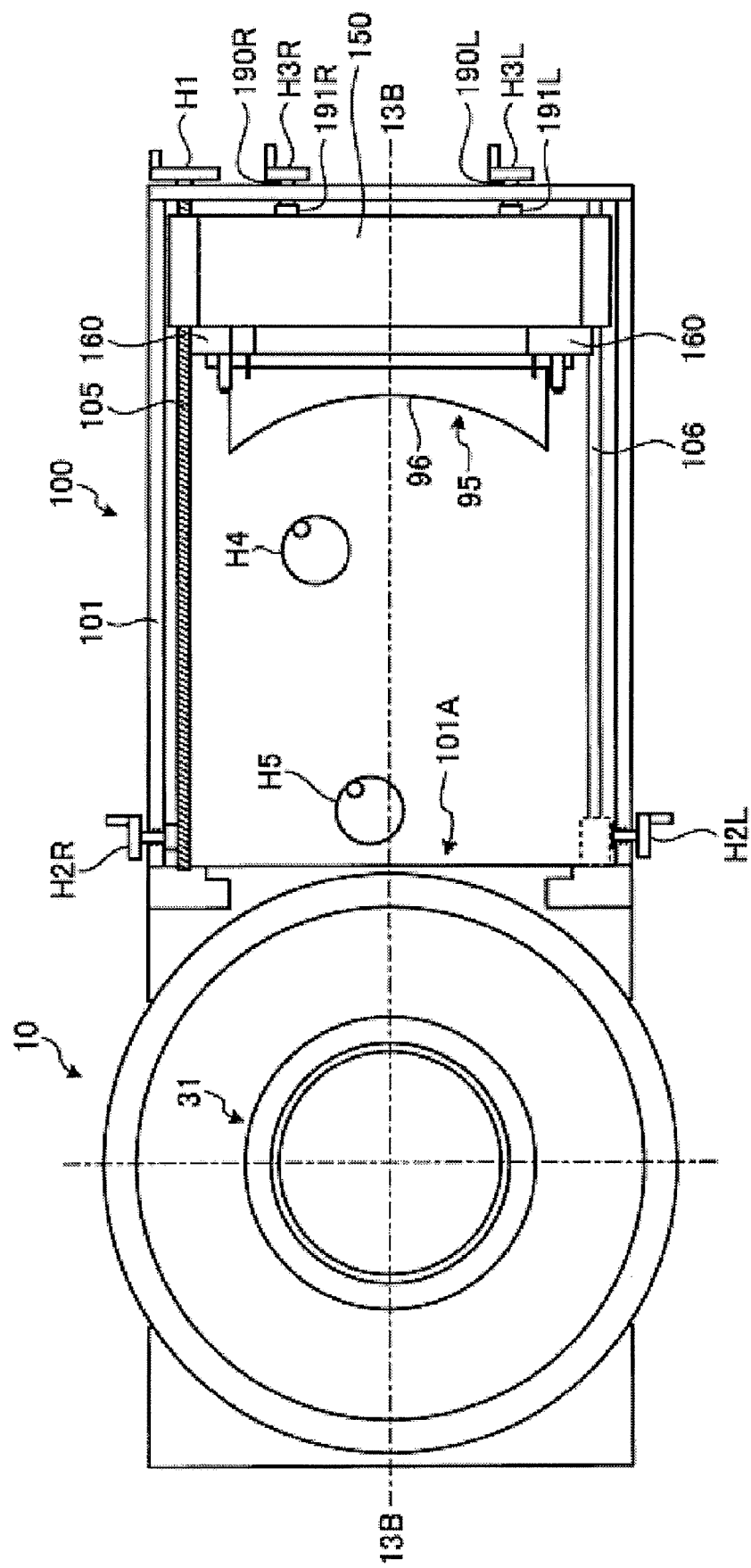
FIG. 13A is a top view schematically showing the maintenance apparatus according to the second embodiment.

After the adaptor 96 is detached, the operator rotates the handle H1 in a reverse direction to the rotation direction in the detaching operation so that the linear stage 150 and the adaptor detaching unit 160 is moved to the original positions. FIGS. 13A and 13B show a state in which the adaptor 96 is detached. FIG. 13A is a top view schematically showing a maintenance apparatus according to the second embodiment. FIG. 13B is a cross sectional view schematically showing the maintenance apparatus according to the second embodiment. FIG. 13B is a cross sectional view seen from a bottom side of FIG. 13A which is taken along the dashed line 13B-13B in FIG. 13A. The detached adaptor 96 is moved to the right side while being held by the adaptor detaching unit 160.

Handles H3L and H3R for attaching/detaching the adaptor detaching unit 160 to/from the linear stage 150 are provided at a side surface of the case 101 which is opposite to the side where the opening 101A is formed. The handle H3L is coaxially connected to a projecting engaging portion 191L through a rotation shaft 190L. The handle H3R is connected to a projected engaging portion 191R through a rotation shaft 190R. The rotation shafts 190L and 190R can be rotated while maintaining airtightness by an O-ring or the like. The projecting engaging portion 191L is rotated by rotating the handle H3L. The projecting engaging portion 191R is rotated by rotating the handle H4R. When the linear stage 150 is located at the right end, the handle H3L, the rotation shaft 190L and the projecting engaging portion 191L are engaged with the recessed engaging portion 167 of the connection unit 161 of the adaptor detaching unit 160 at an upper portion in FIG. 13A. When the linear stage 150 is located at the right end, the handle H3R, the rotation shaft 190R and the projecting engaging portion 191R are engaged with the recessed engaging portion 167 of the connection unit 161 of the adaptor detaching unit 160 at a lower portion in FIG. 13A.

When the linear stage 150 is located at the right end, the projecting engaging portions 191L and 191R are engaged with the recessed engaging portion 167. Hence, the connection unit 161 can be manipulated by rotating the handles H3L and H3R, and the adaptor detaching unit 160 can be detached from the linear stage 150.

Figure 14:
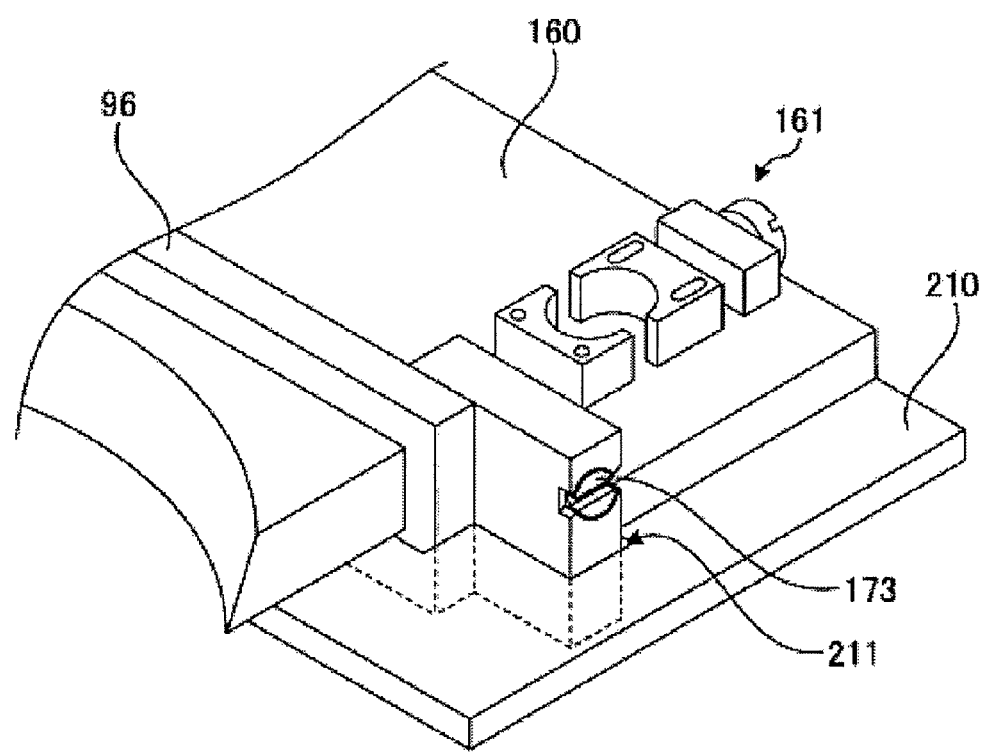
FIG. 14 is a perspective view schematically showing an adaptor support.

An adaptor support 210 is provided at a right bottom portion of the maintenance apparatus 100. FIG. 14 is a perspective view schematically showing the adaptor support 210. The adaptor support 210 is formed in a flat plate shape and has a recess 211 formed to correspond to a protrusion on the bottom surface of the adaptor detaching unit 160 and the adaptor 96 so that adaptor 96 and the adaptor detaching unit 160 can be horizontally supported. The recess 211 may be formed through the adaptor support 210. In the example shown in FIG. 14, the recess 211 penetrates through the adaptor support 210.

The adaptor support 210 can be vertically moved along a rail 212 vertically formed on an inner surface of the case 101 by manipulating a handle (not shown). The operator manipulates the handle (not shown) so that the adaptor support 210 can be lifted to support the adaptor 96 and the adaptor detaching unit 160. Then, the operator rotates the handles H3L and H3R so that the adaptor detaching unit 160 can be detached from the linear stage 150. Then, the operator manipulates the handle (not shown) so that the adaptor support 210 can be lowered and the adaptor 96 and the adaptor detaching unit 160 can be moved to the bottom portion of the case 101.

In the maintenance apparatus 100 according to the second embodiment, the manually operated arm 200 is shared by the detaching unit 120, the attaching unit 140 and the cleaning unit 130. In the maintenance apparatus 100 according to the second embodiment, the manually operated arm 200 is firstly attached to the linear stage 150 in the case of using the detaching unit 120, the attaching unit 140 and the cleaning unit 130.

Figure 15A:
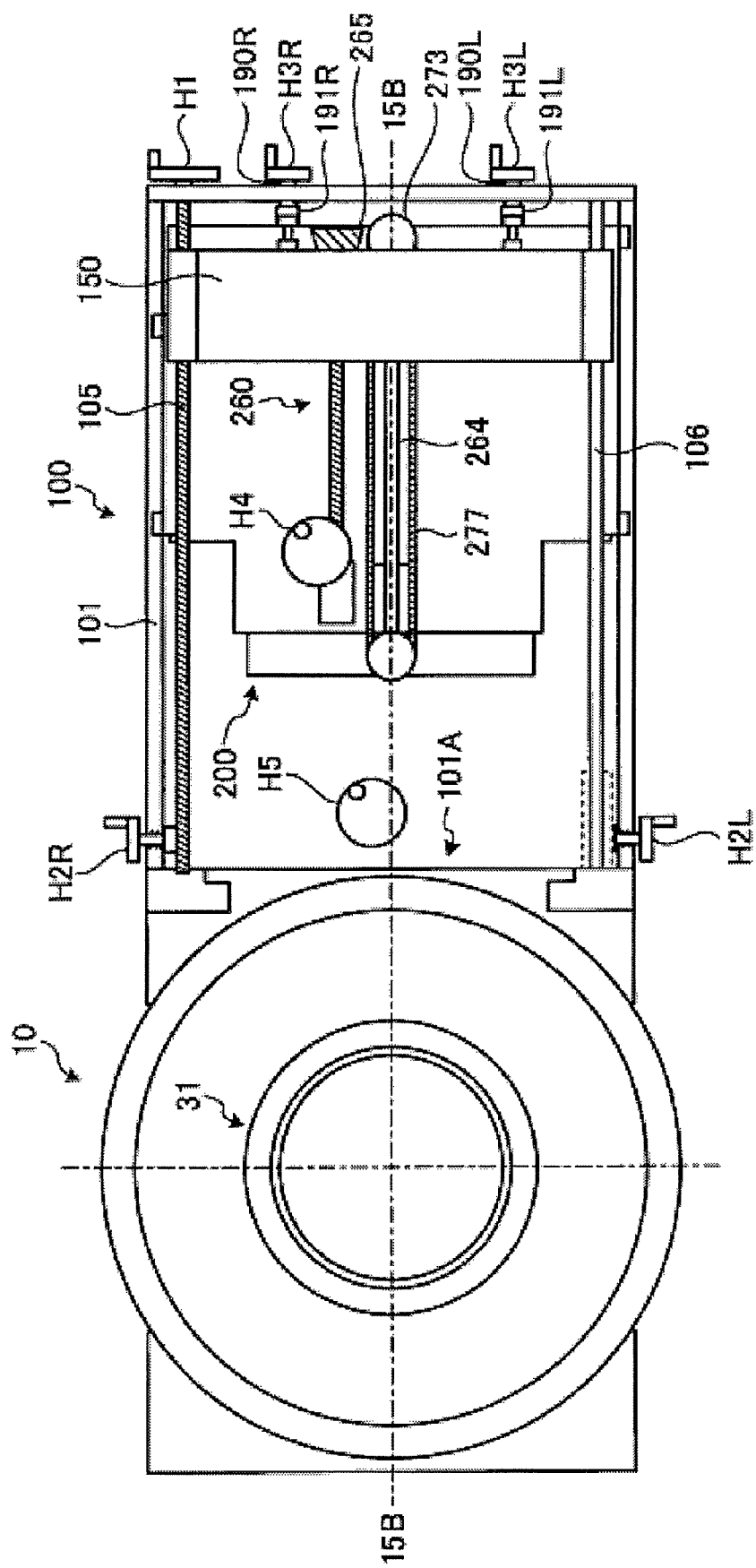
FIG. 15A is a top view schematically showing the maintenance apparatus according to the second embodiment.
Figure 15B:
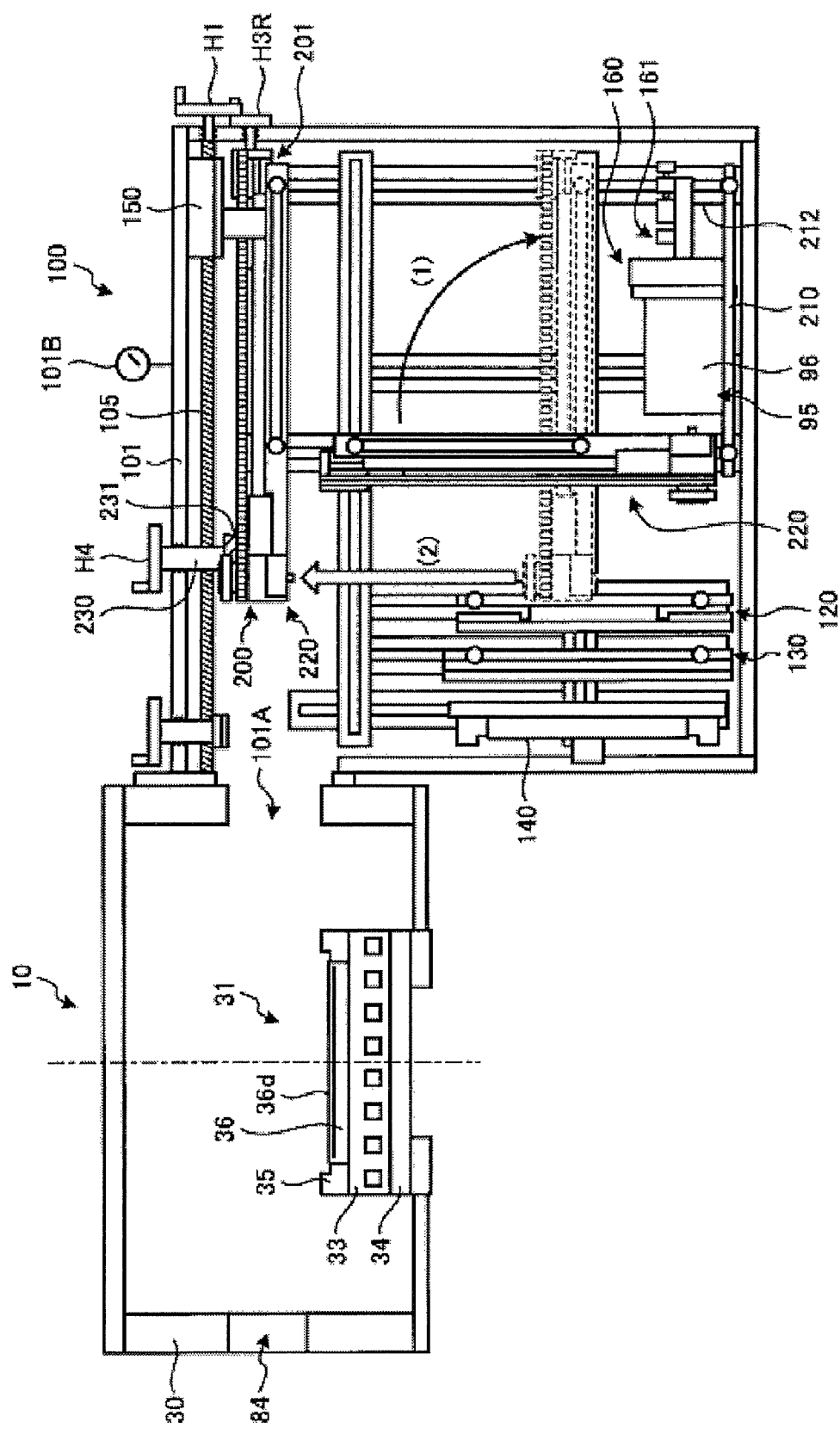
FIG. 15B is a cross sectional view schematically showing the maintenance apparatus according to the second embodiment.

Next, the operation of attaching the manually operated arm 200 to the linear stage 150 will be described. FIGS. 15A and 15B illustrate the operation of attaching the manually operated arm 200 to the linear stage 150. FIG. 15A is a top view schematically showing the maintenance apparatus according to the second embodiment. FIG. 15B is a cross sectional view schematically showing the maintenance apparatus according to the second embodiment. FIG. 15B is a cross sectional view seen from a bottom side of FIG. 15A which is taken along a dashed line 15B-15B in FIG. 15A.

The manually operated arm 200 disposed vertically is rotated to be disposed horizontally by a transfer mechanism, (not shown) (see (1) in FIG. 15B) and transferred to a position below the linear stage 150 (see (2) in FIG. 15B). The manually operated arm 200 is provided with a connection unit 201 that is the same as the connection unit 161 of the adaptor detaching unit 160. The projecting engaging portions 191L and 191R are engaged with the connection unit 201 provided at the manually operated arm 200. The operator rotates the handles H3L and H3R to attach the manually operated arm 200 to the linear stage 150.

Figure 16A:
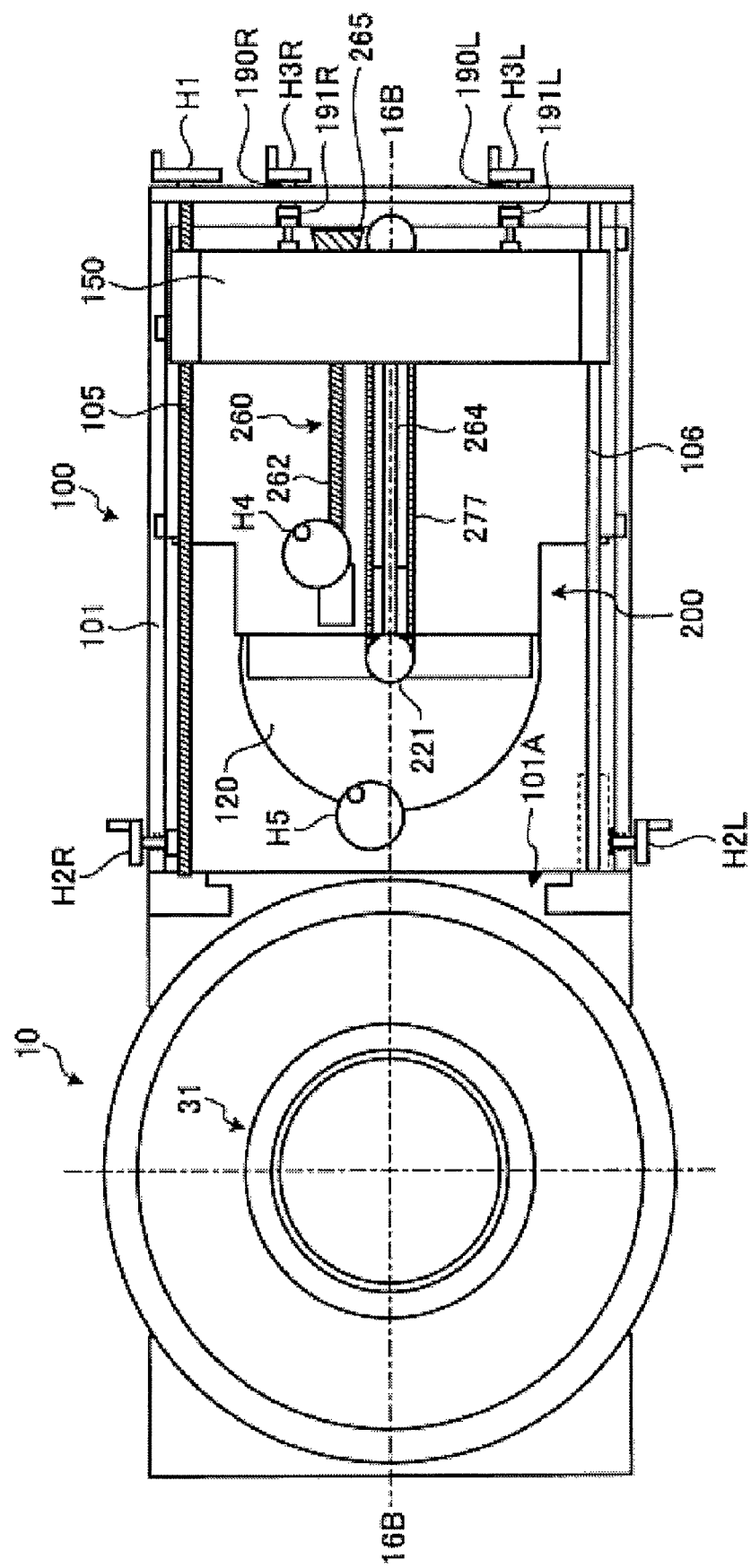
FIG. 16A is a top view schematically showing the maintenance apparatus according to the second embodiment.
Figure 16B:
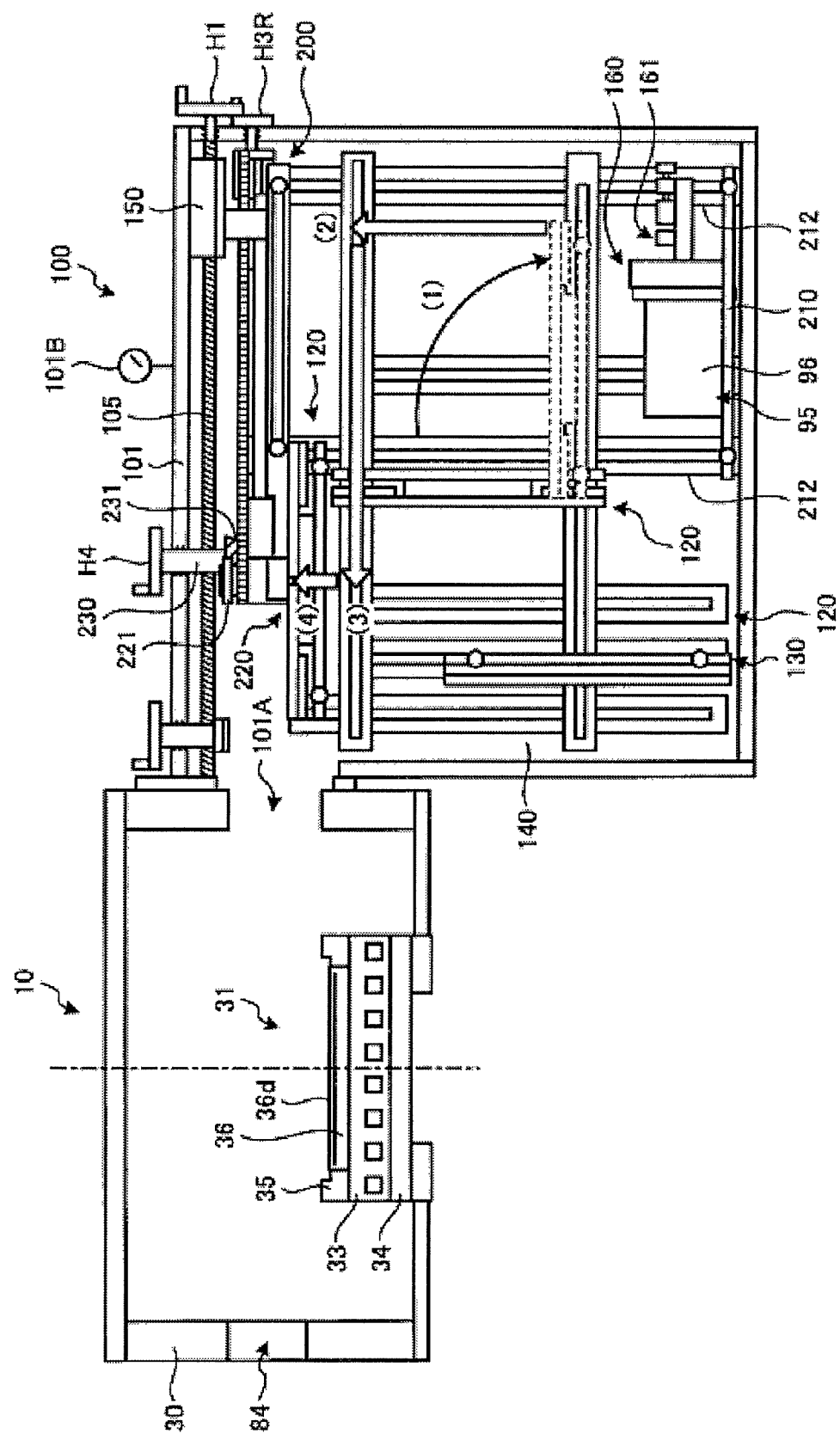
FIG. 16B is a cross sectional view schematically showing the maintenance apparatus according to the second embodiment.

Next, the operation of detaching the focus ring 35 will be described. When detaching the focus ring 35, the detaching unit 120 is attached to the manually operated arm 200. FIGS. 16A and 16B show the operation of attaching the detaching unit 120 to the manually operated arm 200. FIG. 16A is a top view schematically showing the maintenance apparatus according to the second embodiment. FIG. 16B is a cross sectional view schematically showing the maintenance apparatus according to the second embodiment. FIG. 16B is a cross sectional view seen from a bottom side of FIG. 16A which is taken along a dashed line 16B-16B in FIG. 16A.

The detaching unit 120 disposed vertically is rotated to be disposed horizontally by the transfer mechanism (not shown) (see (1) in FIG. 16B) and transferred to a position below the manually operated arm 200 (see (2) to (4) in FIG. 16B). The passive arm 200 has an attaching unit 220 for detachably attaching a unit. For example, the attaching unit 220 has a vertical rotation shaft, and an engaging portion 221 such as a bevel gear or the like is provided at an upper end of the rotation shaft.

A handle H4 is provided on a top surface of the case 101. The handle H4 is coaxially connected to an engaging portion 231, e.g., a bevel gear or the like, through a rotation shaft 230. The rotation shaft 230 can be rotated while maintaining airtightness by an O-ring or the like. The engaging portion 231 is rotated by rotating the handle H4. The handle H4, the rotation shaft 230 and the engaging portion 231 are disposed at a position where the engaging portion 221 and the engaging portion 231 are engaged when the linear stage 150 attached with the manually operated arm 200 is located at the right end.

When the linear stage 150 is located at the right end, the engaging portion 221 is engaged with the engaging portion 231. Accordingly, when the handle H4 is rotated, the rotation shaft of the attaching unit 220 is rotated through the rotation shaft 230, the engaging portion 231 and the engaging portion 221 and, thus, the attaching unit 220 can be manipulated. The attaching unit 220 is provided with a holding mechanism for detachably holding a unit by the rotation of the rotation shaft. The holding mechanism may have any structure as long as it can detachably hold a unit. For example, when a holding portion such as a pin or the like is provided at a center of a disc-shaped unit, the attaching unit 220 holds the holding portion.

Figure 17A:
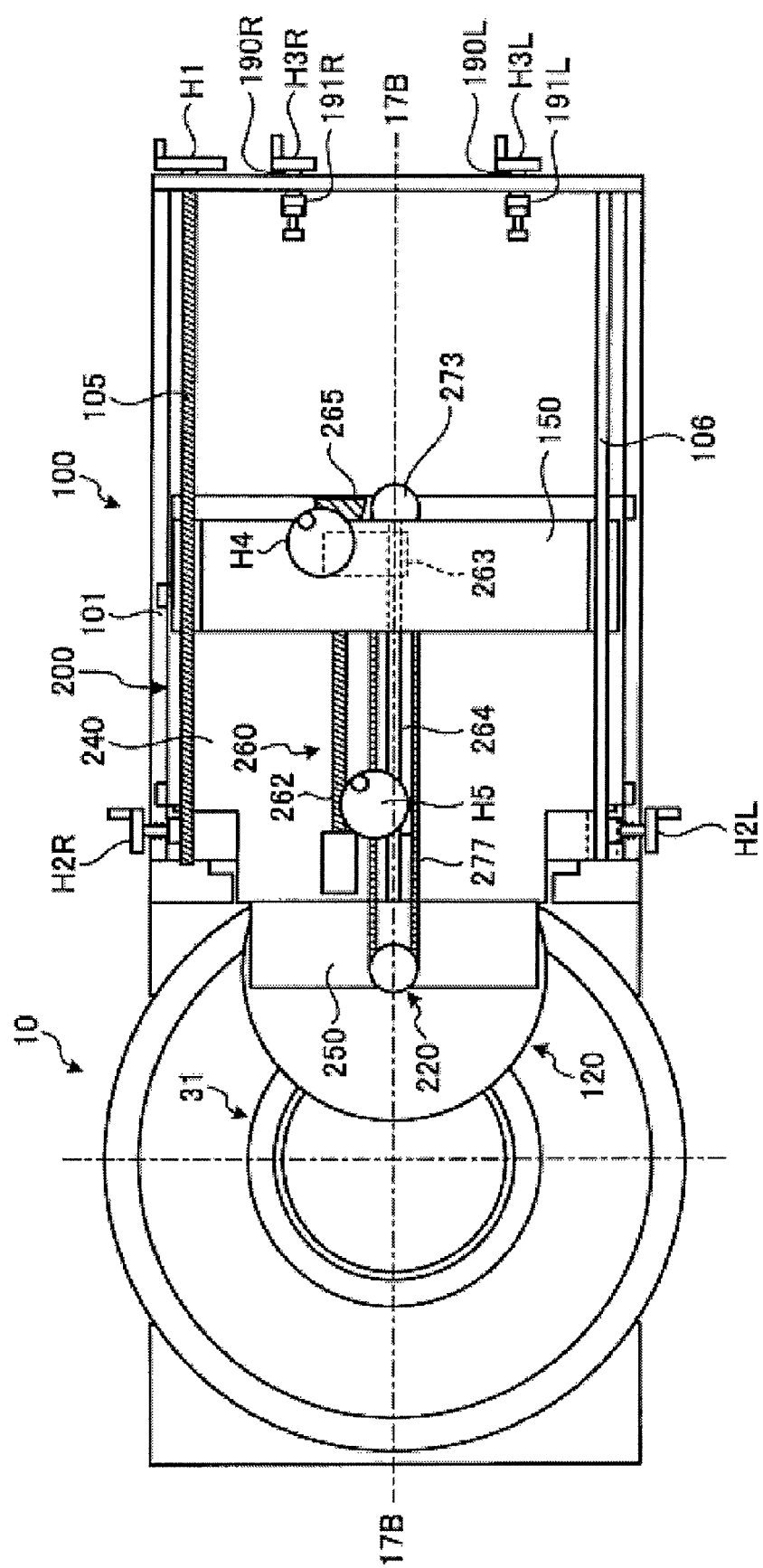
FIG. 17A is a top view schematically showing the maintenance apparatus according to the second embodiment.
Figure 17B:
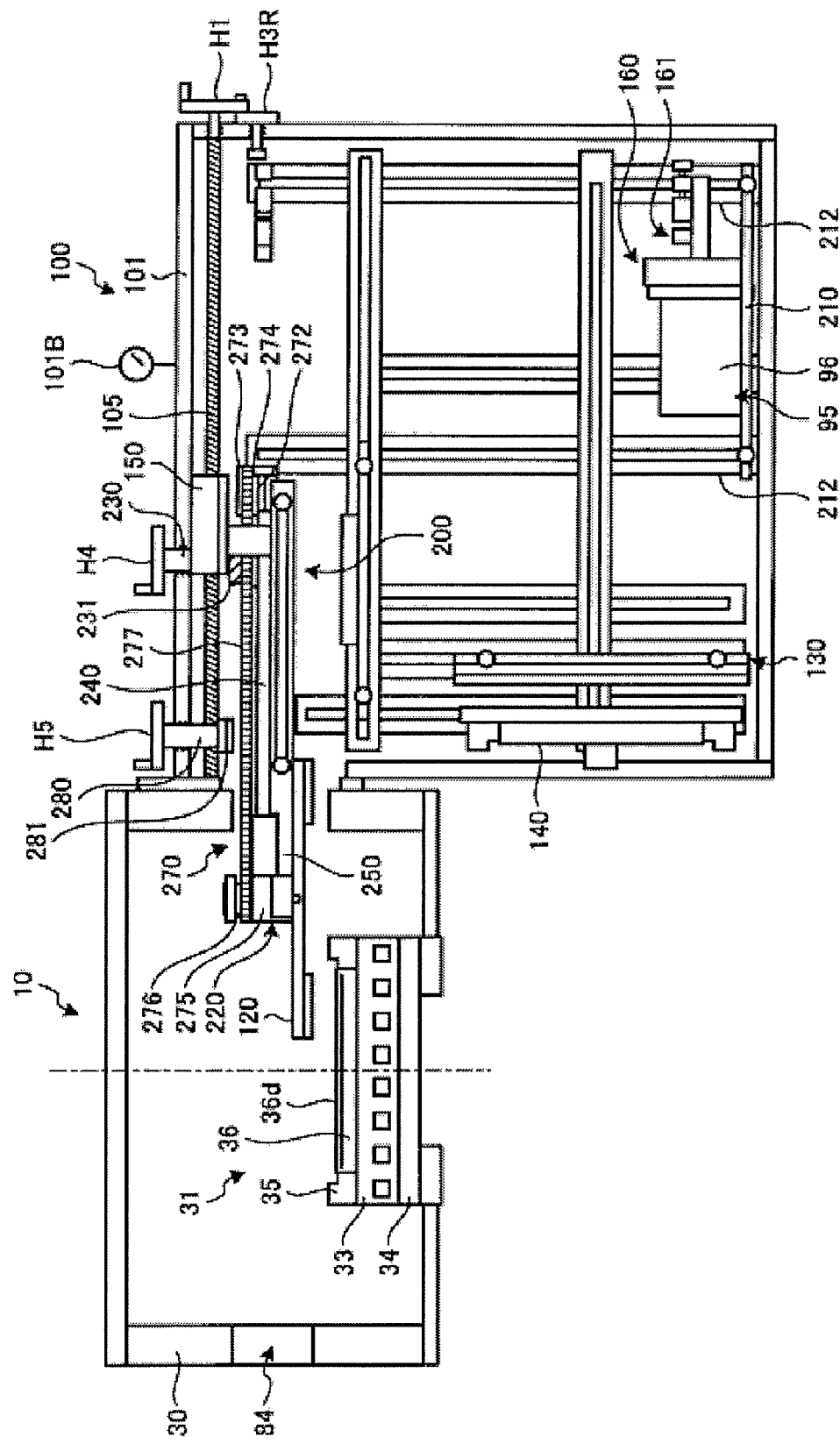
FIG. 17B is a cross sectional view schematically showing the maintenance apparatus according to the second embodiment.

The operator rotates the handle H4 to attach the detaching unit 120 to the manually operated arm 200. Then, the operator rotates the handle H1 so that the linear stage 150 and the manually operated arm 200 can be moved toward the adaptor 96. FIGS. 17A and 17B show a state in which the linear stage 150 and the manually operated arm 200 are moved to the left end toward the adaptor 96. FIG. 17A is a top view schematically showing the maintenance apparatus according to the second embodiment. FIG. 17B is a cross sectional view schematically showing the maintenance apparatus according to the second embodiment. Further, FIG. 17B is a cross sectional view seen from a bottom side of FIG. 17A which is taken along a dashed line 17B-17B in FIG. 17A.

The manually operated arm 200 has a flat plate-shaped base portion 240, a head portion 250 provided with the attaching unit 220, and an extensible/contractible mechanism 260 for extending/contracting the head portion 250 to/from the base portion 240. For example, the manually operated arm 200 has, as the extensible/contractible mechanism 260, a ball screw 262 rotatably supported by the base portion 240. An end portion of the ball screw 262 is coaxially connected to an engaging portion 265, e.g., a bevel gear or the like. The engaging portion 265 is engaged with the engaging portion 231 when the linear stage 150 and the manually operated arm 200 are located at the left end at the side of the adaptor 96.

The engaging portion 265 is engaged with the engaging portion 231 when the linear stage 150 and the manually operated arm 200 are located at the left end at the side of the adaptor 96. Accordingly, when the handle H4 is rotated, the ball screw 262 is rotated. To the ball screw 262, a supporting member 263 having a groove formed to correspond to the ball screw 262 is attached. The supporting member 263 has a guide hole 264 formed in parallel with the ball screw 262. The supporting member 263 is fixed to the head portion 250 through the guide hole 264. Accordingly, when the ball screw 262 is rotated, the supporting member 263 and the head portion 250 are moved along the ball screw 26. In the manually operated arm 200, when the ball screw 262 is rotated, the head portion 250 is moved toward and away from the base portion 240 by the extensible/contractible mechanism 260.

Figure 18A:
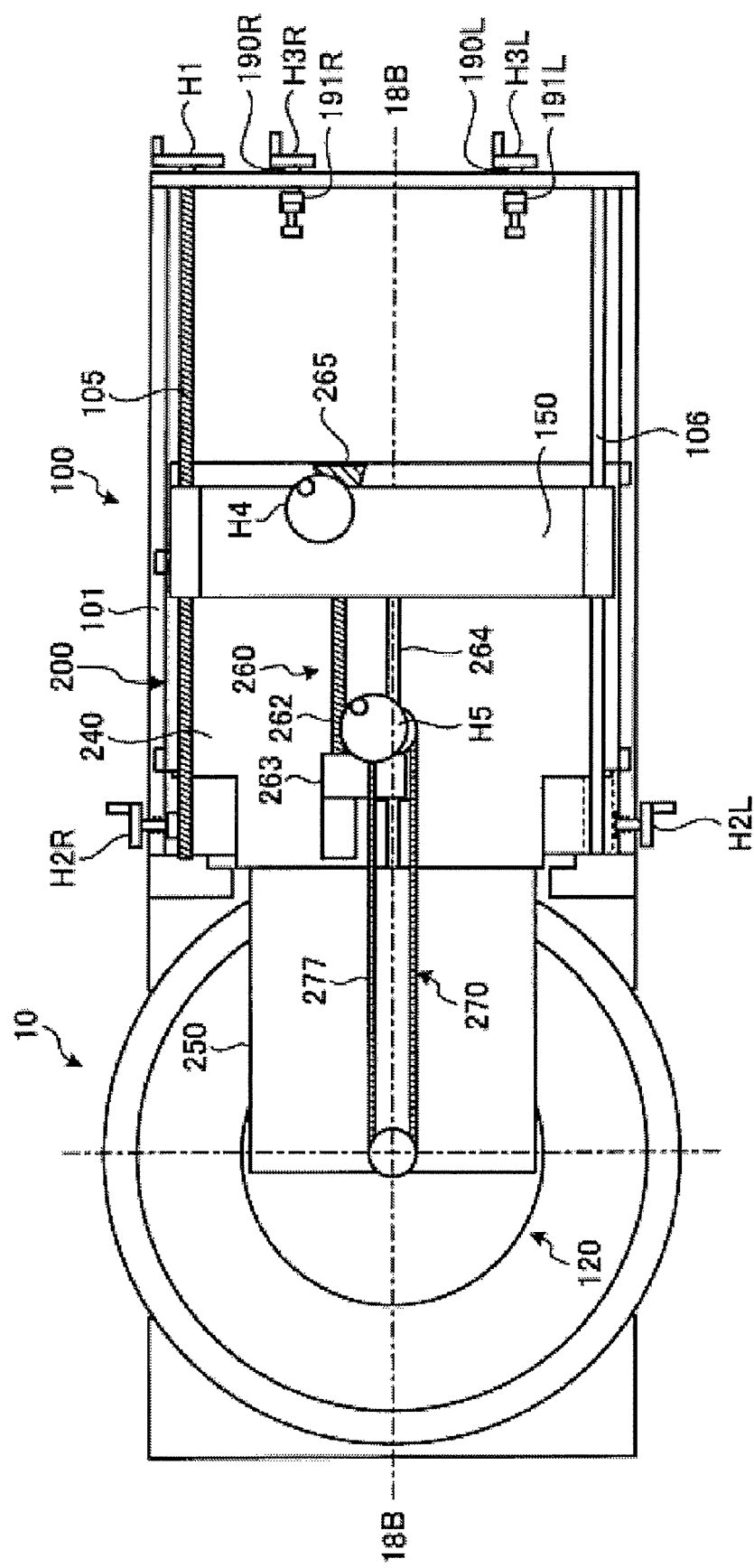
FIG. 18A is a top view schematically showing the maintenance apparatus according to the second embodiment.
Figure 18B:
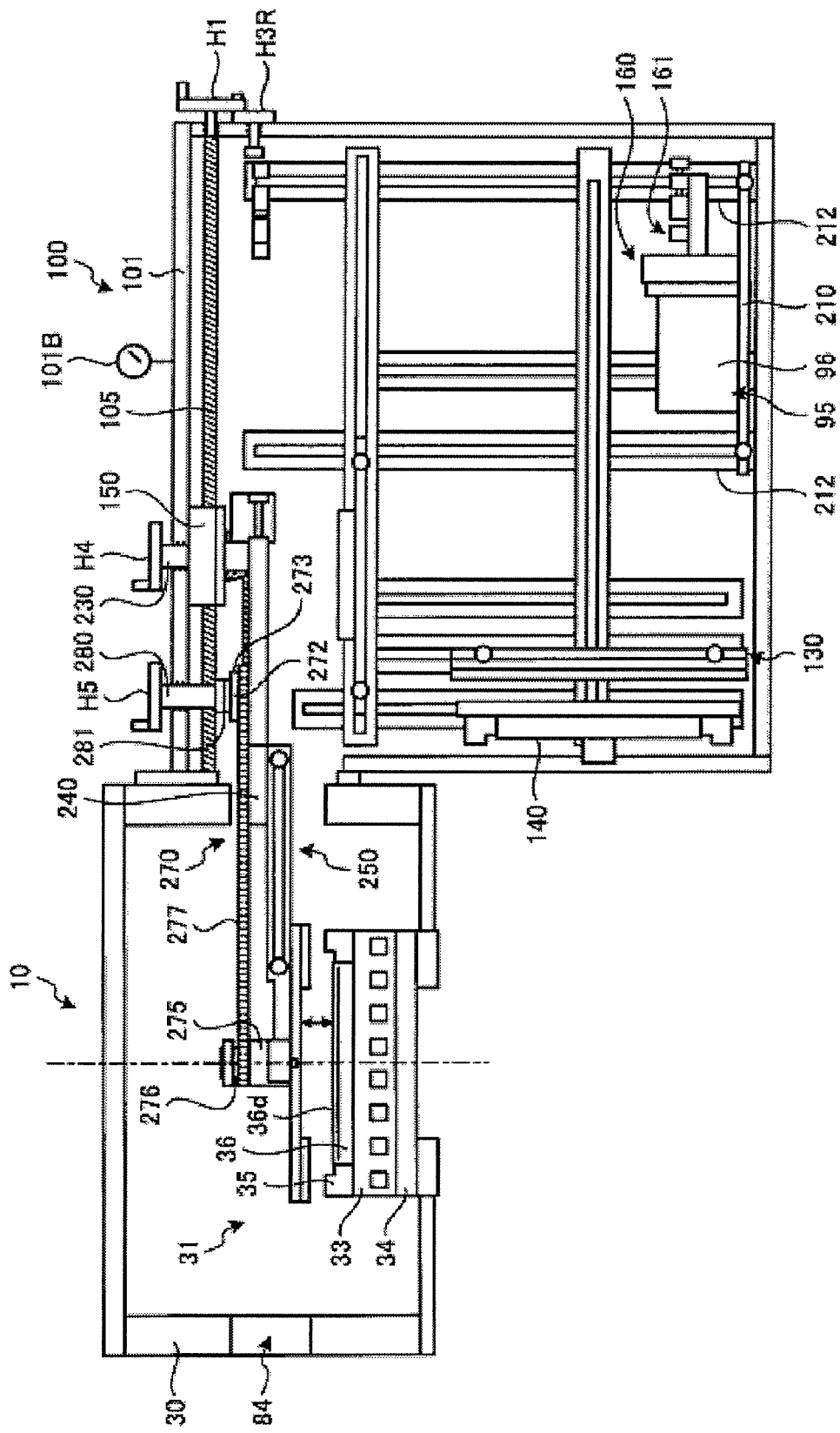
FIG. 18B is a cross sectional view schematically showing the maintenance apparatus according to the second embodiment.

In the case of detaching the focus ring 35, the operator rotates the handle H4 to extend the head portion 250 from the base portion 240. FIGS. 18A and 18B show a state in which the head portion 250 is extended from the base portion 240. FIG. 18A is a top view schematically showing the maintenance apparatus according to the second embodiment. FIG. 18B is a cross sectional view schematically showing the maintenance apparatus according to the second embodiment. FIG. 18B is a cross sectional view seen from a bottom side of FIG. 18A which is taken along a dashed line A-A in FIG. 18A.

The manually operated arm 200 has an elevation mechanism 270 for vertically moving the head portion 250.

The manually operated arm 200 has, e.g., a rotatably supported rotation shaft 272 extending vertically. An engaging portion 273, e.g., a bevel gear or the like, is provided at an upper end portion of the rotation shaft 272. A pulley 274 is provided at the rotation shaft 272 and rotated by the rotation of the rotation shaft 272. The head portion 250 is provided with a cylindrical rotation shaft 275 extending vertically and coaxially around the rotation shaft of the attaching unit 220. A pulley 276 is provided at the rotation shaft 275. A belt 277 is wound around the pulleys 274 and 276. A driving force is transferred by the belt 277. The pulley 276 is rotated by the rotation of the pulley 274. The rotation of the pulley 276 leads to the rotation of the rotation shaft 275 and, thus, the base portion 240 is vertically moved.

A handle H5 is provided on a top surface of the case 101. The handle H5 is coaxially connected to an engaging portion 281, e.g., a bevel gear or the like, through a rotation shaft 280. The rotation shaft 280 can be rotated while maintaining airtightness by an O-ring or the like. The engaging portion 281 is rotated by rotating the handle H5. The handle H5, the rotation shaft 280 and the engaging portion 281 are disposed at a position where the engaging portion 273 and the engaging portion 281 are engaged when the head portion 250 is extended from the base portion 240 to a position above the mounting table 31.

When the head portion 250 is extended from the base portion 240 to the position above the mounting table 31, the engaging portion 273 is engaged with the engaging portion 281. Accordingly, when the handle H5 is rotated, the driving force is transferred to the head portion 250 through the rotation shaft 280, the engaging portion 281, the engaging portion 273, the pulley 274, the belt 277, the pulley 276 and the rotation shaft 275 and, thus, the base portion 240 is vertically moved.

Figure 19:
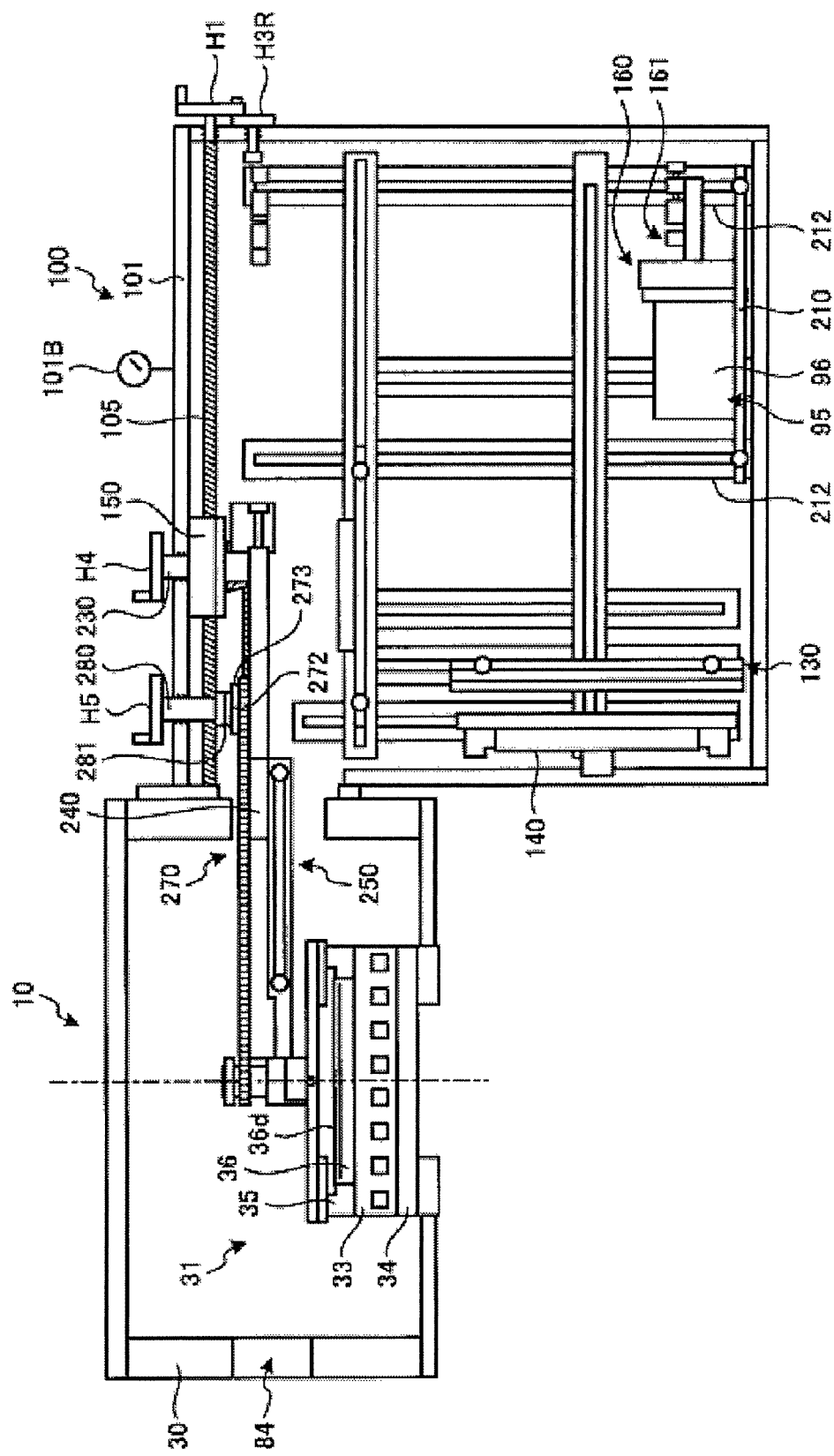
FIGS. 19 to 22 are cross sectional views schematically showing the maintenance apparatus according to the second embodiment.

In the case of detaching the focus ring 35, the operator rotates the handle H5 to lower the base portion 240 so that the detaching unit 120 comes in contact with the mounting table 31. FIG. 19 shows a state in which the detaching unit 120 is brought into contact with the mounting table 31. FIG. 19 is a cross sectional view schematically showing the maintenance apparatus according to the second embodiment. The focus ring 35 mounted on the mounting table is adhered to the detaching unit 120 by the adhesive layer 121. Then, the operator manipulates the handles H1, H4 and H5, in a reverse sequence to that in the case of moving the detaching unit 120 to the position above the mounting table 31, to move the manually operated arm 200 and the detaching unit 120 to the position shown in (4) in FIG. 16B. Then, the operator manipulates the handle H4 to detach the detaching unit 120 from the manually operated arm 200. The detaching unit 120 detached from the manually operated arm 200 is transferred to a side surface of the case 101, which is opposite to the side where the opening 101A is formed, by the transfer mechanism (not shown).

Figure 20:
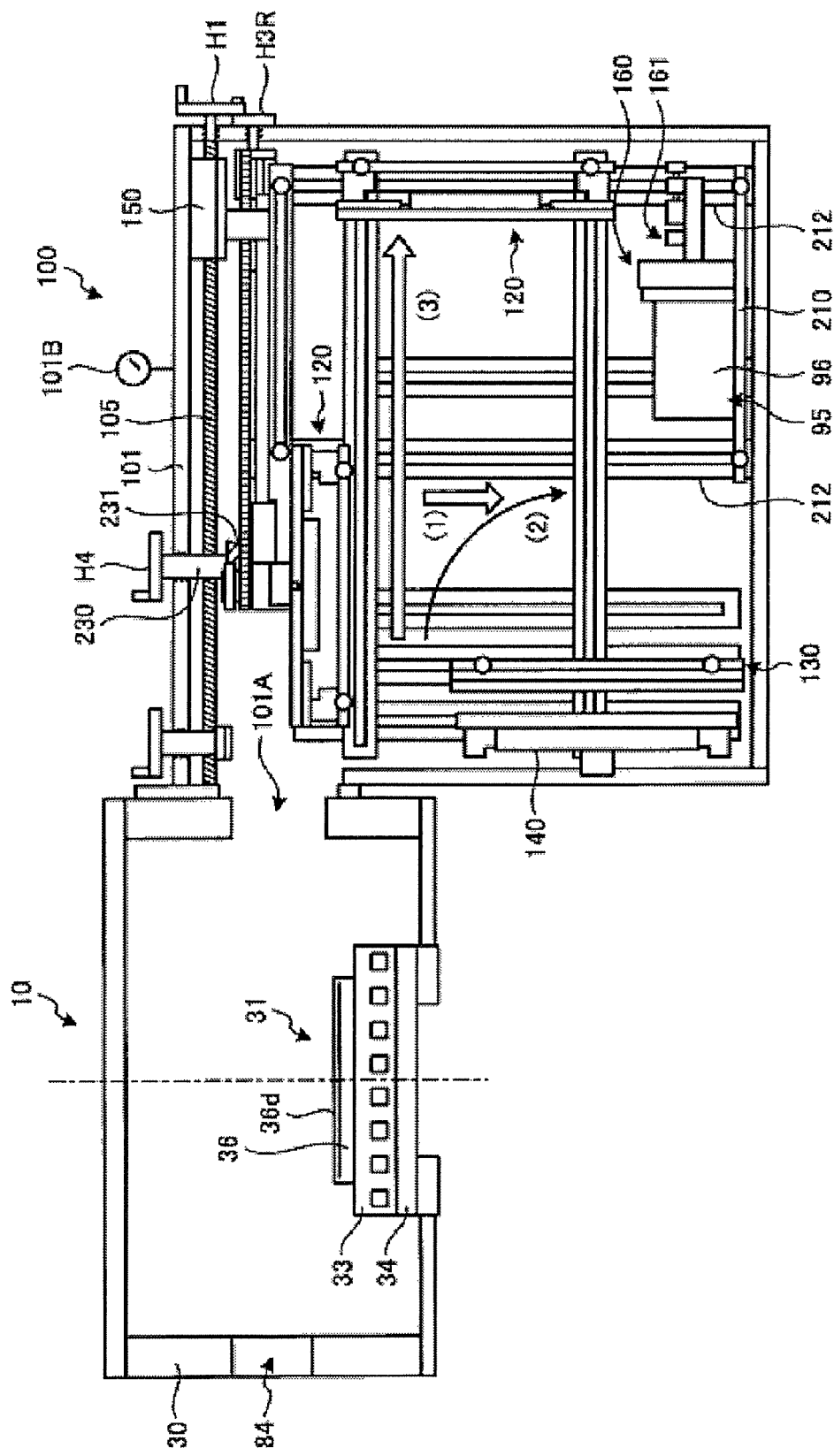

FIG. 20 shows the operation of transferring the detached detaching unit 120. FIG. 20 is a cross sectional view schematically showing the maintenance apparatus according to the second embodiment. For example, the detaching unit 120 detached from the manually operated arm 200 is lowered by the transfer mechanism (not shown) (see (1) in FIG. 20), rotated to be disposed vertically (see (2) in FIG. 20), and transferred as a processed unit to a side surface of the case 101 which is opposite to the side where the opening 101A is formed (see (3) in FIG. 20).

Figure 21:
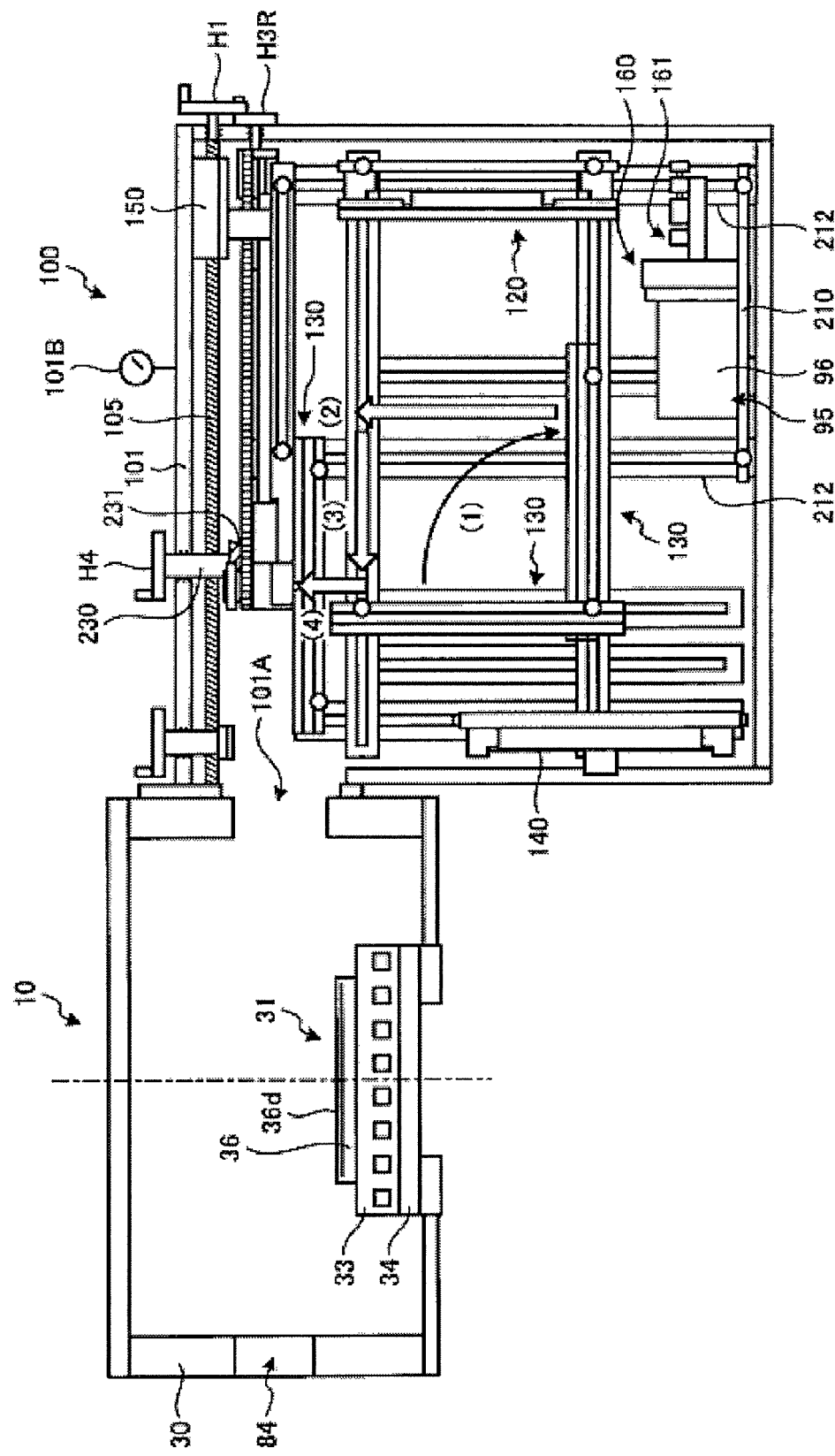

Next, the operation of cleaning the mounting surface 36d of the mounting table 31 will be described. In the case of cleaning the mounting surface 36d of the mounting table 31, the cleaning unit 130 is attached to the manually operated arm 200. FIG. 21 shows the operation of attaching the cleaning unit 130 to the manually operated arm 200. FIG. 21 is a cross sectional view schematically showing the maintenance apparatus according to the second embodiment.

The cleaning unit 130 disposed vertically is rotated to be disposed horizontally by a transfer mechanism (not shown) (see (1) in FIG. 21) and transferred to a position below the manually operated arm 200 (see (2) to (4) in FIG. 21).

The operator rotates the handle H4 to attach the cleaning unit 130 to the manually operated arm 200. Then, as in the case of detaching the focus ring 35, the operator manipulates the hands H1, H4 and H5 so that the cleaning unit 130 is transferred to a position above the mounting table 31 and then lowered and brought into contact with mounting table 31. Then, the operator manipulates the handles H1 and H5 in a reverse sequence to that used in the case of moving the cleaning unit 130 to the position above the mounting table 31 to move the manually operated arm 200 and the cleaning unit 130 to the position indicated as (4) in FIG. 21. Then, the operator manipulates the handle H4 to detach the cleaning unit 130 from the manually operated arm 200. The cleaning unit 130 detached from the manually operated arm 200 is transferred to a side surface of the case 101, which is opposite to the side surface where the opening 101A is formed, by the transfer mechanism (not shown).

Figure 22:
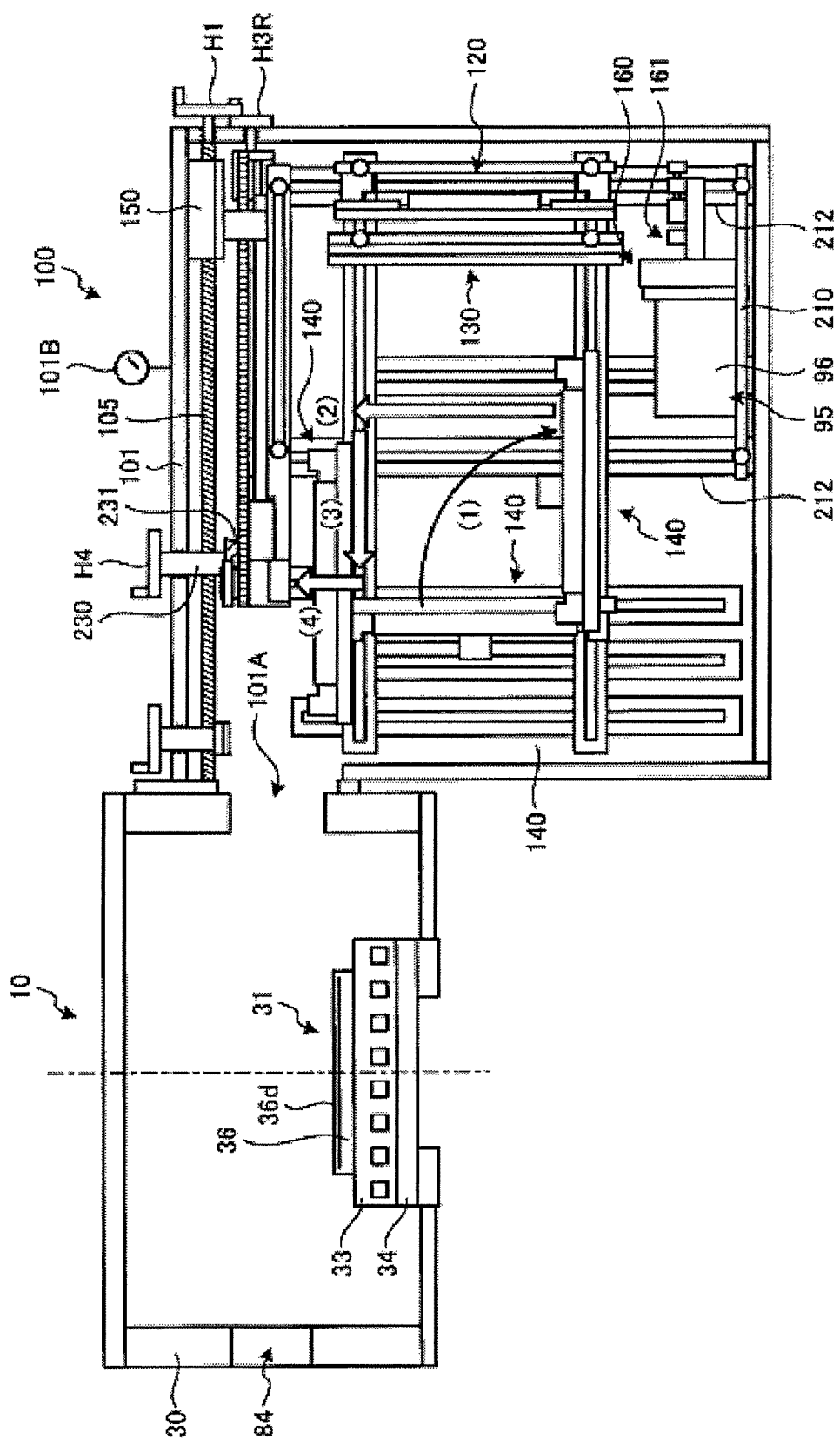

Next, the operation of attaching a new focus ring 35 to the mounting table 31 will be described. In the case of attaching a new focus ring 35 to the mounting table 31, the attaching unit 140 is attached to the manually operated arm 200. FIG. 22 shows the operation of attaching the attaching unit 140 to the manually operated arm 200. FIG. 22 is a cross sectional view schematically showing the maintenance apparatus according to the second embodiment. In FIG. 22, the cleaning unit 130 is transferred to a position near the side surface of the case 101 which is opposite to the opening 101A and disposed side by side with the detaching unit 120. Thus, the cleaning unit 130 and the detaching unit 120 are disposed side by side.

The attaching unit 140 disposed vertically is rotated to be disposed horizontally by the transfer mechanism (not shown) (see (1) in FIG. 22) and transferred to a position below the manually operated arm 200 (see (2) to (4) in FIG. 22).

The operator rotates the handle H4 to attach the attaching unit 140 to the manually operated arm 200. Then, as in the case of detaching the focus ring 35, the operator manipulates the handles H1, H4 and H5 so that the attaching unit 140 is transferred to the position above the mounting table 31 and then lowered and brought into contact with the mounting table 31. The attaching unit 140 in contact with the mounting table 31 releases the new focus ring 35. Accordingly, the new focus ring 35 is mounted on the mounting table 31. Then, the operator manipulates the handles H4, H5 in a reverse sequence to that used in the case of moving the attaching unit 140 to the position above the mounting table 31 to move the manually operated arm 200 and the attaching unit 140 to the position indicated as (4) in FIG. 22. Then, the operator manipulates the handle H4 to detach the attaching unit 140 from the manually operated arm 200. The attaching unit 140 detached from the manually operated arm 200 is transferred to a side position in the case 101 which is opposite to the opening 101A by the transfer mechanism (not shown).

In the case of attaching the adaptor 96 to the opening 101A, the operator rotates the handles H3L and H3R to detach the manually operated arm 200 from the linear stage 150. The manually operated arm 200 detached from the linear stage 150 is transferred to a side position in the case 101 near the opening 101A by the transfer mechanism (not shown). The detaching unit 120, the cleaning unit 130 and the attaching unit 140 disposed at the opposite side to of the side surface where the opening 101A is formed are also transferred to a side position in the case 101 near the opening 101A by the transfer mechanism (not shown).

The operator attaches the adaptor 96 to the second gate 95 in a reverse sequence to that used in the case of detaching the adaptor 96. Then, the operator returns a pressure in the case 101 of the maintenance apparatus 100 to an atmospheric pressure.

In the maintenance apparatus 100 of the present embodiment, the focus ring 35 can be replaced without using the transfer system for transferring a wafer W, as in the case of the maintenance apparatus 100 of the first embodiment.

Third Embodiment

Hereinafter, a third embodiment will be described. A substrate processing system 1 and a plasma etching apparatus according to the third embodiment have the same configurations as those of the substrate processing system 1 and the plasma etching apparatus 10 according to the first embodiment shown in FIGS. 1 and 2. Therefore, redundant description thereof will be omitted.

Figure 23:
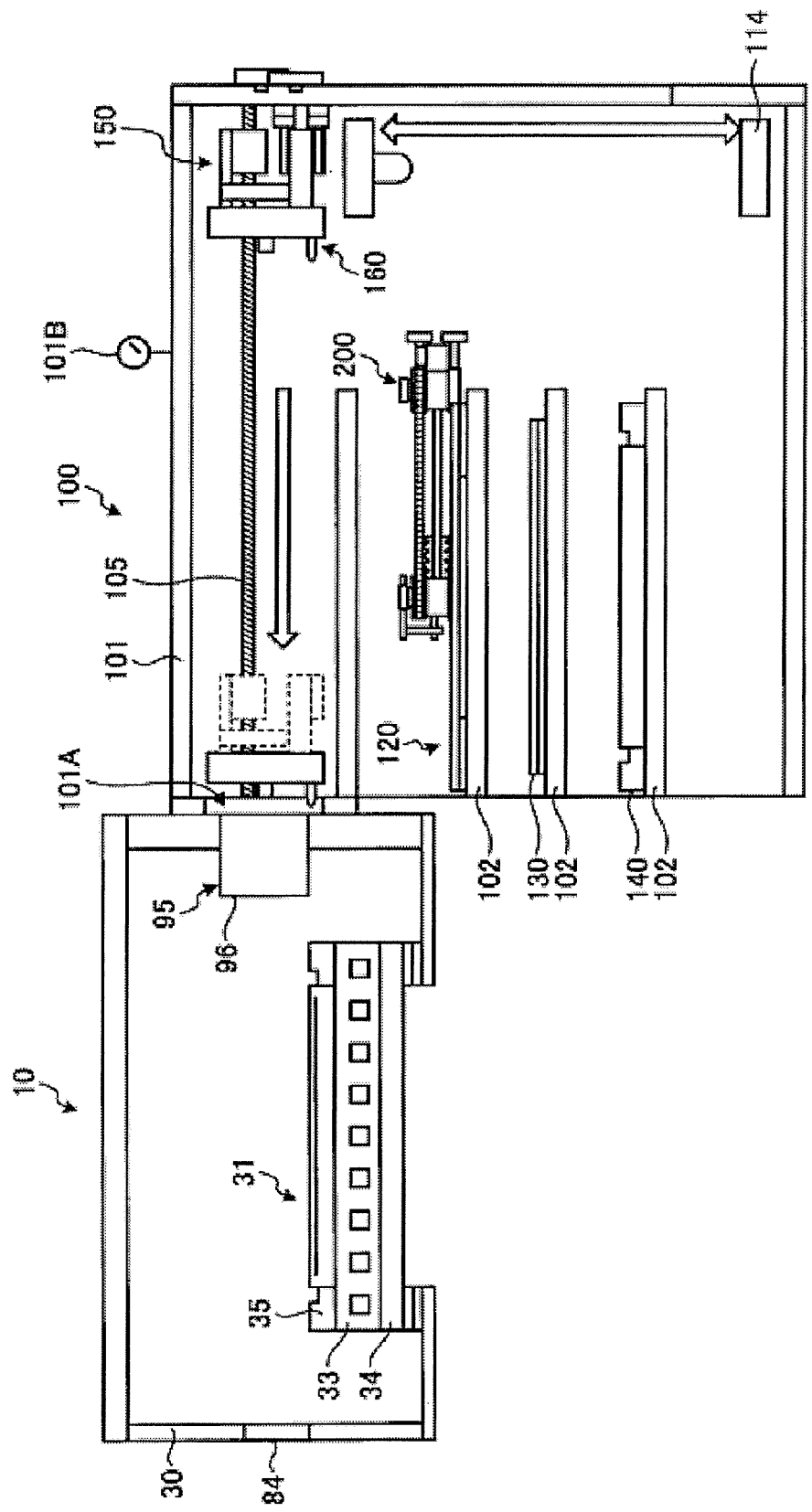
FIGS. 23 and 24 are cross sectional views schematically showing a maintenance apparatus according to a third embodiment.

The configuration of the maintenance apparatus 100 according to the third embodiment will be described. FIG. 23 is a cross sectional view schematically showing the maintenance apparatus according to the third embodiment. Like or corresponding parts will be indicated by like reference numerals used in the maintenance apparatuses 100 according to the first and the second embodiment.

The maintenance apparatus 100 includes a case 101 with an opening 101A having a size corresponding to that of the second gate 95 of the plasma etching apparatus 10. An O-ring or the like is provided at a portion around the opening 101A of the case 101 which is brought into contact with the plasma etching apparatus 10. The maintenance apparatus 100 is attached to the second gate 95 by screw fixing or the like while maintaining airtightness.

A vacuum gauge 101B capable of measuring a degree of vacuum is provided in the case 101. When a consumed part is replaced, an atmosphere in the case 101 of the maintenance apparatus 100 becomes substantially the same as the vacuum atmosphere in the processing chamber 30.

In the maintenance apparatus 100, the case 101 has therein a maintenance mechanism for performing at least one of an operation of detaching the consumed part in the processing chamber 30, an operation of attaching a replacement part in the processing chamber 30 and an operation of cleaning the processing chamber 30. In the maintenance apparatus 100 of the present embodiment, a manually operated arm 200, a detaching unit 120, a cleaning unit 130 and an attaching unit 140 constitute the maintenance mechanism. The manually operated arm 200 is previously attached to the detaching unit 120.

In the case 101, supporting tables 102 are arranged at three height levels at a predetermined interval near the opening 101A. The detaching unit 120 attached with the manually operated arm 200, the cleaning unit 130 and the attaching unit 140 are mounted on the supporting tables 102, respectively. The case 101 is partially openable/closeable, and the detaching unit 120, the cleaning unit 130 and the attaching unit 140 can be separately attached and detached. In other words, the detaching unit 120, the cleaning unit 130 and the attaching unit 140 can be separately replaced.

In the maintenance apparatus 100, a ball screw 105 and a shaft (not shown) are provided in parallel at an upper portion in the case 101. A linear stage 150 is attached to the ball screw 105 and the shaft (not shown). An adaptor detaching unit 160 is attached to the linear stage 150.

In the maintenance apparatus 100, an elevation table 114 is provided in a lower portion at a side in the case 101 which is opposite to the opening 101A.

The maintenance apparatus 100 performs the maintenance of the plasma etching apparatus 10 by attaching the respective units to the linear stage 150 by using the elevation table 114.

For example, in the case of detaching the adaptor 96, the operator rotates the handle H1 to move that the linear stage 150 and the adaptor detaching unit 160 toward the adaptor 96 as indicated by a dashed line in FIG. 23. For example, the adaptor 96 is detached by performing the same operation as that in the second embodiment.

Figure 24:
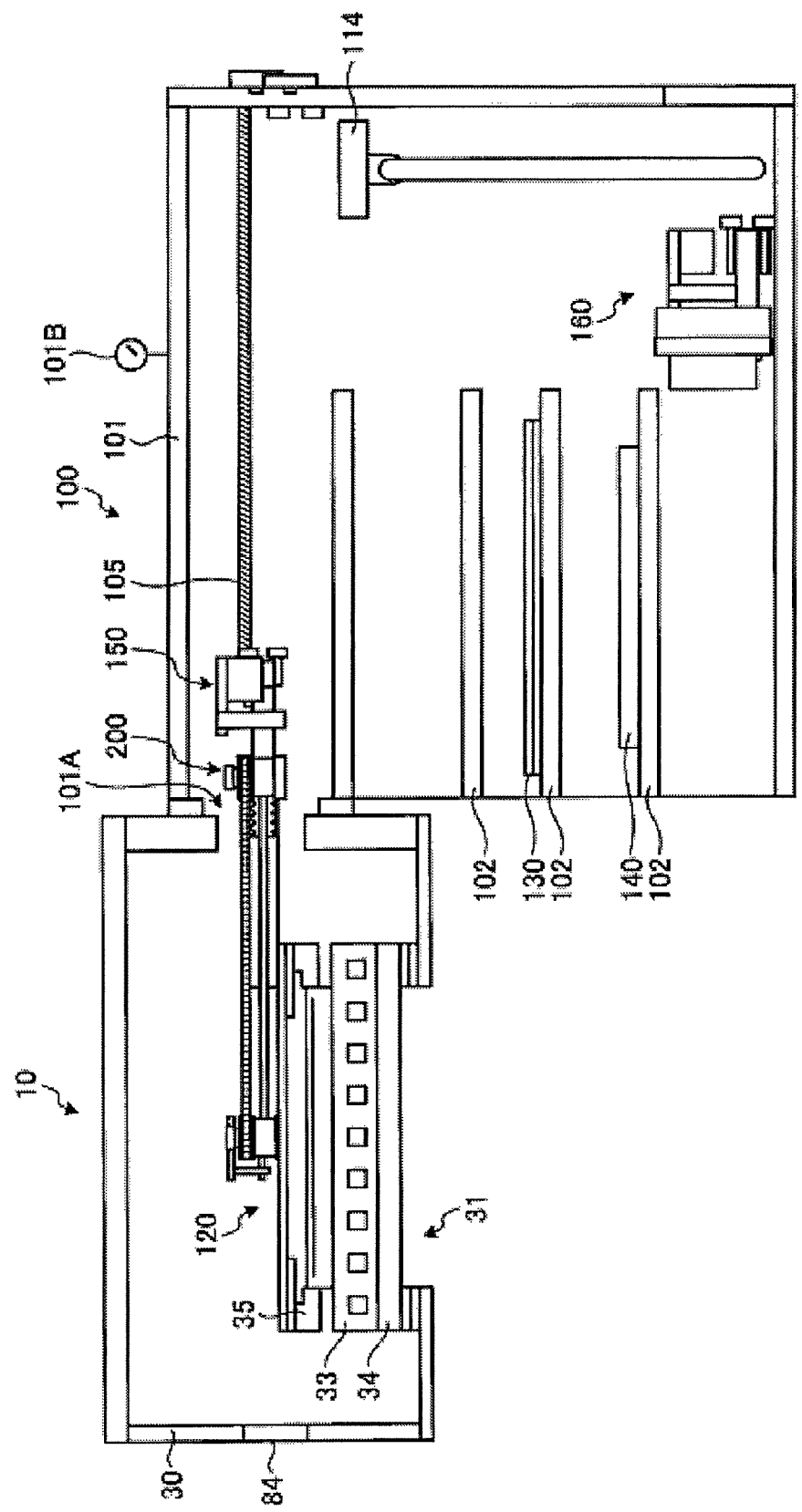

For example, in the case of detaching the focus ring 35, the detaching unit 120 is attached to the linear stage 150 by using the elevation table 114. FIG. 24 shows the operation of detaching the focus ring 35. FIG. 24 is a cross sectional view schematically showing the maintenance apparatus according to the third embodiment. For example, the adaptor 96 is detached as shown in FIG. 24 by performing the same operation as that in the second embodiment.

In the maintenance apparatus 100 according to the third embodiment, the focus ring 35 can be replaced without using the transfer system for transferring a wafer W, as in the case of the maintenance apparatus 100 according to the first and the second embodiment.

While the embodiments of the present disclosure have been described, the technical scope of the present disclosure is not limited to the above-described embodiments. It is obvious to those skilled in the art that various modifications and changes can be made. Any such modifications and changes may be included within the technical scope of the present disclosure as defined by the following claims.

For example, in the first to the third embodiment, the case of replacing the focus ring 34 as the consumed part has been described. However, the consumed part is not limited thereto. The maintenance apparatus 100 may also be used for the maintenance such as cleaning of the processing chamber 30 or the like, other than the replacement of the consumed part.

In the first to the third embodiment, the case of using the maintenance apparatus 100 for maintenance of the plasma etching apparatus 10 has been described. However, the maintenance apparatus 100 may be used for maintenance of any apparatus having a processing chamber in a vacuum state without being limited thereto.

Figure 25:
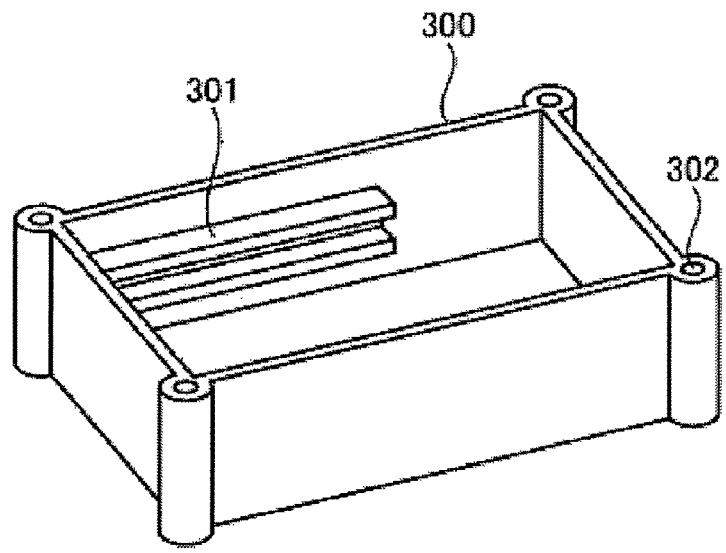
FIG. 25 is a perspective view schematically showing an example of a frame.
Figure 26:
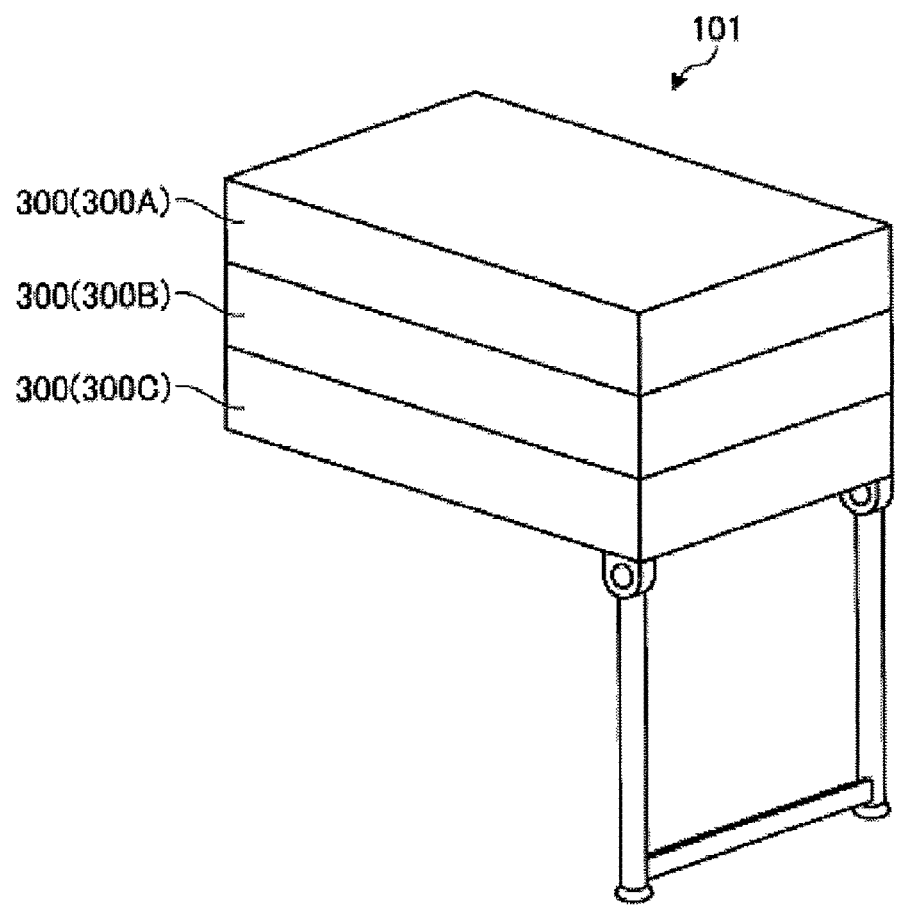
FIG. 26 is a perspective view schematically showing an example of a case formed by stacking a plurality of frames.

In the first to the third embodiment, the example in which the case 101 is an inseparable container has been described. However, the case 101 of the first to the third embodiment is not limited thereto and may be formed by stacking a plurality of frames including a frame in which a unit can be accommodated. FIG. 25 is a perspective view schematically showing an example of a frame. A frame 300 shown in FIG. 25 has a rectangular shape with an open top and an open bottom. A rail 301 to be coupled with a unit is formed on an inner side surface of the frame 300. The unit can be coupled to and held by the rail 301. A recess 302 for positioning at the time of stacking the frames 300 is formed on a top surface of each of four corners of the frame 300. A protrusion corresponding to the recess 302 is formed on a bottom surface of each of the four corners of the frame 300. The case 101 may be formed by stacking a plurality of frames 300. FIG. 26 is a perspective view schematically showing an example of a case formed by stacking a plurality of frames. The case 101 shown in FIG. 26 is formed by stacking three frames 300 (300A to 300C). A top surface of the uppermost frame 300A is sealed by a ceiling plate. A bottom surface of the lowermost frame 300A is sealed by a bottom plate. As for the uppermost frame 300A, it is possible to use a box-shaped frame with a closed top and an open bottom. As for the lowermost frame 300C, it is possible to use a box-shaped frame with an open top and a closed bottom. The frame 300 may be made of any material as long as it ensures a strength against a vacuum atmosphere that is substantially the same as that in the processing chamber 30. For example, the frame 300 may be made of resin or the like. An opening 101A may be formed at the uppermost frame 300. Or, a frame 300 having an opening 101A may be coupled. By using the case 101 in which a plurality of frames 300 is stacked, it is possible to easily change a unit in response to a maintenance operation to be performed by the maintenance apparatus 100. In the maintenance apparatus 100, the case 101 can only have frames for units used for the maintenance operation and, thus, the size of the case 101 can be reduced in accordance with the maintenance operation to be performed. For example, in the case of performing only the cleaning of the processing chamber 30, a ball screw 105 and a shaft 106 are provided in parallel and the linear stage 140 attached with the adaptor detaching unit 160 is accommodated in the frame 300A. The manually operated arm 200 and the cleaning unit 130 are accommodated in the frame 300B. The elevation table 114 is accommodated in the frame 300C. With the configuration in which the frames 300A to 300C are stacked, the maintenance apparatus 100 can perform the cleaning of the processing chamber 30 only. In addition, the maintenance apparatus 100 can be easily transferred on the basis of the case 101.

In the first to the third embodiment, the case in which the operator rotates the handle to move the unit or to detach the adaptor 96 has been described. However, the maintenance apparatus 100 may perform all the maintenance operations by using, e.g., a driving force of an actuator such as a motor or the like. Or, the maintenance apparatus 100 may perform all the maintenance operations by using a driving force of an operator.

In the first to the third embodiment, the case in which the second gate 95 of the plasma etching apparatus 10 is blocked by the adaptor 96 while maintaining airtightness has been described. However, a gate valve G may be openably/closeably provided at the second gate 95 of the plasma etching apparatus 10. In that case, the maintenance apparatus 100 does not require a unit for detaching the adaptor 96.

While the present disclosure has been shown and described with respect to the embodiments, it will be understood by those skilled in the art that various changes and modifications may be made without departing from the scope of the present disclosure as defined in the following claims.

What is claimed is:

1. A maintenance apparatus comprising:
    a case with an opening having a size corresponding to a second gate of a vacuum processing apparatus including a processing chamber having a first gate through which a substrate is loaded and unloaded and the second gate different from the first gate, the case being attachable to the second gate while maintaining airtightness, and in an attached position the case is adjacent the processing chamber; and a maintenance mechanism provided in the case and configured to perform an operation of cleaning the processing chamber and at least one of an operation of detaching a consumed part in the processing chamber through the opening, or an operation of attaching a replacement part in the processing chamber;

wherein the maintenance mechanism includes a first transfer mechanism mounted in the case and is moveable between at least a first retracted position and a second extended position, wherein in the first retracted position the first transfer mechanism is within the case and in the second extended position the first transfer mechanism is configured to extend beyond the opening of the case and into the processing chamber when the case is in the attached position with the case adjacent to the processing chamber;

wherein the maintenance mechanism further comprises a cleaning unit which extends into the processing chamber when the first transfer mechanism is in the second extended position, the maintenance mechanism further including at least one maintenance unit, including at least one of: (i) a detaching unit which extends into the processing chamber when the first transfer mechanism is in the second extended position, and which is configured to grasp the consumed part in the processing chamber and move the consumed part into the case as the first transfer mechanism moves from the second extended position and back into the case; or (ii) an attachment unit which extends into the processing chamber when the first transfer mechanism is in the second extended position and which is configured to attach the replacement part in the processing chamber, and wherein the cleaning unit is configured to clean an inside surface of the processing chamber and the cleaning unit extends out of the case and into the processing chamber to perform a cleaning in the processing chamber after removal of the consumed part and prior to attaching of the replacement part;

a supporting table positioned in the case, wherein the first transfer mechanism deposits and retrieves the at least one maintenance unit from the supporting table, and the first transfer mechanism moves the at least one maintenance unit from the support table into the processing chamber during movement to the extended position; and a control unit configured to control the first transfer mechanism to move the cleaning unit outside of the case to clean an inside surface of the processing chamber after removal of the consumed part and prior to attaching of the replacement part, and wherein the control unit is further configured to control the first transfer mechanism to return the cleaning unit to the case after cleaning the inside surface of the processing chamber.

2. The maintenance apparatus of claim 1, wherein the maintenance apparatus includes the detaching unit, and the detaching unit has an adhesive layer on a surface to be in contact with the consumed part.

3. The maintenance apparatus of claim 1, wherein the case is formed by stacking a plurality of frames including a frame in which at least one of the first transfer mechanism and at least one of the detaching unit, the cleaning unit or the attachment unit is accommodated.

4. The maintenance apparatus of claim 1, wherein the apparatus includes the attachment unit, and positioning pins are provided for positioning the attachment unit with respect to a mounting table in the processing chamber when the first transfer mechanism is in the second extended position.

5. The maintenance apparatus of claim 4, wherein the attachment unit is configured to hold and transport a focus ring, and the attachment unit includes an engaging member that engages and supports the focus ring.

6. The maintenance apparatus of claim 1, the maintenance apparatus further includes an adapter detaching unit for detaching an adapter that blocks the second gate of the vacuum processing apparatus.

7. The maintenance apparatus of claim 6, wherein the adapter detaching unit has a positioning pin for positioning the adapter detaching unit with respect to the adapter.

8. The maintenance apparatus of claim 6, wherein the adapter detaching unit has a detaching pin for detaching the adapter, and the case is provided with a handle for rotating the detaching pin.

9. The maintenance apparatus of claim 6, wherein the case is provided with an adapter support that supports the detached adapter inside the case.

10. The maintenance apparatus of claim 6, the maintenance apparatus further includes a stage movably mounted on a second transfer mechanism in the case.

11. The maintenance apparatus of claim 10, wherein the adapter detaching unit is detachably attached to the stage.

12. The maintenance apparatus of claim 11, wherein the case is provided with a handle for attaching the adapter detaching unit to the stage and detaching the adapter detaching unit from the stage.

13. The maintenance apparatus of claim 10, wherein the second transfer mechanism includes a ball screw and a shaft arranged in parallel with the ball screw, and the stage is attached to the ball screw and the shaft, and a groove corresponding to the ball screw is formed in the stage, and the stage is movable by rotation of the ball screw.

14. The maintenance apparatus of claim 1, wherein the case further includes an elevation table.

15. The maintenance apparatus of claim 1, wherein the apparatus includes each of the detaching unit and the attachment unit, and the detaching unit, the cleaning unit and the attachment unit are each selectively mountable on an end of the first transfer mechanism, and wherein the maintenance apparatus includes three of said supporting tables including first, second and third supporting tables within the case which respectively hold the detaching unit, the cleaning unit and the attachment unit; and wherein a control unit controls the first transfer mechanism to move: (a) between the second extended position and a fourth position adjacent the first supporting table to move the detaching unit between the first supporting table and the processing chamber outside of the case; (b) between the second extended position and a fifth position adjacent the second supporting table to move the cleaning unit between the second supporting table and the processing chamber outside of the case; and (c) between the second extended position and a sixth position adjacent the third supporting table to move the attachment unit between the processing chamber outside of the case and the third supporting table.

16. The maintenance apparatus of claim 15, further including a second transfer mechanism positioned inside of the case and an adapter detachment unit positioned on the second transfer mechanism, wherein the adapter detachment unit is configured to detach an adapter that blocks the second gate of the processing chamber from the processing chamber, wherein the adapter detachment unit is moveable by the second transfer mechanism between an adapter detachment unit retracted position and an adapter detachment unit attaching/detaching position, and wherein in the adapter detachment unit attaching/detaching position the adapter detachment unit is adjacent the opening of the case and adjacent the second gate of the processing chamber.

17. The maintenance apparatus of claim 1, further including a second transfer mechanism positioned inside of the case and an adapter detachment unit positioned on the second transfer mechanism, wherein the adapter detachment unit is configured to detach an adapter that blocks the second gate of the processing chamber from the processing chamber, wherein the adapter detachment unit is moveable by the second transfer mechanism between an adapter detachment unit retracted position and an adapter detachment unit attaching/detaching position, and wherein in the adapter detachment unit attaching/detaching position the adapter detachment unit is adjacent the opening of the case and adjacent the second gate of the processing chamber.

18. A maintenance apparatus comprising:
a case having an opening, wherein the case is configured to be attached to a processing chamber, wherein in an attached position of the case to the processing chamber the opening of the case faces a gate of the processing chamber, the gate having an adapter which selectively opens and closes the gate;
an adapter detachment unit positioned inside the case, configured to remove the adapter from the gate to open the gate;
an adapter detachment unit transfer mechanism positioned inside of the case, the adapter detachment unit mounted on the adapter detachment unit transfer mechanism, the adapter detachment unit transfer mechanism configured to move the adapter detachment unit to and stop at a detachment position adjacent the opening of the case, and wherein the adapter detachment unit removes the adapter from the gate at the detachment position;
wherein the adapter detachment unit transfer mechanism is further configured to transfer the adapter detachment unit from the detachment position to a retracted position within the case and spaced from the detachment position with the adapter detachment unit holding the adapter within the case in the retracted position;
at least one maintenance unit comprising at least one of (i) a detaching unit configured to detach a part from inside of the processing chamber, (ii) a cleaning unit configured to clean a portion within the processing chamber, or (iii) an attachment unit configured to attach a part within the processing chamber;
a support table positioned inside the case;
a maintenance unit transfer mechanism configured to pick up the at least one maintenance unit from the support table and to return the at least one maintenance unit to the support table, wherein the maintenance unit transfer mechanism is configured to extend through the opening of the case to move the at least one maintenance unit from the support table to outside of the case and into the processing chamber;
wherein the at least one maintenance unit includes the cleaning unit, and a control unit configured to control the maintenance unit transfer mechanism to transfer the cleaning unit from inside of the case to outside of the case to clean the portion within the processing chamber after detachment of the part from the processing chamber and prior to attachment of the part in the processing chamber, and further configured to control the maintenance unit transfer mechanism to return the cleaning unit back inside the case after cleaning of the portion within the processing chamber.

19. The maintenance apparatus according to claim 18, wherein the adapter detachment unit includes at least one pin configured to be inserted into the adapter; and
wherein the at least one maintenance unit includes the detaching unit, and (i) the detaching unit is configured to grasp a focus ring and to transfer the focus ring into the case as the maintenance unit transfer mechanism transfers the detaching unit from outside of the case back into the case and to the support table of the case, and (ii) the maintenance unit transfer mechanism deposits the focus ring and the detaching unit on the support table.

20. A maintenance apparatus comprising:
a case with an opening configured to be connected to a processing chamber;
at least one maintenance unit;
a maintenance unit transfer mechanism configured to transfer the at least one maintenance unit from inside of the case, through the opening and into the processing chamber;
wherein the at least one maintenance unit includes a cleaning unit configured to clean a surface inside of the processing chamber,
a support table inside of the case, wherein the cleaning unit is mounted on the support table and the maintenance unit transfer mechanism removes the cleaning unit from the support table to outside of the case and into the processing chamber to perform a cleaning operation, and thereafter returns the cleaning unit to the support table; and
a control unit configured to control the maintenance unit transfer mechanism to transfer the cleaning unit from inside of the case to outside of the case to clean the surface within the processing chamber after detachment of a part from the processing chamber and prior to attachment of a replacement part in the processing chamber, and further configured to control the maintenance unit transfer mechanism to return the cleaning unit back inside the case after cleaning of the surface within the processing chamber.

21. The maintenance apparatus according to claim 20, further including:
an adapter detachment unit positioned inside the case which removes an adapter, wherein the adapter closes a gate of the processing chamber;
an adapter detachment unit transfer mechanism positioned inside the case which moves the adapter detachment unit to an attachment/detachment position adjacent the opening of the case at which the adapter detachment unit detaches the adapter from the gate of the processing chamber, wherein the adapter detachment unit transfer mechanism is further configured to move the adapter detachment unit to a retracted position at which the adapter detachment unit holds the adapter inside of the case;
wherein with the adapter detachment unit holding the adapter in the retracted position inside of the case, the control unit controls the maintenance unit transfer mechanism to move the cleaning unit through the opening of the case and into the processing chamber to clean inside of the processing chamber.

* * * * *